(12) United States Patent
Yeo et al.

(10) Patent No.: US 11,323,201 B2
(45) Date of Patent: May 3, 2022

(54) APPARATUS AND METHOD FOR ENCODING AND DECODING CHANNEL IN COMMUNICATION OR BROADCASTING SYSTEM

(71) Applicant: Samsung Electronics Co., Ltd., Gyeonggi-do (KR)

(72) Inventors: Jeongho Yeo, Gyeonggi-do (KR); Hyojin Lee, Seoul (KR); Taehyoung Kim, Seoul (KR); Sungjin Park, Incheon (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/988,926

(22) Filed: Aug. 10, 2020

(65) Prior Publication Data

US 2020/0374029 A1  Nov. 26, 2020

Related U.S. Application Data

(63) Continuation of application No. 16/042,623, filed on Jul. 23, 2018, now Pat. No. 10,742,349.

(30) Foreign Application Priority Data

Jul. 21, 2017 (KR) .......................... 10-2017-0092867
Aug. 10, 2017 (KR) .......................... 10-2017-0101933

(51) Int. Cl.
*H03M 13/00* (2006.01)
*H04L 1/00* (2006.01)
(Continued)

(52) U.S. Cl.
CPC ............ *H04L 1/001* (2013.01); *H04L 1/0004* (2013.01); *H04L 1/0007* (2013.01);
(Continued)

(58) Field of Classification Search
CPC ..... H04L 1/001; H04L 1/0004; H04L 1/0058; H04L 5/0053; H04W 72/042
See application file for complete search history.

(56) References Cited

U.S. PATENT DOCUMENTS

2009/0323542 A1  12/2009  Alba
2011/0305211 A1  12/2011  Lunttila
(Continued)

FOREIGN PATENT DOCUMENTS

KR    1020170076634    7/2017

OTHER PUBLICATIONS

International Search Report dated Nov. 14, 2018 issued in counterpart application No. PCT/KR2018/008294, 3 pages.
(Continued)

*Primary Examiner* — Samir W Rizk
(74) *Attorney, Agent, or Firm* — The Farrell Law Firm, P.C.

(57) ABSTRACT

A method by a terminal in a wireless communication system is provided. Downlink control information including modulation and coding scheme (MCS) information is received from a base station. A number of information bits are identified based on the downlink control information. A transport block size (TBS) is identified based on the number of information bits and a TBS candidate set. The TBS candidate set includes values separated by an interval among a plurality of intervals. Each of the plurality of intervals is a multiple of 8. A first interval between first consecutive values included in the TBS candidate set is larger than a second interval between second consecutive values included in the TBS candidate set. The first consecutive values are greater than or equal to a predetermined value, and the second consecutive values are less than the predetermined value.

12 Claims, 10 Drawing Sheets

(51) Int. Cl.
*H04L 5/00* (2006.01)
*H04W 72/04* (2009.01)

(52) U.S. Cl.
CPC .......... *H04L 1/0058* (2013.01); *H04L 5/0053* (2013.01); *H04L 1/0003* (2013.01); *H04L 1/0009* (2013.01); *H04L 5/0051* (2013.01); *H04W 72/042* (2013.01)

(56) References Cited

U.S. PATENT DOCUMENTS

| | | | |
|---|---|---|---|
| 2015/0009927 | A1 | 1/2015 | Larsson et al. |
| 2015/0117396 | A1 | 4/2015 | Wang et al. |
| 2015/0271802 | A1 | 9/2015 | Kang et al. |
| 2015/0289237 | A1 | 10/2015 | Kim et al. |
| 2017/0064689 | A1 | 3/2017 | Nimbalker et al. |
| 2019/0268092 | A1* | 8/2019 | Byun ................ H03M 13/116 |
| 2020/0106458 | A1* | 4/2020 | Jin ................ H03M 13/1148 |

OTHER PUBLICATIONS

Samsung, "Transport Block Size Determination", R1-1710720, 3GPP TSG RAN WG1 NR Ad-Hoc#2, Jun. 27-30, 2017, 3 pages.
Ericsson, "On MCS/Transport Block Size Determination for PDSCH", R1-1709093, 3GPP TSG-RAN WG1 Meeting #89, May 15-19, 2017, 5 pages.
KT Corp. "Views on TBS Determination for Rel-13 MTC", R1-156028, 3GPP TSG RAN WG1 Meeting #82bis, Oct. 5-9, 2015, 3 pages.
European Search Report dated May 20, 2020 issued in counterpart application No. 18834588.8-1220, 8 pages.
Korean Office Action dated Oct. 15, 2021 issued in counterpart application No. 10-2017-0101933, 10 pages.

\* cited by examiner

APPARATUS AND METHOD FOR ENCODING AND DECODING CHANNEL IN COMMUNICATION OR BROADCASTING SYSTEM

CROSS-REFERENCE TO RELATED APPLICATIONS

This application is a Continuation Application of U.S. patent Ser. No. 16/042,623, filed in the U.S. Patent and Trademark Office on Jul. 23, 2018, which based on and claims priority under 35 U.S.C. § 119(a) to Korean Patent Application No. 10-2017-0092867, filed on Jul. 21, 2017, in the Korean Intellectual Property Office, and Korean Patent Application No. 10-2017-0101933, filed on Aug. 10, 2017, in the Korean Intellectual Property Office, the disclosure of each of which is incorporated by reference herein in its entirety.

BACKGROUND

1. Field

The present disclosure relates to an apparatus and a method for encoding and decoding a channel in a communication or broadcasting system.

2. Description of Related Art

To meet the demand for wireless data traffic having increased since the deployment of 4G communication systems, efforts have been made to develop an improved 5G or pre-5G communication system. Therefore, the 5G or pre-5G communication system is also called a "beyond 4G network" or a "post long term evolution (LTE) system." A 5G communication system is considered to be implemented in high frequency (mm Wave) bands, e.g., 60 GHz bands, so as to accomplish high data rates. To decrease propagation loss of radio waves and increase transmission distance, beam-forming, massive multiple-input multiple-output (MIMO), full dimensional MIMO (FD-MIMO), array antenna, analog beam forming, and large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In a 5G system, hybrid frequency shift keying (FSK) and Feher's quadrature amplitude (QAM) modulation (FQAM) and sliding window superposition coding (SWSC) as an advanced coding modulation (ACM), filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of things (IoT) where distributed entities, such as things, exchange and process information without human intervention. The Internet of everything (IoE), which is a combination of the IoT technology and Big Data processing technology through connection with a cloud server, has emerged. As technology elements, such as sensing technology, wired/wireless communication and network infrastructure, service interface technology, and security technology have been demanded for IoT implementation, a sensor network, a machine-to-machine (M2M) communication, machine type communication (MTC), and so forth have been recently researched. Such an IoT environment may provide intelligent Internet technology services that create new value for human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be an example of convergence between 5G technology and IoT technology.

In a communication/broadcasting system, link performance can be significantly degraded by various noise, fading phenomena, and inter-symbol interference (ISI) of a channel. Therefore, in order to implement high-speed digital communication/broadcasting systems requiring high data throughput and reliability such as next-generation mobile communication, digital broadcasting, and portable Internet, it is required to develop a technique for overcoming noise, fading, and intersymbol interface. As part of the research to overcome noise, etc., recent research on error correcting codes has been actively carried out as a method for improving the reliability of communication by efficiently restoring information distortion.

SUMMARY

An aspect of the present disclosure provides a method and apparatus for transmitting a coded bit, which may support various input lengths and coding rates.

Another aspect of the present disclosure is to provide a method for configuring a base graph of a low-density parity-check (LDPC) code used for data channel transmission and a method and apparatus for segmenting a transport block (TB) using the LDPC code.

Another aspect of the present disclosure is to provide a method and apparatus for segmenting uplink control information (UCI) into multiple polar code blocks and transmitting the UCI.

Another aspect of the present disclosure is to satisfy various service requirements of a next-generation mobile communication system by using an LDPC code which can be applied to a variable length and a variable rate.

Another aspect of the present disclosure is to support an efficient operation of LDPC coding which is a data channel coding method.

Another aspect of the present disclosure is to support a method of performing channel coding after segmenting uplink control information into one or more code blocks.

In accordance with an embodiment of the present disclosure, a method by a terminal in a wireless communication system is provided. Downlink control information including modulation and coding scheme (MCS) information is received from a base station. A number of information bits are identified based on the downlink control information. A transport block size (TBS) is identified based on the number of information bits and a TBS candidate set. The TBS candidate set includes values separated by an interval among a plurality of intervals. Each of the plurality of intervals is a multiple of 8. A first interval between first consecutive values included in the TBS candidate set is larger than a second interval between second consecutive values included in the TBS candidate set. The first consecutive values are greater than or equal to a predetermined value, and the second consecutive values are less than the predetermined value.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION

Figure 1:
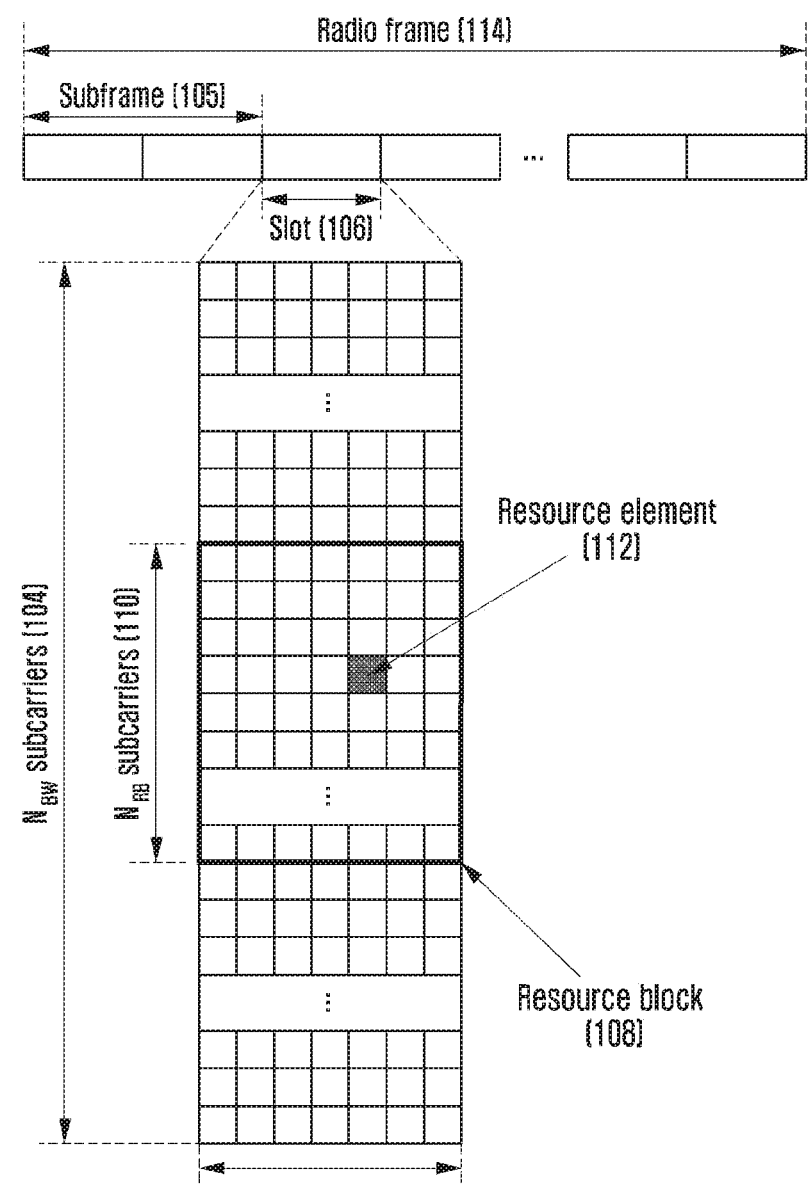
FIG. 1 is a diagram illustrating a transport structure of a downlink time-frequency domain of an LTE or an LTE advanced (LTE-A) system.

Hereinafter, embodiments are described in detail with reference to the accompanying drawings.

In describing the embodiments, a description of technical contents which are well known in the art to which the present disclosure belongs and are not directly connected with the present disclosure is omitted. This is to more clearly describe the present disclosure by omitting an unnecessary description.

For the same reason, some components are elaborated, omitted, or schematically illustrated in the accompanying drawings. Further, the size of each component may not exactly reflect its actual size. In each accompanying drawing, the same or corresponding components are denoted by the same reference numerals.

Various advantages and features of the present disclosure and methods accomplishing the same will become apparent from the following detailed description of embodiments with reference to the accompanying drawings. However, the present disclosure is not intended to be limited to the embodiments disclosed herein but may be implemented in various forms that are different from each other. Descriptions of embodiments of the present disclosure are provided so that those skilled in the art can easily understand the present disclosure. However, the present disclosure is not intended to be limited by an embodiment but is defined by the appended claims and their equivalents. Like reference numerals throughout the present disclosure refer to like elements.

In this case, it may be understood that each block of processing flowcharts and combinations of flowcharts may be performed by computer program instructions. Since computer program instructions may be mounted in processors for a general-purpose computer, a special-purpose computer, or other programmable data processing apparatuses, these instructions executed by the processors for the computer or the other programmable data processing apparatuses create means performing functions described in the block(s) of the flowcharts. Since computer program instructions may also be stored in a computer-usable or computer-readable memory that can direct a computer or other programmable data processing apparatuses in order to implement the functions in a specific scheme, the computer program instructions stored in the computer-usable or computer-readable memory may also produce manufacturing articles including instruction means performing the functions described in the block(s) of the flowcharts. Since computer program instructions may also be mounted on the computer or the other programmable data processing apparatuses, the instructions performing a series of operation steps on the computer or the other programmable data processing apparatuses to create processes executed by the computer to thereby execute the computer or the other programmable data processing apparatuses may also provide steps for performing the functions described in the block(s) of the flowcharts.

In addition, each block may indicate some of modules, segments, or codes including one or more executable instructions for executing a certain logical function(s). Further, it is to be noted that functions mentioned in the blocks occur regardless of a sequence in some alternative embodiments. For example, two blocks that are illustrated as being contiguous may be performed simultaneously or in reverse sequence depending on corresponding functions.

Here, the term "unit" used in the present disclosure indicates software or hardware components such as a field programmable logic array (FPGA) and an application specific integrated circuit (ASIC) and the unit performs any role. However, the term "unit" is not intended to be limited to software or hardware. The term "unit" may indicate an entity configured to be in a storage medium that may be addressed and may also be configured to reproduce one or more processors. Accordingly, for example, the term "unit" includes components such as software components, object oriented software components, class components, and task components and processors, functions, attributes, procedures, subroutines, segments of program code, drivers, firmware, microcode, a circuit, data, a database, data structures, tables, arrays, and variables. The functions provided in the components and the units may be combined with a smaller number of components and the units or may be further separated into additional components and units. In addition, the components and the units may also be implemented to reproduce one or more central processing units (CPUs) within a device or a security multimedia card. Further, in an embodiment, the term "unit" may include one or more processors.

A wireless communication system has been developed from a wireless communication system providing a voice centered service in an early stage toward broadband wireless communication systems providing high-speed, high-quality packet data services, such as communication standards of high speed packet access (HSPA), LTE or evolved universal terrestrial radio access (E-UTRA), and LTE-A of the 3rd generation partnership program (3GPP), high rate packet data (HRPD) and ultra mobile broadband (UMB) of 3GPP2, and Institute of Electrical and Electronics Engineers (IEEE) standard 802.16e or the like. In addition, the 5G or new radio/next radio (NR) communication standards are being produced as a 5G wireless communication system.

In a wireless communication system including 5G, at least one service of enhanced mobile broadband (eMBB), massive machine type communications (mMTC), and ultra-reliable and low latency communications (URLLC) may be provided to a terminal. The services may be provided to the same terminal during the same time period. In the following embodiments, the eMBB is a high speed transmission of high capacity data, the mMTC is terminal power minimization and connection of a plurality of terminals, and the URLLC may be a service aiming at high reliability and low latency, which is not limited thereto. The three services may be a major scenario in an LTE system or in systems such as 5G/NR since the LTE. In the embodiment, a coexistence method of eMBB and URLLC, a coexistence method of mMTC and URLLC, and an apparatus using the same are described.

When a base station schedules data corresponding to the eMBB service in a certain transmission time interval (TTI) to any terminal, if a situation occurs where the URLLC data must be transmitted in the TTI, some of the eMBB data are not transmitted in a frequency bandwidth in which the eMBB data are already scheduled and transmitted and the URLLC data are transmitted in the frequency band. The terminal that receives the scheduled eMBB and the terminal that receives the scheduled URLLC may be the same terminal or may be different terminals. In this case, since a part occurs where some of the eMBB data that are scheduled and transmitted in advance are not transmitted, the eMBB data is highly likely to be damaged. Therefore, in the above case, it is necessary to determine a method for processing a signal received from a terminal that receives scheduling for eMBB or a terminal that receives scheduling for URLLC and a signal receiving method. Therefore, according to an embodiment, when the information according to the eMBB and the URLLC is scheduled by sharing some or all of the frequency band, the information according to the mMTC and the URLLC is scheduled simultaneously, the information according to the mMTC and the eMBB is scheduled simultaneously, or the information according to the eMBB, the URLLC, and the mMTC B is scheduled simultaneously, a coexistence method between heterogeneous services that can transmit the information according to each service is described.

Hereinafter, embodiments of the present disclosure are described in detail with reference to the accompanying drawings. Where a detailed description of a known function or a configuration related to the present disclosure may obscure the present disclosure, a detailed description therefor is omitted. Further, the following terms are defined in consideration of the functions in the present disclosure and may be construed in different ways by the intention or practice of users and operators. Therefore, the definitions thereof should be construed based on the contents throughout the present disclosure. Hereinafter, a base station is a subject performing resource allocation of a terminal and may be at least one of an eNodeB, a NodeB, a base station (BS), a wireless access unit, a base station controller, and a node on a network. The UE may include a user equipment (UE), a mobile station (MS), a terminal, a cellular phone, a smart phone, a computer, or a multimedia system performing a communication function. In the present disclosure, a downlink (DL) indicates a radio transmission path of a signal from a base station to a terminal and an uplink (UL) indicates a radio transmission path through which the terminal is transmitted to the base station. Further, as an example of LTE or an LTE-A system, an embodiment is described below, but the embodiment may be applied to other communication systems having a similar technical background or a channel form. For example, 5G mobile communication technologies (5G, NR) developed after the LTE-A could be included. Further, embodiments may be applied even to other communication systems by partially being changed without departing from the scope of the present disclosure under the decision of those skilled in the art.

As an example of a broadband wireless communication system, the LTE system has adopted an orthogonal frequency division multiplexing (OFDM) scheme in a DL and a single carrier frequency division multiple access (SC-FDMA) scheme in a UL. A UL refers to a radio link through which a terminal (e.g., a UE) or an MS transmits data or a control signal to a base station (eNodeB or BS) and the DL refers to a radio link through which a base station transmits data or a control signal to a terminal. The multiple access scheme as described above normally allocates and operates time-frequency resources on which data or control information is transmitted to prevent the time-frequency resources from overlapping with each other, that is, establish orthogonality, thereby dividing the data or the control information of each user.

If a decoding failure occurs upon initial transmission, the LTE system has adopted a hybrid automatic repeat request (HARQ) scheme of retransmitting the corresponding data in a physical layer. If a receiver does not accurately decode data, the HARQ scheme enables the receiver to transmit information (e.g., a negative acknowledgement (NACK)) informing of the decoding failure to a transmitter to thereby enable the transmitter to retransmit the corresponding data in the physical layer. The receiver combines the data retransmitted by the transmitter with the data that are not decoded previously, thereby increasing reception performance of the data. Further, if the receiver accurately decodes the data, information (e.g., an acknowledgement (ACK)) notifying of a decoding success is transmitted to the transmitter so that the transmitter may transmit new data.

Hereinafter, a higher layer signal described in the present disclosure is a signal such as a system information block (SIB), a radio resource control (RRC), and a medium access control element (MACCE) that supports a certain control operation of a terminal quasi-statically and statically. A physical signal such as an L1 signal dynamically supports a certain control operation of a terminal in the form of terminal common downlink control information or terminal specific downlink control information.

FIG. 1 is a diagram illustrating a basic structure of a time-frequency domain that is a radio resource area to which data or a control channel is transmitted in a downlink of an LTE system or a system similar thereto.

Referring to FIG. 1, an abscissa represents a time domain and an ordinate represents a frequency domain. A minimum transmission unit in the time domain is an OFDM symbol, in which one slot 106 is configured by collecting $N_{symb}$ OFDM symbols and one subframe 105 is configured by collecting two slots. The slot length is 0.5 ms and the subframe length is 1.0 ms. Further, a radio frame 114 is a time domain interval consisting of 10 subframes. A minimum transmission unit in a frequency domain is a subcarrier, in which the entire system transmission bandwidth consists of a total of $N_{BW}$ sub-carriers 104. However, such values may vary.

A basic unit of resources in the time-frequency domain is a resource element (RE) 112 and may be represented by an OFDM symbol index and a sub-carrier index. A resource block (RB) 108 (or physical resource block (PRB)) is defined by the $N_{symb}$ continued OFDM symbols in the time domain and $N_{RB}$ continued sub-carriers 110 in the frequency domain. Thus, one RB 108 in one slot may include $N_{symb} \times N_{RB}$ REs 112. In general, the minimum frequency-domain allocation unit of data is the RB 108, and in the LTE system, generally $N_{symb}=7$ and $N_{RB}=12$, and the $N_{BW}$ and $N_{RB}$ can be proportional to the bandwidth of the system transmission band. A data rate is increased in proportion to the number of RBs 108 scheduled for the terminal. An LTE system may be operated by defining six transmission bandwidths. In a frequency division duplex (FDD) system operated by dividing the downlink and the uplink based on a frequency, a downlink transmission bandwidth and an uplink transmission bandwidth may be different from each other. A channel bandwidth represents a radio frequency (RF) bandwidth corresponding to the system transmission bandwidth. Table 1 below shows a correspondence relationship between system transmission bandwidth and channel bandwidth that are defined in the LTE system. For example, the LTE system that has a channel bandwidth of 10 MHz is configured of a transmission bandwidth including 50 RBs.

TABLE 1

| Channel bandwidth $BW_{channel}$ [MHz]. | | | | | |
|---|---|---|---|---|---|
| 1.4 | 3 | 5 | 10 | 15 | 20 |
| Transmission 6 | 15 | 25 | 50 | 75 | 100 |

The downlink control information may be transmitted within first N OFDM symbols within a subframe. In an embodiment, generally, N={1, 2, 3}. Therefore, the N value may variably apply to each subframe depending on the amount of control information to be transmitted to the current subframe.

The transmitted downlink control information may include a control channel transmission interval indicator representing over how many OFDM symbols the control information is transmitted, scheduling information on downlink data or uplink data, information on HARQ ACK/NACK, or the like.

In the LTE system, the scheduling information on the downlink data or the uplink data is transmitted from a base station to a terminal through downlink control information (DCI). The DCI is defined depending on various formats. Depending on each format, it may be represented whether the DCI is scheduling information (UL grant) on the uplink data or scheduling information (DL grant) on the downlink data, whether the DCI is a compact DCI having small-sized control information, whether to apply spatial multiplexing using a multiple antenna, whether the DCI is a DCI for controlling power, or the like. For example, DCI format 1 that is the scheduling control information (DL grant) on the downlink data may include at least one of the following control information:

Resource allocation type 0/1 flag: Notify whether the resource allocation type is type 0 or type 1. The type 0 applies a bitmap scheme to assign a resource in a resource block group (RBG) unit. In the LTE system, a basic unit of scheduling is the RB represented by a time-frequency domain resource and the RBG consists of a plurality of RBs and thus becomes a basic unit of the scheduling in the type 0 scheme. The type 1 assigns a certain RB within the RBG.

Resource block assignment: The RB allocated to the resource block assignment data transmission is notified. The represented resource is determined depending on the system bandwidth and the resource assignment scheme.

MCS: The modulation scheme used for the data transmission and a size of a transport block that is the data to be transmitted are indicated.

HARQ process number: A HARQ process number is indicated.

New data indicator: An HARQ initial transmission or retransmission is indicated.

Redundancy version: A HARQ redundancy version is indicated.

Transmit power control (TPC) command for physical uplink control channel (PUCCH): A transmit power control command for the PUCCH that is an uplink control channel is indicated.

The DCI is subjected to a channel coding and modulation process and then may be transmitted on a physical downlink control channel (PDCCH) (or control information, which is interchangeably used below) or an enhanced PDCCH (EPDCCH) (or enhanced control information, which is interchangeably used below).

Generally, each DCI is independently scrambled with a certain radio network temporary identifier (RNTI) (or a terminal identifier) for each terminal to be added with a cyclic redundant check (CRC), subjected to channel coding, and then configured independently and transmitted through a PDCCH. In the time domain, the PDCCH is transmitted while being mapped during the control channel transmission section. A mapping location in the frequency domain of the PDCCH may be determined by identifiers (IDs) of each terminal and transmitted over the entire system transmission bandwidth.

The downlink data may be transmitted on a physical downlink shared channel (PDSCH) that is a physical channel for downlink data transmission. The PDSCH may be transmitted after the control channel transmission section, and the scheduling information on the certain mapping location in the frequency domain, the modulation scheme, or the like may be determined based on the DCI transmitted through the PDCCH.

By the MCS among the control information configuring the DCI, the base station notifies of the modulation scheme applied to the PDSCH to be transmitted to the terminal and a data size (transport block size (TBS)) to be transmitted. In an embodiment, the MCS may consist of 5 bits, more than 5 bits, or less than 5 bits. The TBS corresponds to a size before channel coding for error correction is applied to data (e.g., a TB) to be transmitted by a base station.

The modulation scheme supported in the LTE system is quadrature phase shift keying (QPSK), 16 QAM, and 64QAM, in which each modulation order $Q_m$ corresponds to 2, 4, and 6. That is, in the case of the QPSK modulation, 2 bits per symbol may be transmitted; in the case of the 16QAM modulation, 4 bits per symbol may be transmitted; and in the case of the 64QAM modulation, 6 bits per symbol may be transmitted. Further, the modulation scheme above 256 QAM may be used depending on the system modification.

Figure 2:
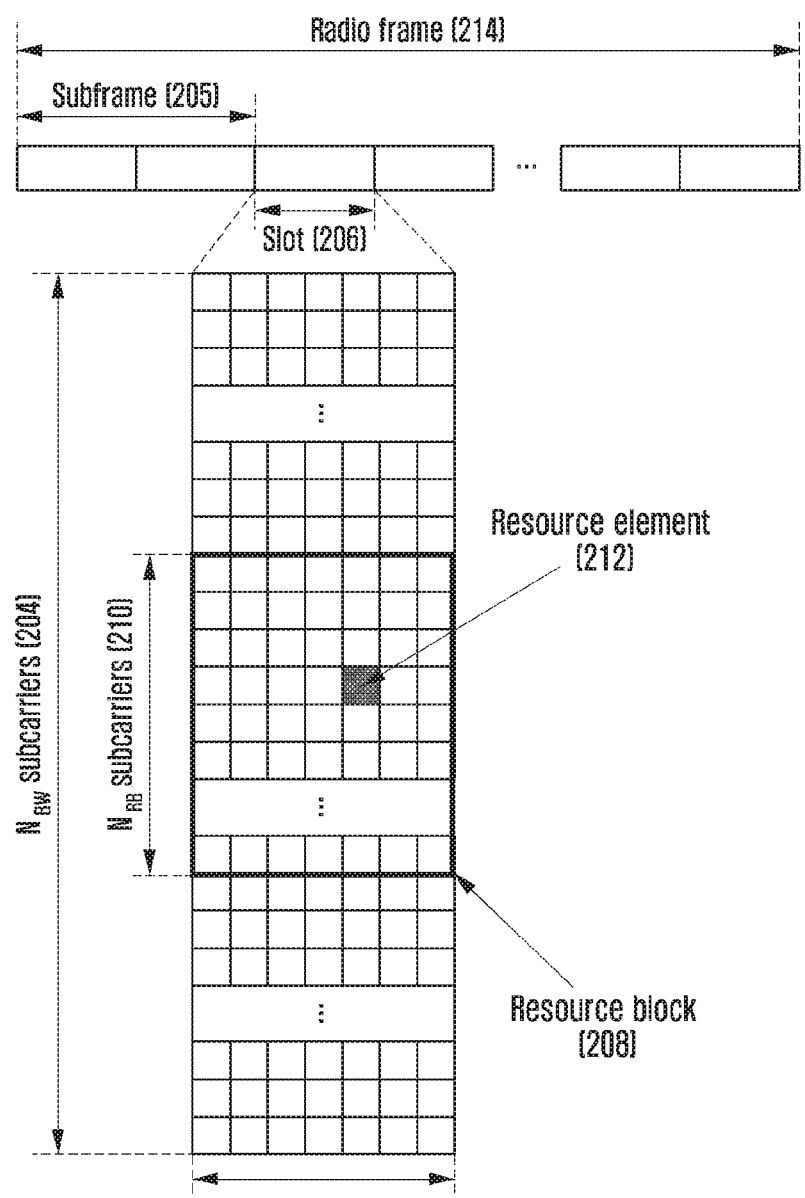
FIG. 2 is a diagram illustrating a transport structure of an uplink time-frequency domain of an LTE and LTE-A system.

FIG. 2 is a diagram illustrating a basic structure of a time-frequency domain that is a radio resource region in which data or a control channel is transmitted in the uplink in an LTE system.

Referring to FIG. 2, an abscissa represents a time domain and an ordinate represents a frequency domain. The minimum transmission unit in the time domain is an SC-FDMA symbol, and the $N_{symb}^{UL}$ SC-FDMA symbols are gathered to form one slot 206. Two slots are gathered to form one subframe 205. The minimum transmission unit in the frequency domain is a subcarrier, in which the entire system transmission bandwidth 204 includes a total of $N_{BW}$ subcarriers. The $N_{BW}$ may have a value proportional to the system transmission bandwidth.

A basic unit of resources in the time-frequency domain is an RE 212 and may be defined by an SC-FDMA symbol index and a subcarrier index. An RB pair may be defined by $N_{symb}^{UL}$ continued SC-FDMA symbols in the time domain and $N_{sc}^{RB}$ continued subcarriers in the frequency domain. Accordingly, one RB 208 consists of $N_{symb}^{UL} \times N_{sc}^{RB}$ REs. In general, the minimum transmission unit of the data or the control information is the RB unit. The PUCCH is mapped to a frequency domain corresponding to 1 RB and transmitted for one subframe.

In the LTE system, a timing relationship between a PUCCH or a PUSCH is defined, with the PUCCH or the PUSCH being an uplink physical channel to which an HARQ ACK/NACK corresponding to a PDSCH as a physical channel for downlink data transmission or a PDCCH/EPDDCH including a semi-persistent scheduling (SPS) release is transmitted. For example, in an LTE system operated by FDD, the HARQ ACK/NACK corresponding to the PDSCH transmitted in an n–4-th subframe or the PDCCH/EPDCCH including the SPS release may be transmitted to the PUCCH or the PUSCH in an n-th subframe.

In the LTE system, the downlink HARQ has adopted an asynchronous HARQ scheme in which data retransmission time is not fixed. That is, if for initial transmission data transmitted by the base station, the HARQ NACK is fed back from the terminal, the base station freely determines transmission time of retransmission data based on the scheduling operation. The terminal performs buffering on data determined as an error as a result of decoding the received data for an HARQ operation and then performs combining with the next retransmission data.

If the terminal receives the PDSCH including the downlink data transmitted from the base station in subframe n, the terminal transmits the uplink control information including the HARQ ACK or the NACK of the downlink data to the base station through the PUCCH or PUSCH in subframe n+k. Then, k is defined differently depending on the FDD or time division duplex (TDD) of the LTE system and the configuration thereof. For example, in the case of the FDD LTE system, k is fixed as 4. Meanwhile, in the case of the TDD LTE system, k may be changed depending on the subframe configuration and the subframe number. In addition, the value of k may be applied differently depending on the TDD configuration of each carrier at the time of data transmission through a plurality of carriers.

In the LTE system, unlike the downlink HARQ, the uplink HARQ has adopted a synchronous HARQ scheme in which the data transmission time is fixed. That is, an uplink/downlink timing relationship of the PUSCH that is the physical channel for uplink data transmission, the PDCCH that is the downlink control channel preceding the PUSCH, and a physical hybrid indicator channel (PHICH) that is a physical channel to which the downlink HARQ ACK/NACK corresponding to the PUSCH is transmitted may be transmitted/received depending on the following rules.

If in the subframe n, the terminal receives the PDCCH including the uplink scheduling control information transmitted from the base station or the PHICH to which the downlink HARQ ACK/NACK are transmitted, the terminal transmits the uplink data corresponding to the control information on the PUSCH in subframe n+k. Then, k is defined differently depending on the FDD or TDD of the LTE system and the configuration thereof. For example, in the case of the FDD LTE system, k is fixed as 4. In addition, in the case of the TDD LTE system, k may be changed depending on the subframe configuration and the subframe number. In addition, the value of k may be applied differently depending on the TDD configuration of each carrier at the time of data transmission through a plurality of carriers.

Further, if the terminal receives the PHICH including information associated with the downlink HARQ ACK/NACK from the base station in subframe i, the PHICH corresponds to the PUSCH that the terminal transmits in subframe i–k. Then, k is defined differently depending on the FDD or the TDD of the LTE system and the setting thereof. For example, in the case of the FDD LTE system, k is fixed as 4. In addition, in the case of the TDD LTE system, k may be changed depending on the subframe configuration and the subframe number. In addition, the value of k may be applied differently depending on the TDD configuration of each carrier at the time of data transmission through a plurality of carriers.

TABLE 2

| Transmission mode | DCI format | Search Space | Transmission scheme of PDSCH corresponding to PDCCH |
|---|---|---|---|
| Mode 1 | DCI format 1A | Common and UE specific by C-RNTI | Single-antenna port, port 0 (see subclause 7.1.1) |
|  | DCI format 1 | UE specific by C-RNTI | Single-antenna port, port 0 (see subclause 7.1.1) |
| Mode 2 | DCI format 1A | Common and UE specific by C-RNTI | Transmit diversity (see subclause 7.1.2) |
|  | DCI format 1 | UE specific by C-RNTI | Transmit diversity (see subclause 7.1.2) |
| Mode 3 | DCI format 1A | Common and UE specific by C-RNTI | Transmit diversity (see subclause 7.1.2) |
|  | DCI format 2A | UE specific by C-RNTI | Large delay CDD (see subclause 7.1.3) or Transmit diversity (see subclause 7.1.2) |
| Mode 4 | DCI format 1A | Common and UE specific by C-RNTI | Transmit diversity (see subclause 7.1.2) |
|  | DCI format 2 | UE specific by C-RNTI | Closed-loop spatial multiplexing (see subclause 7.1.4) or Transmit diversity (see subclause 7.1.2) |
| Mode 5 | DCI format 1A | Common and UE specific by C-RNTI | Transmit diversity (see subclause 7.1.2) |
|  | DCI format 1D | UE specific by C-RNTI | Multi-user MIMO (see subclause 7.1.5) |
| Mode 6 | DCI format 1A | Common and UE specific by C-RNTI | Transmit diversity (see subclause 7.1.2) |
|  | DCI format 1B | UE specific by C-RNTI | Closed-loop spatial multiplexing (see subclause 7.1.4) using a single transmission layer |

TABLE 2-continued

| Transmission mode | DCI format | Search Space | Transmission scheme of PDSCH corresponding to PDCCH |
|---|---|---|---|
| Mode 7 | DCI format 1A | Common and UE specific by C-RNTI | If the number of PBCH antenna ports is one, Single-antenna port, port 0 is used (see subclause 7.1.1), otherwise Transmit diversity (see subclause 7.1.2) |
| | DCI format 1 | UE specific by C-RNTI | Single-antenna port, port 5 (see subclause 7.1.1) |
| Mode 8 | DCI format 1A | Common and UE specific by C-RNTI | If the number of PBCH antenna ports is one, Single-antenna port, port 0 is used (see subclause 7.1.1), otherwise Transmit diversity (see subclause 7.1.2) |
| | DCI format 2B | UE specific by C-RNTI | Dual layer transmission, port 7 and 8 (see subclause 7.1.5A) or single-antenna port, port 7 or 8 (see subclause 7.1.1) |

Table 2 above shows a supportable DCI format type according to each transmission mode under a condition configured by the C-RNTI. The terminal assumes that the corresponding DCI format exists and performs searching and decoding in a control area section according to a predetermined transmission mode. In other words, when the terminal is instructed to transmit mode 8, the terminal searches DCI format 1A in a common search space and a UE-specific search space and searches DCI format 2B only in the UE-specific search space.

The description of the wireless communication system is based on the LTE system, but the present disclosure is not intended to be limited to the LTE system but may be applied to various wireless communication systems such as NR and 5G. In addition, in a case where the present disclosure is applied to another wireless communication system, the k value may be changed and applied to a system using a modulation scheme corresponding to FDD.

In a communication/broadcasting system, link performance may deteriorate significantly due to various types of noise, a fading phenomenon, and ISI of a channel. Therefore, to implement high-speed digital communication/broadcasting systems requiring high data throughput and reliability like next-generation mobile communications, digital broadcasting, and portable Internet, there is a need to develop technologies to overcome noise, fading, and inter-symbol interference. As part of studies to overcome noise, etc., a study on an error correcting code which is a method for increasing reliability of communications by efficiently recovering distorted information has been actively conducted recently.

An object of the preset disclosure provides a method and an apparatus for encoding/decoding that is capable of supporting various input lengths and coding rates. Further, the present disclosure provides a method for configuring a base graph of an LDPC code used for data channel transmission and a method and apparatus for segmenting a TB using the LDPC code.

Next, the LDPC code is described.

The LDPC code is a kind of linear block code which includes a process of determining a codeword that satisfies conditions of the following Equation (1).

$$H \cdot c^T = [h_1 \ h_2 \ h_3 \ \ldots \ h_{N_{ldpc}-1}] \cdot c^T = \sum_{i=0}^{N_{ldpc}} c_i \cdot h_i = 0 \quad \text{Equation (1)}$$

In Equation (1) above, $$c = [c_0, c_1, c_2, \ldots c_{N_{ldpc}-1}]$$

In Equation (1) above, H represents the parity-check matrix, c represents the codeword, $c_i$ represents an i-th codeword bit, $N_{ldpc}$ represents a codeword length, and $h_i$ represents an i-th column of the parity-check matrix H.

The parity-check matrix H consists of the $N_{ldpc}$ columns that are equal to the number of LDPC codeword bits. Equation (1) above represents that since a sum of a product of the i-th column $h_i$ and the i-th codeword bit $c_i$ of the parity-check matrix becomes "0", the i-th column $h_i$ has a relationship with the i-th codeword bit $c_i$.

To easily implement the parity-check matrix used in a communication and broadcasting system, generally, a quasi-cyclic LDPC (QC-LDPC) code ( ) using the parity-check matrix of a quasi-cyclic form is mainly used.

The QC-LDPC code has the parity-check matrix consisting of a zero matrix (0-matrix) having a small square matrix form or circulant permutation matrices.

A permutation matrix $P=(P_{ij})$ of size Z×Z is defined as shown in Equation (2) below.

$$P_{i,j} = \begin{cases} 1, & \text{if } i+1 \equiv j \mod Z \\ 0, & \text{otherwise} \end{cases} \quad \text{Equation (2)}$$

In Equation (2) above, $P_{ij}$ (0≤i, j<Z) indicates entries of an i-th row and a j-th column in the matrix P. The permutation matrix P as described above is the circulant permutation matrix in the form in which each entry of an identify matrix having the size of Z×Z is circularly shifted in a right direction i times in (0≤i<Z).

The parity-check matrix H of the simplest QC-LDPC code may be expressed by the following Equation (3).

$$H = \begin{bmatrix} P^{a_{11}} & P^{a_{12}} & \ldots & P^{a_{1n}} \\ P^{a_{21}} & P^{a_{22}} & \ldots & P^{a_{2n}} \\ \vdots & \vdots & \ddots & \vdots \\ P^{a_{m1}} & P^{a_{m2}} & \ldots & P^{a_{mn}} \end{bmatrix} \quad \text{Equation (3)}$$

If $P^{-1}$ is defined as the 0-matrix having the size of Z×Z, each exponent $a_{jj}$ of the circulant permutation matrices or the 0-matrix in Equation (3) above has one of {−1, 0, 1, 2, ..., Z−1} values. Further, the parity-check matrix H of the Equation (3) above has n column blocks and m row blocks and therefore has a size of Z×Z.

Generally, a binary matrix having a size of m×n obtained by replacing each of the circulant permutation matrices and the 0-matrix in the parity-check matrix of Equation (3) above with 1 and 0, respectively, is called a mother matrix M(H) of the parity-check matrix H and an integer matrix having a size of m×n obtained by the following Equation (4) by selecting only exponents of each of the a size of m×n or the 0-matrix is referred to as an exponential matrix E(H) of the parity-check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{Equation (4)}$$

In addition, the performance of the LDPC codes may be determined depending on the parity-check matrix. Therefore, there is a need to design the parity-check matrices of the LDPC codes having excellent performance. Further, a method for LDPC encoding and decoding capable of supporting various input lengths and code rates is required.

For an efficient design of QC-LDPC codes, a method known as lifting is used. Lifting is a method for efficiently designing a very large parity check matrix by setting a Z value for deciding a size of a cyclic permutation matrix or a 0-matrix from a small mother matrix according to a certain rule. Features of the existing lifting method and the QC-LDPC code designed through the lifting are described below.

First, S QC-LDPC codes designed through the lifting method for an LDPC code $C_0$ are referred to as $C_1$, $C_2, \ldots, C_k, \ldots, C_S$ (similarly $C_k$ for $1 \leq k \leq S$), the parity check matrix of the QC-LDPC code $C_k$ is referred to as $H_k$, and a value corresponding to the size of a row block and a column block of a cyclic matrix constituting the parity check matrix is referred to as $Z_k$. In this case, $C_0$ corresponds to the smallest LDPC code having a mother matrix of $C_1, \ldots, C_S$ codes as the parity check matrix, a $Z_0$ value corresponding to the sizes of the row block and the column block is 1, and $Z_k < Z_{k+1}$ for $0 \leq k \leq S-1$. Further, the parity check matrix $H_k$ of each code $C_k$ has an m×n exponent matrix $E(H_k) = a_{i,j}^{(k)}$, and each index $a_{i,j}^{(k)}$ is selected as one of $\{-1, 0, 1, 2, \ldots, Zk-1\}$ values. The lifting consists of the same steps as $C0 \rightarrow C1 \rightarrow \ldots \rightarrow CS$ and has the same characteristics as $Z_{k+1} = q_{k+1} Z_k$ ($q_{k+1}$ is a positive integer, $k=0, 1, \ldots, S-1$). Further, if only a parity check matrix $H_S$ of $C_S$ is stored according to the characteristics of the lifting process, all of the QC-LDPC codes can be represented $C_0, C_1, \ldots, C_S$ by using Equation (5) or Equation (6) below according to the lifting scheme.

$$E(H_k) \equiv \left\lfloor \frac{L_k}{L_s} E(H_s) \right\rfloor \quad \text{Equation (5)}$$

$$E(H_k) = E(H_S) \bmod Z_k \quad \text{Equation (6)}$$

The scheme may be most generalized and expressed as shown in Equation (7) below.

$$P_{i,j} = f(V_{i,j}, Z) \quad \text{Equation (7)}$$

In Equation (7) above, f(x, y) denotes an arbitrary function having x and y as input values. $V_{i,j}$ indicates an element corresponding to an i-th row and a j-th column of the exponent matrix of the parity check matrix corresponding to the LDPC code having a largest size (for example, corresponding to $C_S$ in the above description). $P_{ij}$ denotes an element corresponding to the i-th row and j-th column of the exponent matrix of the parity check matrix for an arbitrary-sized LDPC code (e.g., corresponding to $C_k$ in the above description) and Z denotes the sizes of the row block and the column of the cyclic matrix constituting the parity check matrix of the corresponding LDPC code. Therefore, when $V_{i,j}$ is defined, the parity check matrix for the LDPC code having an arbitrary size may be defined.

In the description below of present disclosure, the notation described above is defined as follows:

$E(H_S)$: Maximum exponent matrix $V_{i,j}$: Maximum exponent matrix element (corresponding to (i, j)-th element of $E(H_S)$)

The parity check matrix for the arbitrary LDPC code may be expressed by using the maximum exponent matrix or maximum exponent matrix element defined above.

In the next-generation mobile communication system, there may be multiple maximum exponential matrices defined in order to ensure optimal performance for code blocks having various lengths. For example, there may be M different maximum exponent matrices corresponding thereto, which may be expressed as follows:

$$E(H_s)_1, E(H_s)_2, \ldots, E(H_s)_M \quad \text{Equation (8):}$$

There may be multiple maximum exponent matrix elements corresponding thereto, which may be expressed as follows:

$$(V_{i,j})_1, (V_{i,j})_2, \ldots, (V_{i,j})_M \quad \text{Equation (9):}$$

In Equation (9) above, a maximum exponent matrix element $(V_{i,j})_m$ corresponds to (i, j) of a maximum exponent matrix $E(H_S)_m$. In the following description, the parity check matrix for the LDPC code is described by using the maximum exponent matrix defined above. This may be applied similarly as expressed by using the maximum exponent matrix element.

Turbo code based code block segmentation and CRC attachment methods are described below.

---

5.1.2 Code block segmentation and code block CRC attachment

The input bit sequence to the code block segmentation is denoted by $b_0, b_1, b_2, b_3, \ldots, b_{B-1}$, where B > 0. If B is larger than the maximum code block size Z, segmentation of the input bit sequence is performed and an additional CRC sequence of L = 24 bits is attached to each code block. The maximum code block size is:
- Z = 6144.

If the number of filler bits F calculated below is not 0, filler bits are added to the beginning of the first block.
  Note that if B < 40, filler bits are added to the beginning of the code block.
The filler bits shall be set to <NULL> at the input to the encoder.
Total number of code blocks C is determined by:
if B ≤ Z
  L = 0
  Number of code blocks: C = 1
  B' = B
else
  L = 24
  Number of code blocks: C = $\lceil B/(Z - L) \rceil$.
  B' = B + C · L
end if
The bits output from code block segmentation, for C ≠ 0, are denoted by $c_{r0}, c_{r1}, c_{r2}, c_{r3}, \ldots, c_{r(K_r-1)}$, where r is the code block number, and $K_r$ is the number of bits for the code block number r.
  Number of bits in each code block (applicable for C ≠ 0 only):
  First segmentation size: $K_+$ = minimum K in table 5.1.3-3 such that
  C · K ≥ B'
    if C = 1
      the number of code blocks with length $K_+$ is $C_+ = 1$,
      $K_- = 0$,
      $C_- = 0$
    else if C > 1
      Second segmentation size: $K_-$ = maximum K in table 5.1.3-3
    such that $K < K_+$
      $\Delta_K = K_+ - K_-$ Number of segments of size $K_-$: $C_- = \left\lfloor \dfrac{C \cdot K_+ - B'}{\Delta_K} \right\rfloor$.

-continued

---
5.1.2 Code block segmentation and code block CRC attachment
---

```
Number of segments of size K₊: C₊ = C – C₋.
  end if
Number of filler bits: F = C₊ · K₊ + C₋ · K₋ – B'
for k = 0 to F-1                      -- Insertion of filler bits
    c₀ₖ =< NULL >
end for
k = F
s = 0
for r = 0 to C-1
    if r < C₋
        Kᵣ = K₋
    else
        Kᵣ = K₊
    end if
    while k < Kᵣ – L
        cᵣₖ = bₛ
        k = k + 1
        s = s + 1
    end while
    if C >1
        The sequence c_{r,0},c_{r,1},c_{r,2},c_{r,3},...,c_{r(Kᵣ-L-1)} is used to calculate the
        CRC parity bits p_{r,0},p_{r,1},p_{r,2},..., p_{r(L-1)} according to section 5.1.1
        with the generator polynomial g_{CRC24B}(D). For CRC calculation
        it is assumed that filler bits, if present, have the value 0.
        while k < Kᵣ
            cᵣₖ = p_{r(k+L-Kᵣ)}
            k = k + 1
        end while
    end if
    k = 0
end for
```

5G and next-generation communication systems use the LDPC code in data channels unlike LTE. In addition, even in a situation of applying the LDPC code, one transport block may be segmented into multiple code blocks and some code blocks of the segmented code blocks may form one code block group. Further, the number of code blocks of respective code block groups may be all the same as or different from each other. Bitwise interleaving may be applied to individual code blocks, code block groups or transport blocks.

Figure 3:
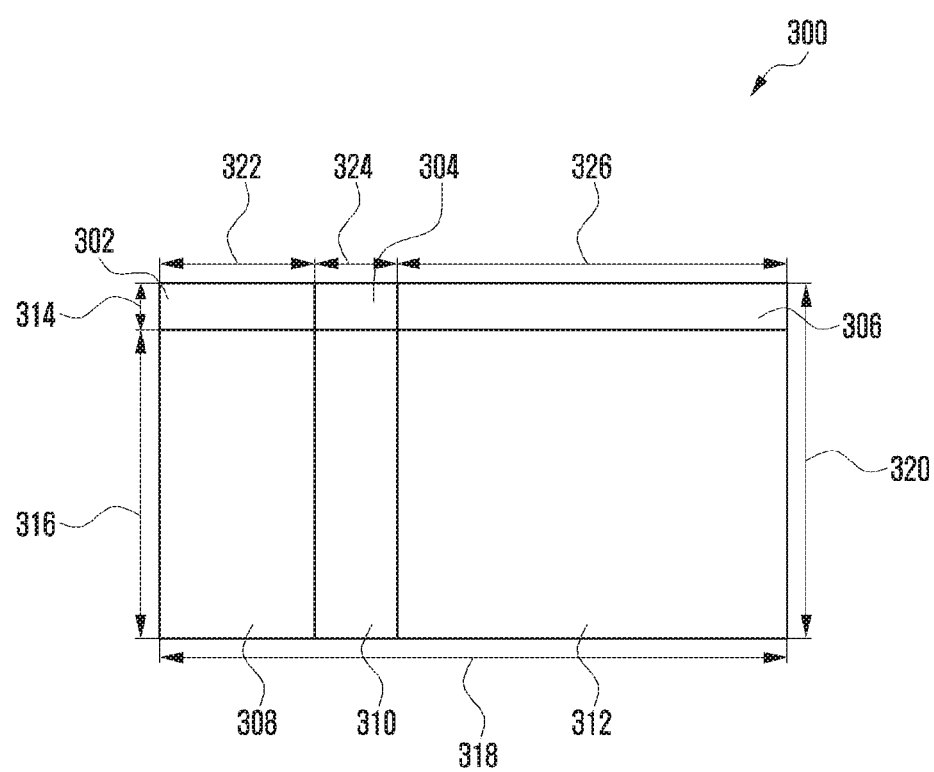
FIG. 3 is a diagram illustrating a base structure of a mother matrix (or base graph) of an LDPC code according to an embodiment.

FIG. 3 is a diagram illustrating a base structure of a mother matrix (or base graph) of an LDPC code according to an embodiment.

Referring to FIG. 3, two base-graph 300 base structures of the LDPC code supporting data channel coding in the next-generation mobile communication system are basically supported. The base-graph structure of the first LDPC code has a matrix structure with a maximum vertical length of 46 320 and a maximum horizontal length of 68 318 and the base-graph structure of the second LDPC code has a matrix structure with a maximum vertical length of 42 320 and a maximum horizontal length of 52 318. The base-graph structure of the first LPDC code may support a coding rate of at least 1/3 to a maximum of 8/9 and the base-graph structure of the second LDPC code may support a coding rate of at least 1/5 to a maximum of 8/9.

The LDPC code consists of six sub-matrix structures 302, 304, 306, 308, 310, and 312.

A first sub-matrix structure 302 includes system bits. A second sub-matrix structure 304 is a square matrix and includes parity bits. A third sub-matrix structure 306 is a zero matrix. A fourth sub-matrix structure 308 and a fifth sub-matrix structure 310 include the parity bits. A sixth sub-matrix structure 312 is a unitary matrix.

In the base-graph structure of the first LDPC code, the horizontal length 322 of the first sub-matrix 302 has a value of 22 and the vertical length 314 has a value of 4 or 5. Both the horizontal length 324 and the vertical length 314 of the second sub-matrix 304 have the value of 4 or 5. The horizontal length 326 of the third sub-matrix 306 has a value of 42 or 41 and the vertical length 314 has the value of 4 or 5. The vertical length 316 of the fourth sub-matrix 308 has the value of 42 or 41 and the horizontal length 322 has the value of 22. The horizontal length 324 of the fifth sub-matrix 310 has the value of 4 or 5 and the vertical length 316 has the value of 42 or 41. Both the horizontal length 326 and the vertical length 316 of the sixth sub-matrix 312 have the value of 42 or 31.

In the base-graph structure of the second LDPC code, the horizontal length 322 of the first sub-matrix 302 has a value of 10 and the vertical length 314 has a value of 7. Both the horizontal length 324 and the vertical length 314 of the second sub-matrix 304 have the value of 7. The horizontal length 326 of the third sub-matrix 306 has a value of 35 and the vertical length 314 has the value of 7. The vertical length 316 of the fourth sub-matrix 308 has the value of 35 and the vertical length 322 has the value of 10. The horizontal length 324 of the fifth sub-matrix 310 has the value of 7 and the vertical length 316 has the value of 35. Both the horizontal length 326 and the vertical length 316 of the sixth sub-matrix 312 have the value of 35.

One code block size that may be supported in the base-graph structure of the first LDPC code is 22×Z (where Z=a×2ⱼ, Z is configured by Table 3 below, one code block size that may be maximally supported is 8448, and one code block size which may be minimally supported is 44. For reference, in Table 3 below, as a candidate of the Z value, some or all of 272, 304, 336, and 368 may be additionally reflected.

TABLE 3

| | a | | | | | | |
|---|---|---|---|---|---|---|---|
| Z | 2 | 3 | 5 | 7 | 9 | 11 | 13 | 15 |
| j 0 | 2 | 3 | 5 | 7 | 9 | 11 | 13 | 15 |
| 1 | 4 | 6 | 10 | 14 | 18 | 22 | 26 | 30 |
| 2 | 8 | 12 | 20 | 28 | 36 | 44 | 52 | 60 |
| 3 | 16 | 24 | 40 | 56 | 72 | 88 | 104 | 120 |
| 4 | 32 | 48 | 80 | 112 | 144 | 176 | 208 | 240 |
| 5 | 64 | 96 | 160 | 224 | 288 | 352 | | |
| 6 | 128 | 192 | 320 | | | | | |
| 7 | 256 | 384 | | | | | | |

One code block size that may be supported in the base-graph structure of the first LDPC code is as follows:

44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)

In this case, 5984, 6688, 7392, and 8096 may be additionally included.

Further, a total of M maximum exponential matrices $E(H_s)_i^1$ are additionally defined based on the base-graph (BG #1) of the first LDPC code. For example, M may have a value of 8 or a predetermined natural number value and i may have a value from 1 to M. The terminal performs downlink data decoding or uplink data encoding using the matrices $E(H_s)_i^1$. The matrices $E(H_s)_i^1$ have certain element values shifted from the base-graph (BG #1) of the first LDPC code. That is, the matrices $E(H_s)_i^1$ may have different shift values.

One code block size that may be supported in the base-graph structure of the second LDPC code is 10×Z (where $Z=a\times 2_j$, Z is configured by Table 4 below, one code block size that may be maximally supported is 2560 (or 3840), and one code block size which may be minimally supported is 20. For reference, in Table 3 above, as a candidate of the Z value, some or all of 288, 272, 304, 320, 336, 352, 368, and 384 may be additionally reflected.

TABLE 4

|   | a | | | | | | | |
|---|---|---|---|---|---|---|---|---|
| Z |   | 2 | 3 | 5 | 7 | 9 | 11 | 13 | 15 |
| j | 0 | 2 | 3 | 5 | 7 | 9 | 11 | 13 | 15 |
|   | 1 | 4 | 6 | 10 | 14 | 18 | 22 | 26 | 30 |
|   | 2 | 8 | 12 | 20 | 28 | 36 | 44 | 52 | 60 |
|   | 3 | 16 | 24 | 40 | 56 | 72 | 88 | 104 | 120 |
|   | 4 | 32 | 48 | 80 | 112 | 144 | 176 | 208 | 240 |
|   | 5 | 64 | 96 | 160 | 224 |   |   |   |   |
|   | 6 | 128 | 192 |   |   |   |   |   |   |
|   | 7 | 256 |   |   |   |   |   |   |   |

One code block size that may be supported in the base-graph structure of the second LDPC code is as follows:

20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560 (2880, 3200, 3520, 3840, 2720, 3040, 3360, 3680)

In this case, 2880, 3200, 3520, 3840, 2720, 3040, 3360, and 3680 may be additionally included.

Further, a total of M maximum exponential matrices $E(H_s)^2$ are additionally defined based on the base-graph (BG #2) of the second LDPC code. Typically, M may have a value of 8 or a predetermined natural number value and i may have a value from 1 to M. The terminal performs downlink data decoding or uplink data encoding using the matrices $E(H_s)_i^2$. The matrices $E(H_s)_i^2$ have certain element values shifted from the base-graph (BG #2) of the second LDPC code. That is, the matrices $E(H_s)_i^2$ may have different shift values.

As described above, two types of base-graphs are provided in the next-generation mobile communication system. Accordingly, certain terminals may support only the first base-graph, only the second base-graph, or both base-graphs. This is summarized in Table 5 below.

TABLE 5

| Terminal type | Supportable operations |
|---|---|
| Type 1 | Supporting only first base-graph or supporting maximum exponent matrix $E(H_s)_i^1$ |
| Type 2 | Supporting only second base-graph or supporting maximum exponent matrix $E(H_s)_i^2$ |
| Type 3 | supporting both base-graphs or supporting maximum exponent matrices $E(H_s)_i^1$ and $E(H_s)_i^2$ |

When receiving downlink data information through downlink control information from the base station, the terminal supporting type 1 determines that the base-graph applied to the transport block containing the downlink data information continuously adopts the first base-graph and applies the maximum exponent matrix $E(H_s)_i^1$ in data encoding or decoding. When receiving downlink data information through downlink control information from the base station, the terminal supporting type 2 determines that the base-graph applied to the transport block containing the downlink data information continuously adopts the second base-graph and applies the maximum exponent matrix $E(H_s)_1^2$ in data encoding or decoding.

When receiving the downlink data information from the base station through the downlink control information, the terminal supporting type 3 is configured the base-graph applied to the transport block containing the downlink data information in advance from the base station through the higher layer signaling such as SIB, RRC or MAC CE or configured the base-graph through the downlink control information transferred to a terminal group common or a terminal (cell) common or a terminal specific control channel. The downlink control information may or may not include the scheduling information for the transport block.

When receiving the downlink data information from the base station through the downlink control information, the terminal supporting type 3 is configured which maximum exponent matrix of $E(H_s)_i^1$ and $E(H_s)_i^2$ applied to the transport block containing the downlink data information is applied in advance from the base station through the higher layer signaling such as SIB, RRC or MAC CE or configured which maximum exponent matrix of $E(H_s)_i^1$ and $E(H_s)_i^2$ applied to the transport block containing the downlink data information is applied through the downlink control information transferred to a terminal group common or a terminal (cell) common or a terminal specific control channel. The downlink control information may or may not include the scheduling information for the transport block.

Figure 4:
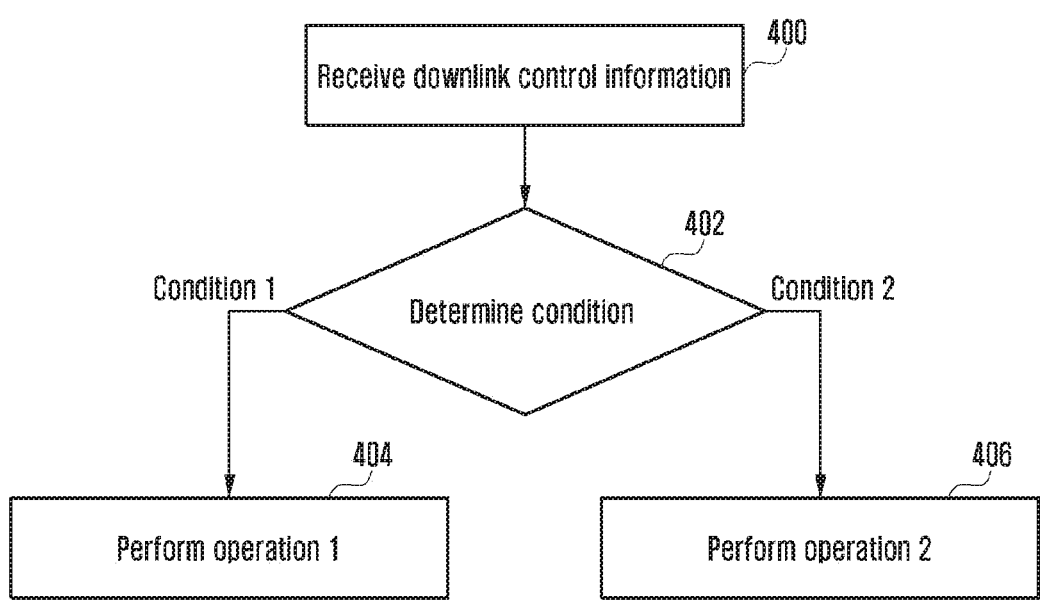
FIG. 4 is a flowchart of a control information and data receiving process of a terminal according to an embodiment.

FIG. 4 is a flowchart of a data receiving process of a terminal according to an embodiment.

Referring to FIG. 4, the terminal receives the downlink control information through the terminal common downlink control channel, the terminal group common downlink control channel, or the terminal-specific downlink control channel in step 400.

The terminal determines one or two or more combinations of the following conditions through the reception of the downlink control information in step 402.

A. RNTI scrambled in the CRC of the downlink control information

B. Size of the transport block included in the downlink control information

C. Base-graph indicator included in the downlink control information

D. Scheduling related value included in the downlink control information

In a case where the RNTI scrambled to the CRC of the downlink control information is an random access RNTI (RA-RNTI), a paging RNTI (P-RNTI), a system information RNTI (SI-RNTI), a single cell RNTI (SC-RNTI), or a group RNTI (G-RNTI) based on condition A, the terminal determines the case as condition 1 and performs operation 1 in step 404.

In a case where the RNTI scrambled to the CRC of the downlink control information is an RA-RNTI, a P-RNTI, an SI-RNTI, an SC-RNTI, or a G-RNTI based on condition A, the terminal determines the case as condition 2 and performs operation 2 in step 406.

In a case where the size including the transport block and the CRC included in the downlink control information is greater than or equal to a predetermined threshold value $\Delta_1$ based on condition B, the terminal determines the case as condition 1 and performs operation 1 in step 404.

In a case where the size including the transport block and the CRC included in the downlink control information is less than or equal to a predetermined threshold value $\Delta_2$ based on condition B, the terminal determines the case as condition 2 and performs operation 2 in step 406.

The threshold value $\Delta_1$ or the threshold value $\Delta_2$ may adopt a fixed value of 2560 (or 3840, 960, 1040, 1120, 170, or 640 or any other value). The threshold value $\Delta_1$ or the threshold value $\Delta_2$ may have the same value or different values.

Alternatively, the threshold value $\Delta_1$ or the threshold value $\Delta_2$ may be a value previously set through the higher layer signaling such as SIB, RRC, or MAC CE, or may be a value previously set through the downlink control information of the terminal group common, terminal common, or terminal specific downlink control channel. In this case, a value fixed to 2560 (or 3840, 960, 1040, 1120, 170, or 640 or any other value) may be used as a default threshold value $\Delta$ before the threshold value $\Delta$ is set. A time before the threshold value $\Delta_1$ or the threshold value $\Delta_2$ is determined depending on whether the CRC of the downlink control information of the terminal is scrambled to the RA-RNTI, P-RNTI, SI-RNTI, SC-RNTI, or G-RNTI.

In a case where a minimum code block length ($K_{min}$) belongs to the first base-graph, of code block lengths K which may be supported in the first base-graph and code block lengths K which may be supported in the second base-graph satisfying K>(transport block size+CRC size) while the size including the transport block and the CRC included in the downlink control information is smaller than 2560 (or 3840) (alternatively, simultaneously, when the size is greater than 160 or 640) based on condition B, the terminal determines the case as condition 1 and performs operation 1 in step 404.

In a case where a minimum code block length (K) belongs to the second base-graph, of code block lengths K which may be supported in the first base-graph and code block lengths K which may be supported in the second base-graph satisfying K>(transport block size+CRC size) while the size including the transport block and the CRC included in the downlink control information is smaller than 2560 (or 3840) (alternatively, simultaneously, when the size is larger than 160 or 640) based on condition B, the terminal determines the case as condition 2 and performs operation 2 in step 406.

This may be expressed as follows:

$$(TB+CRC) \leq K \leq V_2 \text{ where } K \in K^1 \text{ or } K \in K^2;$$

$$K^* = \min(K);$$

if $K^* \in K^1$, condition 1 is satisfied and operation 1 in step 404 is performed;

if $K^* \in K^2$, condition 2 is satisfied and operation 2 in step 406 is performed; and where K represents the code block length, K* represents the selected code block length, TB represents the transport block size, CRC represents the CRC size, K' represent the set of code block lengths that may be supported in the first base-graph, and $K^2$ represent the set of code block lengths that may be supported in the second base-graph.

Alternatively, this may be expressed as follows:

$$V_1 \leq (TB+CRC) \leq K \leq V_2 \text{ where } K \in K^1 \text{ or } K \in K^2;$$

$$K^* = \min(K);$$

if $K^* \in K^1$, condition 1 is satisfied and operation 1 404 is performed;

if $K^* \in K^2$, condition 2 is satisfied and operation 2 406 is performed; and where K represents the code block length, K* represents the selected code block length, TB represents the transport block size, CRC represents the CRC size, $K^1$ represent the set of code block lengths that may be supported in the first base-graph, and $K^2$ represent the set of code block lengths that may be supported in the second base-graph.

$K^1$ represents the set of code block lengths that may be supported in the first base-graph (or the maximum exponent matrix $E(H_s)_i^1$) and the types of the sets may be one or two or more some combinations. $V_1$ may be 160 or 640 or other values. $V_2$ may be 2560, 3840, 960, 1040, or 1120 or any other value.

Alternatively, when TB+CRC is less than $V_1$, the terminal performs decoding or encoding by applying one of the maximum exponential matrices $E(H_s)_i^2$ and when TB+CRC is greater than $V_2$, the terminal performs decoding or encoding by applying one of the maximum exponential matrices $E(H_s)_i^1$.

1. If K is less than or equal to 2560,
   44, 66, 88, 132, 154, 176, 198, 242, 264, 286, 308, 330, 352, 296, 484, 528, 572, 616, 660, 704, 792, 968, 1056, 1144, 1232, 1320, 1408, 1584, 1936, 2112, 2288, 2464;
2. If K is less than or equal to 3840,
   44, 66, 88, 132, 154, 176, 198, 242, 264, 286, 308, 330, 352, 296, 484, 528, 572, 616, 660, 704, 792, 968, 1056, 1144, 1232, 1320, 1408, 1584, 1936, 2112, 2288, 2464, 2640, 2816, 3168;
3. If K is less than or equal to 960,
   44, 66, 88, 132, 154, 176, 198, 242, 264, 286, 308, 330, 352, 296, 484, 528, 572, 616, 660, 704, 792;
4. If K is less than or equal to 1040,
   44, 66, 88, 132, 154, 176, 198, 242, 264, 286, 308, 330, 352, 296, 484, 528, 572, 616, 660, 704, 792, 968; and
5. If K is less than or equal to 1120,
   44, 66, 88, 132, 154, 176, 198, 242, 264, 286, 308, 330, 352, 296, 484, 528, 572, 616, 660, 704, 792, 968, 1056.

It is usually possible that the values described above are used when all or some of the values above are omitted when the value is less than or equal to M. The value of M may be selected as 160, 640, or another value.

$K^2$ represents the set of code block lengths that may be supported in the second base-graph (or the maximum exponent matrix $E(H_s)_i^2$) and the types of the sets may be one or two or more of some combinations.

1. If K is less than or equal to 2560,
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560;
2. If K is less than or equal to 3840,
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560, (2720, 2880, 3040, 3200, 3360, 3520, 3680, 3840);
3. If K is less than or equal to 960,
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960;
4. If K is less than or equal to 1040,
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040; and 5. If K is less than or equal to 1120,
20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120.

When the base-graph indicator included in the downlink control information indicates the value of 0 (or 1) based on condition C, the terminal determines that condition 1 is satisfied and performs operation 1 in step 404.

When the base-graph indicator included in the downlink control information indicates the value of 1 (or 0) based on condition C, the terminal determines that condition 2 is satisfied and performs operation 2 in step 404.

When MCS, RV, NDI, or frequency or time resource allocation values among the scheduling-related values included in the downlink control information indicate the specific information based on condition D, the terminal determines that condition 1 is satisfied and performs operation 1 in step 404.

When MCS, RV, NDI, or frequency or time resource allocation values among the scheduling-related values included in the downlink control information indicate the specific information based on condition D, the terminal determines that condition 2 is satisfied and performs operation 2 in step 404.

When the terminal performs operation 1 in step 404, the terminal performs an operation for one or two or more combinations of the following:

1. The terminal attempts to decode a transport block indicated by the downlink control information based on a code block length that may be supported in the first base-graph (or maximum exponent matrix $E(H_s)_i^2$).

2. The terminal attempts to decode the transport block indicated by the downlink control information with reference to the next supportable code block values:
44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096).

3. One or two or more combinations of the following possible code block sets are code blocks that the terminal encodes or decodes using $E(H_s)_i^1$. At least for the code block, the terminal attempts to decode the transport block indicated by the downlink control information based on the matrix $E(H_s)_i^1$ supported by the first base-graph.
   A. 44, 88, 176, 352, 704, 1408, 2816, 5632;
   B. 44, 66, 110, 154, 198, 242, 286, 330; and
   C. 44, 66, 154, 198, 242, 286, 330.

4. One or two or more combinations of the following possible code block sets are code blocks that the terminal encodes or decodes using $E(H_s)_2^1$. At least for the code block, the terminal attempts to decode the transport block indicated by the downlink control information based on the matrix $E(H_s)_2^1$ supported by the first base-graph.
   A. 66, 132, 264, 528, 1056, 2112, 4224, 8448;
   B. 88, 132, 220, 308, 396, 484, 572, 660; and
   C. 88, 132, 308, 396, 484, 572, 660.

5. One or two or more combinations of the following possible code block sets are code blocks that the terminal encodes or decodes using $E(H_s)_3^1$. At least for the code block, the terminal attempts to decode the transport block indicated by the downlink control information based on the matrix $E(H_s)_3^1$ supported by the first base-graph.
   A. 110, 220, 440, 880, 1760, 3520, 7040;
   B. 176, 264, 440, 616, 792, 968, 1144, 1320;
   C. 1760, 3520, 7040;
   D. 3520, 7040;
   E. 7040; and
   F. 176, 264, 616, 792, 968, 1144, 1320.

6. One or two or more combinations of the following possible code block sets are code blocks that the terminal encodes or decodes using $E(H_s)_4^1$. At least for the code block, the terminal attempts to decode the transport block indicated by the downlink control information based on the matrix $E(H_s)_4^1$ supported by the first base-graph.
   A. 154, 308, 616, 1232, 2464, 4928;
   B. 352, 528, 880, 1232, 1584, 1936, 2288, 2640; and
   C. 352, 528, 1232, 1584, 1936, 2288, 2640.

7. One or two or more combinations of the following possible code block sets are code blocks that the terminal encodes or decodes using $E(H_s)_5^1$. At least for the code block, the terminal attempts to decode the transport block indicated by the downlink control information based on the matrix $E(H_s)_5^1$ supported by the first base-graph.
   A. 198, 396, 792, 1584, 3168, 6336;
   B. 704, 1056, 1760, 2464, 3168, 3872, 4576, 5280; and
   C. 704, 1056, 2464, 3168, 3872, 4576, 5280.

8. One or two or more combinations of the following possible code block sets are code blocks that the terminal encodes or decodes using $E(H_s)_6^1$. At least for the code block, the terminal attempts to decode the transport block indicated by the downlink control information based on the matrix $E(H_s)_6^1$ supported by the first base-graph.
   A. 242, 484, 968, 1936, 3872;
   B. 1408, 2112, 3520, 4928, 6336, 7744; and
   C. 1408, 2112, 4928, 6336, 7744.

9. One or two or more combinations of the following possible code block sets are code blocks that the terminal encodes or decodes using $E(H_s)_7^1$. At least for the code block, the terminal attempts to decode the transport block indicated by the downlink control information based on the matrix $E(H_s)_7^1$ supported by the first base-graph.
   A. 286, 572, 1144, 2288, 4576; and
   B. 2816, 4224, 7040.

10. One or two or more combinations of the following possible code block sets are code blocks that the terminal encodes or decodes using $E(H_s)_8^1$. At least for the code block, the terminal attempts to decode the transport block indicated by the downlink control information based on the matrix $E(H_s)_8^1$ supported by the first base-graph.
    A. 330, 660, 1320, 2640, 5280; and
    B. 5632, 8448.

When the terminal performs operation 2 in step 406, the terminal performs an operation for one or two or more combinations of the following.

1. The terminal attempts to decode a transport block indicated by the downlink control information based on a code block length that may be supported in the second base-graph.

2. The terminal attempts to decode the transport block indicated by the downlink control information with reference to the next supportable code block values:
20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560 (2880, 3200, 3520, 3840, 2720, 3040, 3360, 3680).

3. One or two or more combinations of the following possible code block sets are code blocks that the terminal encodes or decodes using $E(H_s)_1^2$. At least for the code block, the terminal attempts to decode the transport block indicated by the downlink control information based on the matrix $E(H_s)_1^2$ supported by the second base-graph.
   A. 20, 40, 80, 160, 320, 640, 1280; and
   B. 20, 30, 50, 70, 90, 110, 130, 150.

4. One or two or more combinations of the following possible code block sets are code blocks that the terminal encodes or decodes using $E(H_s)_2^2$. At least for the code block, the terminal attempts to decode the transport block indicated by the downlink control information based on the matrix $E(H_s)_2^2$ supported by the second base-graph.
   A. 30, 60, 120, 240, 480, 960, 1920, (3840); and
   B. 40, 60, 100, 140, 180, 220, 260, 300.

5. One or two or more combinations of the following possible code block sets are code blocks that the terminal encodes or decodes using $E(H_s)_3^2$. At least for the code block, the terminal attempts to decode the transport block indicated by the downlink control information based on the matrix $E(H_s)_3^2$ supported by the second base-graph.
   A. 50, 100, 200, 400, 800, 1600, (3200); and
   B. 80, 120, 200, 280, 360, 440, 520, 600.

6. One or two or more combinations of the following possible code block sets are code blocks that the terminal encodes or decodes using $E(H_s)_4^2$. At least for the code block, the terminal attempts to decode the transport block indicated by the downlink control information based on the matrix $E(H_s)_4^2$ supported by the second base-graph.
   A. 70, 140, 280, 560, 1120, 2240; and
   B. 160, 240, 400, 560, 720, 880, 1040, 1200.

7. One or two or more combinations of the following possible code block sets are code blocks that the terminal encodes or decodes using $E(H_s)_5^2$. At least for the code block, the terminal attempts to decode the transport block indicated by the downlink control information based on the matrix $E(H_s)_5^2$ supported by the second base-graph.
   A. 90, 180, 360, 720, 1440, (2880); and
   B. 320, 480, 800, 1120, 1440, 1760, 2080, 2400.

8. One or two or more combinations of the following possible code block sets are code blocks that the terminal encodes or decodes using $E(H_s)_6^2$. At least for the code block, the terminal attempts to decode the transport block indicated by the downlink control information based on the matrix $E(H_s)_6^2$ supported by the second base-graph.
   A. 110, 220, 440, 880, 1760, (3520); and
   B. 640, 960, 1600, 2240, (2880), (3520).

9. One or two or more combinations of the following possible code block sets are code blocks that the terminal encodes or decodes using $E(H_s)_7^2$. At least for the code block, the terminal attempts to decode the transport block indicated by the downlink control information based on the matrix $E(H_s)_7^2$ supported by the first base-graph.
   A. 130, 260, 520, 1040, 2080; and
   B. 1280, 1920, (3200).

10. One or two or more combinations of the following possible code block sets are code blocks that the terminal encodes or decodes using $E(H_s)_8^2$. At least for the code block, the terminal attempts to decode the transport block indicated by the downlink control information based on the matrix $E(H_s)_8^2$ supported by the second base-graph.
   A. 150, 300, 600, 1200, 2400; and
   B. 2560, (3840).

Numbers in parentheses in the present disclosure indicate that the corresponding values may or may not be included.

In the present disclosure, the number of information bits may indicate the amount of data to be transmitted from the higher layer or the TBS of the TB. The TBS is generally transmitted during one TTI, but may also be transmitted over several TTIs. In the present disclosure, the TBS may be represented by N.

A first terminal in the present disclosure may be a terminal that is configured to perform decoding using the maximum exponential matrix $E(H_s)_i^1$ at the time of data transmission, a terminal that may not perform decoding using the maximum exponent matrix $E(H_s)_i^2$ at the time of data transmission, or a terminal that supports type 1 in Table 5 above.

A second terminal in the present disclosure may be a terminal that is configured to perform decoding using the maximum exponential matrix $E(H_s)_i^2$ at the time of data transmission, a terminal that may not perform decoding using the maximum exponent matrix $E(H_s)_i^1$ at the time of data transmission, or a terminal that supports type 2 in Table 5 above.

A third terminal in the present disclosure may be a terminal that is configured to perform decoding using the maximum exponential matrix $E(H_s)_i^1$ or $E(H_s)_i^2$ at the time of data transmission or a terminal that supports type 3 in Table 5 above. The terminal performs determination based on one or more of TBS, MCS, and transmission modes to decide which maximum exponent matrix to use.

The values written in parentheses in the tables described in the present disclosure are values of which all or some may be included in the table or may not be included in the table.

Figure 5:
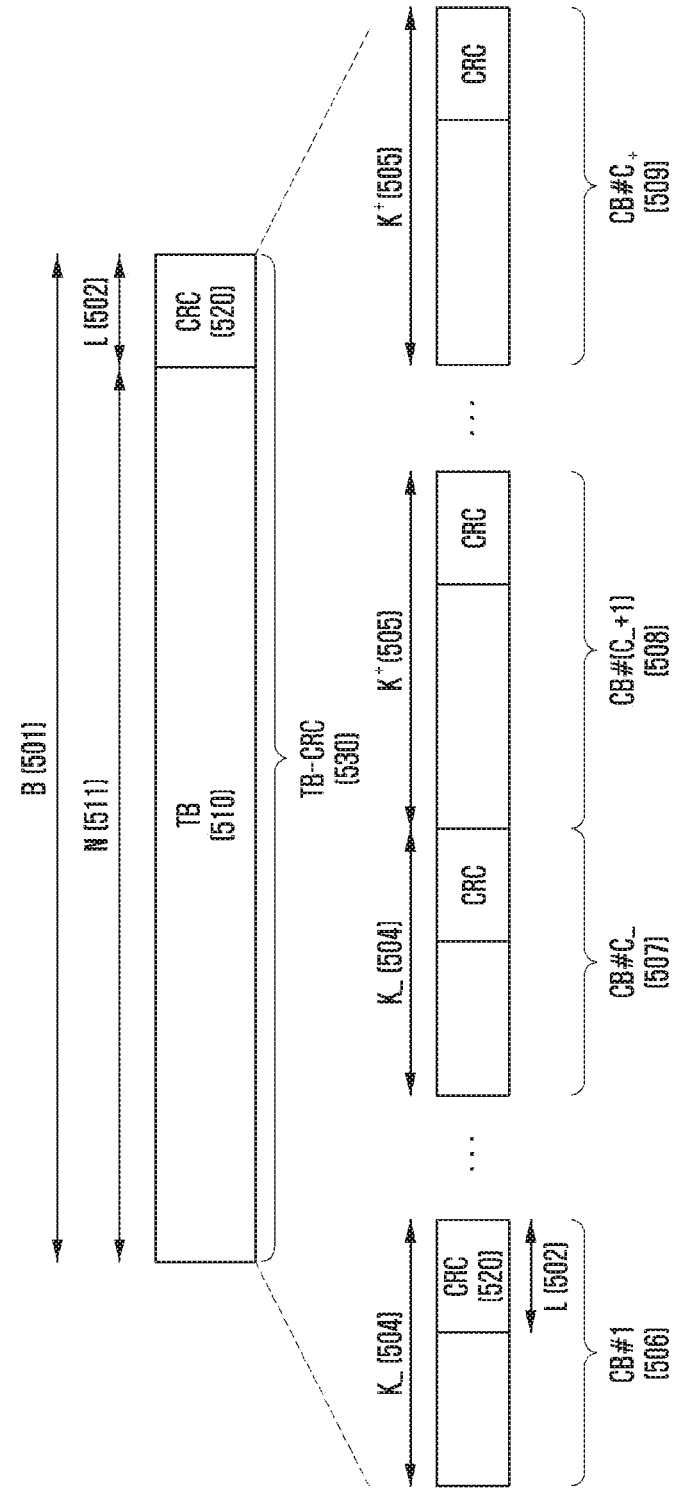
FIG. 5 is a diagram illustrating a method for segmenting a TB into code blocks according to an embodiment.

FIG. 5 is a diagram illustrating a method for segmenting a TB into code blocks according to an embodiment.

FIG. 5 illustrates a transport block 510 of length N 511 and a CRC 520 of length L 502 are inserted and a transport block (TB-CRC) 530 into which a CRC having a total length of B 501 is inserted may be configured.

The CRC inserted in the TB transmission used to determine whether decoding of the TB is successful after decoding the TB in the receiver may have at least two possible values of length L. That is, when the transport block is transmitted while being segmented into two or more code blocks, a long CRC is used. In contrast, when the transport block is transmitted as one code block, a short CRC may be used.

When the LDPC code is used for encoding in the mobile communication system, since the LDPC code has a parity check function as a code itself, the LDPC code has a function of determining whether the decoding is successful to some degree without CRC insertion. In the case of using the LDPC code in a certain mobile communication system and obtaining an additional decoding success determination rate of a predetermined level or greater, a technique of determining the final decoding success by inserting the CRC in addition to the parity check function of the LDPC code may be used and, by using such a method, an error rate level of the desired decoding success determination may be obtained. For example, if the decoding error rate required by the system is $10^{\wedge}-6$ and the determination error rate which may be obtained by the LDPC code parity check function is $10^{\wedge}-3$, a CRC with the determination error rate of $10^{\wedge}-3$ is additionally inserted, so that the final determination error rate of $10^{\wedge}-6$ may be achieved. Generally, the longer the length of the CRC, the lower the determination error rate of decoding success or failure. When the transport block is transmitted while being segmented into two or more code blocks, the TB is concatenated with the LDPC code and the parity check function of the LDPC code itself may not be used. In contrast, when the transport block is one code block, the parity check function of the LDPC code may be used. Therefore, in a certain system, it is possible to insert a CRC having a long or short length into the TB and use the inserted CRC according to the number of code blocks in the transport block. In the embodiments of the present disclosure, it is assumed that a long length L+ or a short length L− may be used as a length L of the CRC inserted into the TB depending on whether the TB is segmented into two or more code blocks. In addition, an example of a possible value for L+ is 24, which is used in the case of LTE, and as an example for L−, it is possible to recycle any of the shorter lengths but using 16 in the LTE control channel. However, the present disclosure is not limited to 16, which is an example of the L− value.

Whether a certain TB is segmented into multiple code blocks is determined depending on whether a given TB may be transmitted in one code block, whether the certain TB is segmented into multiple code blocks may be determined as follows.

If N+L− value is less than or equal to the maximum possible CB length, the TB is transmitted as one code block; If (N+L−)<=$K_{max}$, then one CB is used; and If N+L− value is more the maximum possible CB length, the TB is transmitted while being segmented into multiple code blocks; If (N+L−)>$K_{max}$, then CB is segmented.

In this case, $K_{max}$ represents the largest code block size among the possible code block sizes.

In the following description of the present disclosure, it is assumed that as the CRC length included in the TB, L+ is used when the TB-CRC is transmitted while being segmented into multiple code blocks. That is, if the base station/terminal determines that the TB is segmented even if whether the TB is segmented is determined based on N+L−, the TB it is divided based on B=(N+L+).

The transport block decoding process of the downlink data channel of the terminal described in the present disclosure may be sufficiently applied to the transport block encoding process of the uplink data channel.

The encoding/decoding operation of the terminal described in the present disclosure may be sufficiently applied to the base station encoding/decoding operation.

In the present disclosure, the CRC inserted in the TB transmission used to determine whether the decoding of the TB is successful after decoding the TB in the receiver may have at least two possible values. That is, when the transport block is transmitted while being divided into two or more code blocks, a long (L+) CRC is used. In contrast, when the transport block is transmitted as one code block, a short (L−) CRC may be used. L− is a natural number with a value less than L+. In the embodiments of the present disclosure, a long length L+ or a short length L− may be used as the length of the CRC inserted into the TB depending on whether TB is divided into two or more code blocks. In addition, an example of a possible value for L+ is 24, which is used in the case of LTE, and as an example for L−, it is possible to recycle any of the shorter lengths but use 16 in the LTE control channel. However, the embodiment of the present disclosure is not limited to 16, which is an example of the L− value.

Embodiment 1

Embodiment 1 provides a method for determining an H matrix and performing channel coding when the number of information bits is less than or equal to a predetermined value. For example, the number N of information bits may be less than a value of Nx_max or less than or equal to the value of Nx_max or N+L− may be less than the value of Nx_max or less than or equal to the value of Nx_max. Nx_max may be an arbitrary value and a value for explaining the above example.

If N+L− is less than or equal to N1_max in the first terminal, which is a terminal that may use or is configured to use only the maximum exponent matrix $E(H_s)_i^1$ (i=1, 2, . . . , 8), the TB may be transmitted by using one code block. N1_max may be 8448 in the above example. In this case, Z used for channel coding and H matrix determination is selected from among the Z values shown in Table 3 above, which is the minimum among Z values satisfying Kb×Z≥N+L−. In the above example, Kb may be set to 22. In this case, filler bits of Kb×Z−(N+L−) may be added to the CRC of the information bits and L-bits before the information bits or between the information bits and the CRC, or at the end. In the present disclosure, the filler bit may be set to 0 or 1.

If N+L− is less than or equal to N2_max and the coding rate is less than or equal to ⅔, 0.67, 0.667, or 0.6667 in the second terminal, which is a terminal that may use or is configured to use only the maximum exponent matrix $E(H_s)_i^2$ (i=1, 2, . . . , 8), the TB may be transmitted by using one code block. N2_max may be 2560 in the above example. In this case, Kb may be determined as follows. Kb is 10 if N+L−>N2_t1, Kb is 9 if N2_t1≥N+L−>N2_t2, Kb is 8 if N2_t2>N+L−>N2_t3, and Kb is 6 otherwise. In the above example, N2_t1 may be 640, N2_t2 may be 560, and N2_t3 may be 192. The above example may be expressed by the following pseudo-code:

Pseudo-Code 1

---
[Start]
- If (N + L− > 640), Kb = 10;
- Else if (N + L− > 560), Kb = 9;
- Else if (N + L− > 192), Kb = 8;
- Else, Kb = 6;
[End]
---

Alternatively, Kb may be determined as shown in Table 6 below.

TABLE 6

| | | | | | a | | | | |
|---|---|---|---|---|---|---|---|---|---|
| | Kb | 2 | 3 | 5 | 7 | 9 | 11 | 13 | 15 |
| j | 0 | 6 | 6 | 6 | 6 | 6 | 6 | 6 | 6 |
| | 1 | 6 | 6 | 6 | 6 | 6 | 6 | 6 | 6 |
| | 2 | 6 | 6 | 6 | 8 | 8 | 8 | 8 | 8 |
| | 3 | 6 | 6 | 8 | 8 | 10 | 10 | 10 | 10 |
| | 4 | 8 | 8 | 10 | 10 | 10 | 10 | 10 | 10 |
| | 5 | 9 | 10 | 10 | 10 | 10 | 10 | | |
| | 6 | 10 | 10 | 10 | | | | | |
| | 7 | 10 | 10 | | | | | | |

In this case, the Z value used for channel coding and used for H matrix determination is selected from the Z values shown in Table 4 above, which is the minimum among Z values satisfying Kb×Z≥N+L−. Next, the filler bits of Kb×Z−(N+L−) may be added to the CRC of the information bits and L-bits before the information bits or between the information bits and the CRC, or at the end. In the present disclosure, the filler bit may be set to 0 or 1.

For a third terminal, which is a terminal that may perform decoding or is configured to perform decoding using both the maximum exponential matrices $E(H_s)_i^1$ and $E(H_s)_i^2$, each BG may be configured to use different transport block lengths and coding rates. For example, if the length TBS of the transport block plus the length of the CRC corresponding to the transport block is less than or equal to a certain value N2_max or 2560 and the coding rate is less than or equal to a certain value ⅔, the third terminal may use the second BG (BG #2) and, otherwise, the third terminal may use the first BG (BG #1). In the above example, BG #1 is optimized for the case where the length of the transport block is longer than 2560 or the coding rate is ⅔ or more and BG #2 is optimized in the opposite case. The use of BG #1 in the above description is equivalent to using one of the maximum exponential matrices $E(H_s)_i^1$ (i=1, 2, ..., 8) and similarly, the use of BG #2 is equivalent to using one of the maximum exponential matrices $E(H_s)_i^2$ (i=1, 2, ..., 8). Further, the coding rate may be easily derived from an MCS value that the base station indicates to the terminal. In the present disclosure, the coding rate 2/3 may be changed to 0.67, 0.667, or 0.6667 and applied. In the above description, when N+L− is less than or equal to a certain value N2_max, Kb is determined according to the Pseudo-code 1 above or Table 6 above, and, thus, as the Z value used for channel coding and determining the H matrix, a minimum Z value is selected among the Z values satisfying Kb×Z≥N+L− among the Z values shown in Table 4 above. Next, the filler bits of Kb×Z−(N+L−) may be added to the CRC of the information bits and L-bits before the information bits or between the information bits and the CRC, or at the end. In the present disclosure, the filler bit may be set to 0 or 1. In the above description, Z used for channel coding when N+L− is greater than or greater than or equal to a certain value N2_max and Z used for H matrix determination is selected as Z among the Z values shown in Table 3 above, which is the minimum among Z values satisfying Kb×Z≥N+L−. In the above example, Kb may be set to 22. In this case, filler bits of Kb×Z−(N+L−) may be added to the CRC of the information bits and L-bits before the information bits or between the information bits and the CRC, or at the end.

Embodiment 2

Embodiment 2 provides a method for determining the size of the code block, determining an H matrix, and performing channel coding when the number of information bits is less than or equal to a predetermined value. For example, the number N of information bits may be less than a value of Nx_max or less than or equal to the value of Nx_max or N+L− may be less than the value of Nx_max or less than or equal to Nx_max. In the above example, the Nx_max may be an arbitrary value and a value for explaining the above example.

When the TBS, which is the amount of data to be transmitted, is N, the terminal may preferentially select the minimum value among the K values satisfying K≥N+L−, among the K values that may have one value in the set of specific values. For example, the value between the values in a particular set of values that may be a K value may be defined as in Table 7 below.

TABLE 7

| 40 <= K <= 512 | 528 <= K <= 1024 | 1056 <= K <= 2048 | 2112 <= K <= 6114 | 6272 <= K <= 8448 |
|---|---|---|---|---|
| 8 | 16 | 32 | 64 | 128 |

Table 7 above indicates that when 40<=K<=512, the interval of possible values of K is 8, so 40, 48, 56, 64, 72, ..., when 528<=K<=1024 is included in the set of values, the interval of the value that may be a K value is 16, so 528, 544, 560, ..., 1024 are included in the set of certain values that may be K values. Therefore, the set of values that may be the K value is obtained from Table 7 above. The filler bits of K−(N+L−) may be added to the CRC of the information bits and L-bits before the information bits or between the information bits and the CRC, or at the end. In the present disclosure, the filler bit may be set to 0 or 1. In the above example, the K value is determined to be one of the values determined by Table 7 above, but in another example, a method for determining the K value among the integers that are multiples of 8 may be applied.

If K is less than or equal to N1_max in the first terminal, which is a terminal that may use or is configured to use only the maximum exponent matrix $E(H_s)_i^1$ (i=1, 2, ..., 8), the TB may be transmitted by using one code block. N1_max may be 8448 in the above. In this case, Z used for channel coding and used for H matrix determination is selected as Z among the Z values shown in Table 3 above, which is the minimum among Z values satisfying Kb×Z≥K. In the above example, Kb may be set to 22. In this case, filler bits of Kb×Z−K may be added to the obtained K bits before or at the end. In the present disclosure, the filler bit may be set to 0 or 1.

If K is less than or equal to N2_max and the coding rate is less than or equal to ⅔, 0.67, 0.667, or 0.6667 in the second terminal, which is a terminal that may use or is configured to use only the maximum exponent matrix $E(H_s)_i^2$ (i=1, 2, ..., 8), the TB may be transmitted by using one code block. N2_max may be 2560 in the above example. In this case, Kb may be determined as follows. Kb is 10 if K>N2_t1, Kb is 9 if N2_t1≥K>N2_t2, Kb is 8 if N2_t2≥K>N2_t3, and Kb is 6 otherwise. In the above example, N2_t1 may be 640, N2_t2 may be 560, and N2_t3 may be 192. The above example may be expressed by the following pseudo-code.

Pseudo-Code 2

```
[Start]
- If (K > 640), Kb = 10;
- Else if (K > 560), Kb = 9;
- Else if (K > 192), Kb = 8;
- Else, Kb = 6;
[End]
```

Alternatively, Kb may be determined as shown in Table 6 above. In this case, the Z value used for channel coding and used for H matrix determination is selected as Z among the Z values shown in Table 4 above, which is the minimum among Z values satisfying Kb×Z≥K. Next, the filler bits of Kb×Z−K may be added to the CRC of the information bits and L-bits before the information bits or between the information bits and the CRC, or at the end. In the present disclosure, the filler bit may be set to 0 or 1.

For a third terminal, which is a terminal that may perform decoding or is configured to perform decoding using both the maximum exponential matrices $E(H_s)_i^1$ and $E(H_s)_i^2$, each base-graph (BG) may be configured to use different transport block lengths and coding rates. For example, if the length TBS of the transport block plus the length of the CRC corresponding to the transport block is less than or equal to a specific value N2_max or 2560 and the coding rate is less than or equal to a specified value ⅔, the second BG (BG #2) may be used and otherwise, the first BG (BG #1) may be used. In the above example, BG #1 is optimized for the case where the length of the transport block is longer than 2560 or the coding rate is ⅔ or more and BG #2 is optimized in the opposite case. The use of BG #1 in the above description is equivalent to using one of the maximum exponential matrices $E(H_s)_i^1$ (i=1, 2, ..., 8) and similarly, the use of BG #2 is equivalent to using one of the maximum exponential matrices $E(H_s)_i^2$ (i=1, 2, ..., 8). Further, the coding rate may be easily derived from an MCS value that the base station indicates to the terminal. In the present disclosure, the coding rate 2/3 may be changed to 0.67, 0.667, or 0.6667 and applied. In the above description, when K is less than or equal to a certain value N2_max, Kb is determined according to Pseudo-code 2 above or Table 6 above, and thus as the Z value used for the channel coding and determining the H matrix, a minimum Z value is selected among the Z values satisfying Kb×Z≥K among the Z values shown in Table 4 above. In this case, filler bits of Kb×Z-K may be added to the CRCs of the information bits and the L-bits before or at the end. In the present disclosure, the filler bit may be set to 0 or 1. In the above description, Z used for channel coding when K is greater than or greater than or equal to a certain value N2_max and Z used for H matrix determination is selected from among the Z values shown in Table 3 above, which is the minimum among Z values satisfying Kb×Z≥K. In the above example, Kb may be set to 22. In this case, the filler bits of Kb×Z-K may be added to the K bits before or at the end.

Embodiment 3

Embodiment 3 provides a method for performing channel coding by segmenting the number of information bits into one or more parts and determining an H matrix when the number of information bits is greater than or equal to a predetermined value. In the present embodiment, channel coding of one or more segmented information bit blocks is performed using the same H matrix. That is, the present embodiment provides a method of segmenting a transport block into a code block. For example, the number N of information bits may be greater than a value of Nx_max or N+L− may be greater than the value of Nx_max. In the above example, the Nx_max may be an arbitrary value and a value for explaining the above example.

Figure 6:
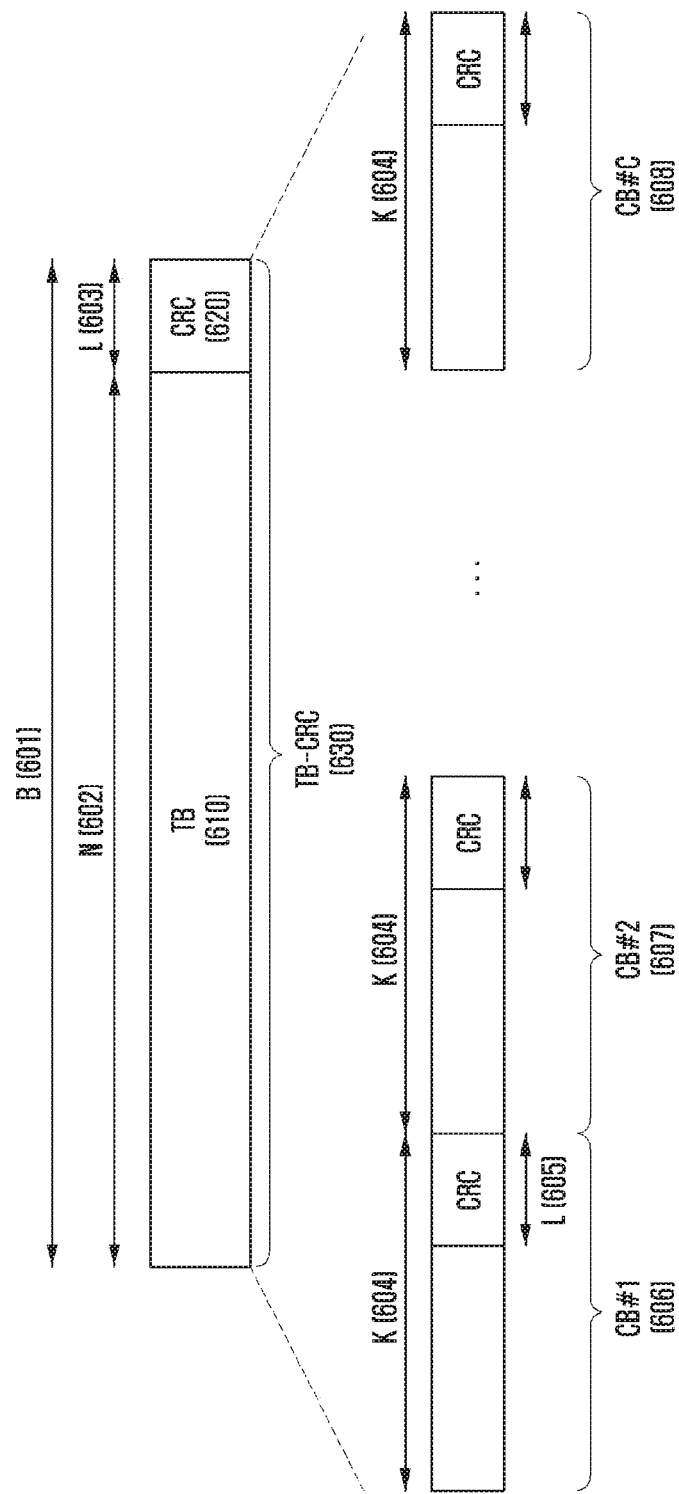
FIG. 6 is a diagram illustrating a method for segmenting a TB into code blocks according to an embodiment.

FIG. 6 is a diagram illustrating a method of segmenting a TB into a code block according to Embodiments 3 and 4 of the present disclosure.

Referring to FIG. 6, a transport block 610 has a length N 602, and a CRC 620 having a length L 603 is inserted to configure a transport block TB-CRC 630 inserted with a CRC having a total length B 601. FIG. 6 shows an example in which the TB-CRC 630 having length B is segmented into a total of C CBs (CB #1 606, CB #2 607, to CB #C 608). The segmented code blocks may have a code block size K, and each code block may be inserted with a CRC 620 having a length L 605. The length L value of the CRC inserted in the CBs (CB #1 606, CB #2 607, to CB #C 608) may be different from the L value of the CRC inserted into the TB 630. In addition, the value of the CRC inserted into the CB may be different from the value of the CRC inserted into the TB. The CRC inserted into the TB can be denoted by L− or L+, and L− is an integer less than L+. For example, L− may be 16 and L+ may be 24. The CRC inserted into the CB may be denoted by $L_{CB}$.

Figure 7:
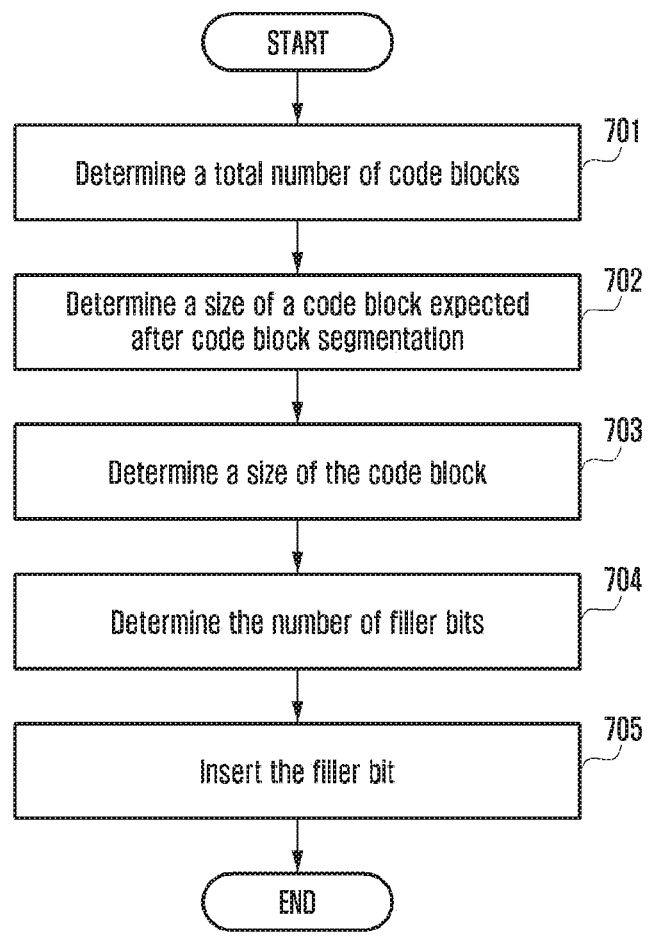
FIG. 7 is a flowchart of a method for segmenting a TB according to an embodiment.

FIG. 7 is a flowchart of a method of segmenting a transport block according to an embodiment.

Referring to FIG. 7, Embodiment 3 may include the following steps:
Step 701. determine a total number C of code blocks;
Step 702. determine a size B' expected after code block segmentation;
Step 703. determine a size of the code block;
Step 704. determine the number of filler bits; and
Step 705. insert the filler bit.

Hereinafter, the above steps are described in greater detail.

In step 701, the transmitter may determine the total number C of code blocks for segmenting one transport block. First, if N+L−≤Kmax, C=1. Herein, N is a TBS value. If N+L−>Kmax, it is defined as B=N+L+, and the transmitter may calculate the number C of code blocks in the same manner as in Equation (10) below. In the above example, B is a value obtained by adding CRC bits to the TBS by L+. For example, when a value obtained by adding L− to the size of the TBS is greater than a certain value, the transport block is segmented into two or more code blocks, which is based on adding the CRC bits to the TBS by L+. Hereinabove, L− and L+ are different values. Alternatively, when N is greater than Kmax−L−, the TBS and L+CRC bits are segmented into two or more code blocks.

$$C = \lceil B/(K_{max} - L_{CB}) \rceil \qquad \text{Equation (10):}$$

It is possible to minimize the number of code blocks generated after segmentation for the transport block by the operation of Equation (10) above. In this case, the value of Kmax may have, for example, a value of 8448.

In step 702, based on the number of code blocks determined in step 701, the transmitter may determine the total block size B' after the expected code block segmentation. For example, this may be determined based on Equation (11) below.

$$B' = B + C \cdot L_{CB} \qquad \text{Equation (11):}$$

According to Equation (11) above, the predicted total block size B' may be determined by a size B obtained by combining CRCs for the transport block before code block segmentation and the transport block after code block segmentation and a size $C \cdot L_{CB}$ of total CRCs added after code block segmentation.

In step 703, the transmitter may determine the code block size. The size of the code block is determined by Kb×Z and is given by Kb=22. A Z value for determining an H matrix to be used for channel coding may be obtained as shown in Equation (12) below.

$$Z = \text{minimum } Z \text{ such that } C \times Kb \times Z >= B' \qquad \text{Equation (12);}$$

That is, a minimum Z value satisfying C×Kb×Z>=B' may be selected from the Z values included in Table 3 above.

The transmitter may select the code block size closest to the entire length B' after the segmentation through the operation of Equation (12) above.

In step 704, the transmitter may determine the number of filler bits. For example, the following Equation (13) may be determined.

$$F = C \times Kb \times Z - B' \qquad \text{Equation (13):}$$

In step 705, the transmitter may insert F filler bits determined in step 704 into a certain code block. In the method of inserting the filler bits, a method of inserting all filler bits having a size F into one certain code block may be used. The certain code block may correspond to, for example, a first code block among the code blocks generated after code block segmentation.

As another example of inserting the filler bits, the filler bits having the size F may be distributed and inserted in all code blocks as equally as possible. More specifically, filler bits having a first filler bit size may be inserted into first N code blocks of the total C code blocks, and filler bits having a second filler bit size may be inserted into the remaining M code blocks. For example, N, M, the first filler bit size $F_+$, and the second filler bit size $F_-$ may be determined by Equation (14) below.

$$N=F \bmod C, M=C-N, F_+=\lceil F/C \rceil, F_-=F_+-1 \quad \text{Equation (14):}$$

Equation (14) is characterized in that a difference between the first filler bit size and the second filler bit size may be minimized to 1. Therefore, there is an advantage that insertion of the most uniform filler bit may be guaranteed.

As another example of inserting the filler bits, the filler bits having the size F may be distributed and inserted to all code blocks having the first code block size as equally as possible. More specifically, it is possible to insert filler bits having a first filler bit size $F_+$ to first $N_+$ code blocks among all $C_+$ code blocks having the first code block size and insert filler bits having a second filler bit size $F_-$ to the remaining $M_+$ code blocks. For example, N, M, the first filler bit size $F_+$, and the second filler bit size $F_-$ may be determined by Equation (15) below.

$$N_+=F \bmod C_+, M_+=C_+-N_+, F_+=\lceil F/C_+ \rceil, F_-=F_+-1 \quad \text{Equation (15):}$$

To describe the above example again, it is possible to insert filler bits having a size F into all the code blocks as uniformly as possible. For example, the transmitter may perform channel coding for each of the code blocks by including filler bits of $\lceil F/C \rceil$ bits or $\lceil F/C \rceil-1$ bits at the front and rear of each code block. In this case, $F-\lceil F/C \rceil \times C$ code blocks or (F mod C) code blocks may have filler bits of $\lceil F/C \rceil$ bits, and the remaining code blocks may have $\lceil F/C \rceil-1$ bits or $\lfloor F/C \rfloor$ filler bits. The $\lfloor x \rfloor$ operation in the present disclosure is a function corresponding to the largest integer, which is less than or equal to a real number x in the descending operation for x.

As another example of inserting the filler bits, the filler bits having the size F may be distributed and inserted to all code blocks having the second code block size as equally as possible. More specifically, it is possible to insert filler bits having a first filler bit size $F_+$ to first $N_-$ code blocks among all $C_-$ code blocks having the second code block size and insert filler bits having a second filler bit size $F_-$ to the remaining $M_-$ code blocks. For example, $N_-$, $M_-$, the first filler bit size $F_+$, and the second filler bit size $F_-$ may be determined by Equation (16) below.

$$N_-=F \bmod C_-, M_-=C_--N_-, F_+=\lceil F/C_- \rceil, F_-=F_+-1 \quad \text{Equation (16):}$$

In the above example, the first code block size and the second code block size may be determined according to the TBS and the number of code blocks.

An example of the present embodiment may also be expressed by the following Pseudo-code 3. Hereinafter, "$a_0, a_1, a_2, \ldots, a_{A-1}$" may be data corresponding to TB. "A" may be TBS.

Pseudo-Code 3

```
[Start]
- If A ≤ Kmax - L_{TB,16}
    B = A + L_{TB,16}
```

```
    b_k = a_k for k = 0,1,2,...,A-1
    b_k = p_{k-A} for k=A, A+1, ..., A + L_{TB,16} - 1
    Number of code blocks: C=1
    B' = B
Else
    B = A + L_{TB,24}
    b_k = a_k for k=0,1,2,...,A-1
    b_k = p_{k-A} for k=A, A+1, ..., A + L_{TB,24} - 1
    Number of code blocks: C = [B/(K_{max} - L_{CB})]
    B' = B + C · L_{CB}
-end
[End]
```

In the Pseudo-code 3 above, $p_{k-A}$ may be a CRC calculated from $A_k$. In addition, $L_{TB, 16}$ and $L_{TB, 24}$ may be values corresponding to L− and L+, respectively, and $L_{TB, 24}$ and $L_{CB}$ may be the same value. For example, $L_{TB, 16}$ and $L_{TB, 24}$ are 16 and 24, respectively, and $L_{CB}$ may be 24. However, the above embodiment is not limited to the above-mentioned values.

Embodiment 4

Embodiment 4 provides a method for performing channel coding by segmenting the number of information bits into one or more parts and determining an H matrix when the number of information bits is greater than or equal to a predetermined value. In the present embodiment, channel coding of one or more segmented information bit blocks is performed using two types of H matrixes.

As described above, FIG. 6 is a diagram illustrating a method of segmenting a transport block TB into a code block according to an embodiment of the present disclosure. As described above, FIG. 6 shows the transport block 610 having the length N 602, and the CRC 620 having the length L 603 is inserted to configure the transport block TB-CRC 630 inserted with the CRC having the total length B 601. FIG. 6 shows an example in which the TB-CRC 630 having the length B is segmented into a total of C CBs (CB #1 606, CB #2 607, to CB #C 608. The segmented code blocks may have a code block size K, and each code block may be inserted with a CRC 620 having a length L 605. The length L value of the CRC inserted in the CBs (CB #1 606, CB #2 607, to CB #C 608) may be different from the L value of the CRC inserted in the TB 630. In addition, the value of the CRC inserted in the CB may be different from the value of the CRC inserted in the TB. The CRC inserted into the TB can be denoted by L− or L+, where L− is an integer less than L+. For example, L− may be 16 and L+ may be 24. The CRC inserted into the CB may be denoted by $L_{CB}$.

The method of segmenting the transport block according to Embodiment 4 of the present disclosure may include the following steps. Alternatively, values of B' and C may be calculated by Pseudo-code 3 described above.

Step 4-1. determine a total number C of code blocks;

Step 4-2. determine a size B' after expected code block segmentation;

Step 4-3. determine code block sizes K+ and K− and a Z value for determining an H matrix;

Step 4-4. determine the number of filler bits; and

Step 4-5. insert the filler bits.

Hereinafter, the steps above are described in greater detail below.

Figure 8:
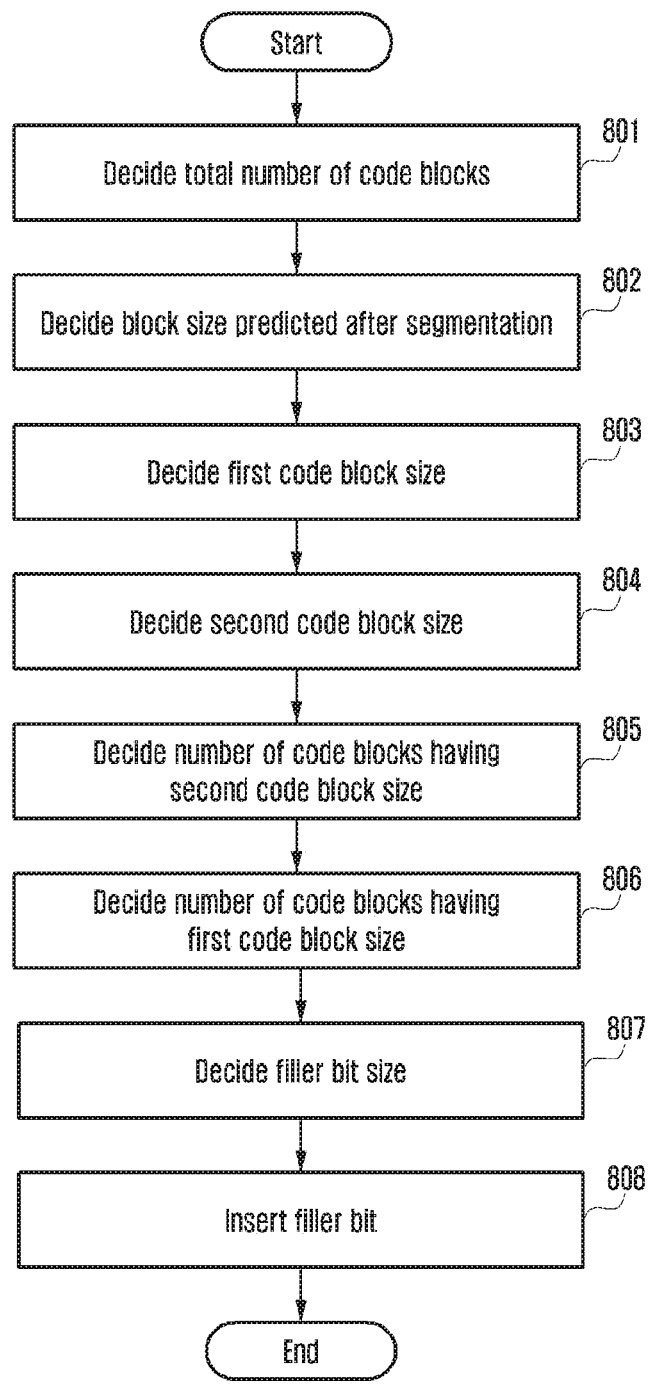
FIG. 8 is a flowchart of a method for segmenting a TB according to an embodiment.

FIG. 8 is a flowchart of a method of segmenting a transport block according to an embodiment.

Referring to FIG. 8, Embodiment 4 of the present disclosure may include the following steps:

Step 801. determine a total number C of code blocks;
Step 802. determine a size B' code block predicted after segmentation;
Step 803. determine a first code block size $K_+$;
Step 804. determine a second code block size $K_-$;
Step 805. determine the number $C_-$ of code blocks having the second code block size $K_-$;
Step 806. determine the number $C_+$ of code blocks having the first code block size $K_+$;
Step 807. determine the number of filler bits; and
Step 808. insert the filler bits.

Hereinafter, the steps above are described in greater detail below.

In step 801, the transmitter may determine the total number of C code blocks for segmenting one transport block. First, if N+L−≤Kmax, C=1. Herein, N is a TBS value. If N+L−>Kmax, it is defined as B=N+L+, and the number C of code blocks may be calculated in the same manner as in Equation (10) above. In the above example, B is a value obtained by adding CRC bits to the TBS by L+. It is possible to minimize the number of code blocks generated by segmentation for the transport block by the operation of Equation (10) above. In this case, the value of $K_{max}$ may have, for example, a value of 8448.

The above process may be expressed as Pseudo-code 4 as follows.

Pseudo-code 4

```
[Start]
If A ≤ Kcb − L_{TB,16}
    B = A + L_{TB,16}
    b_k = a_k for k=0,1,2,...,A−1
    b_k = p_{k−A} for k=A, A+1, ..., A + L_{TB,16} − 1
else
    B = A + L_{TB,24}
    b_k = a_k for k=0,1,2,...,A−1
    b_k p_{k−A} for k=A, A+1, ..., A + L_{TB,24} − 1
end if
(This step is a process of adding the CRC to the information bits.)
if A+L_{TB, 16} ≤ K_{cb}
    L=0
    Number of code blocks: C=1
    B'=B
else
    L=L_{CB}
    Number of code blocks: C = [B/(K_{cb} − L)].
    B' = B + C · L
end if
(The process is a process of obtaining the number C of code blocks and the total number B' of bits.)
[End]
```

In the above, $K_{cb}$ may indicate $K_{max}$, or may be 8448. In the above example, A may be the number of information bits and may be an amount of data transmitted from the higher layer. In the Pseudo-code 4 above, $p_{k-A}$ may be a CRC calculated from $A_k$. In addition, $L_{TB,16}$ and $L_{TB,24}$ may be values corresponding to L− and L+, respectively, and $L_{TB, 24}$ and $L_{CB}$ may be the same value. For example, $L_{TB,16}$ and $L_{TB, 24}$ are 16 and 24, respectively, and $L_{CB}$ may be 24. However, the above embodiment is not limited to the above-mentioned values. Hereinabove, L is a value indicating the $L_{CB}$ and is a length of the CRC that may be added to each code block.

In step 802, based on the number C of code blocks determined in step 801, the transmitter may determine the total block size B' after the expected code block segmentation. For example, this may be determined based on Equation (11) below.

$$B'=B+C \cdot L_{CB} \qquad \text{Equation (11)}:$$

According to Equation (11) above, the total block size B' may be determined by a size B obtained by combining CRCs for the transport block before code block segmentation and the transport block after code block segmentation and a size $C \cdot L_{CB}$ of total CRCs added after code block segmentation.

In steps 803 and 804, the transmitter may determine a size K+ of a large code block and a size K− of a small code block. K+ and K− are determined as values satisfying the following Equations (17) and (18), respectively, among a set of values produced by the above Table 7.

$$K+=\text{minimum } K \text{ such that } C \times K \geq B' \qquad \text{Equation (17)}:$$

$$K-=\text{minimum } K \text{ such that } K<K+ \qquad \text{Equation (18)}:$$

In steps 805 and 806, the transmitter may determine the number of $C_-$ code blocks having the size of K+ and the number of $C_-$ code blocks having the size of K− as follows.

$$C_- = \left\lfloor \frac{C \cdot K_- - B'}{\Delta_K} \right\rfloor \qquad \text{Equation (19)}$$

$$C_+ = C - C_- \qquad \text{Equation (20)}:$$

Hereinabove, $\Delta_K$ is defined as $\Delta_K = K_+ - K_-$.

Each of the C+ code blocks has K+ bits, and each of the C− code blocks has K-bits, and each of the K+ bits and the K− bits may include filler bits. The sum of total filler bits may be $C_+ \times K_+ + C_- \times K_- - B'$. These filler bits may be segmented equally into all code blocks, may be segmented equally into C+ code blocks having K+ bits, may be equally segmented into C− code blocks having K− bits, or may be all included in one code block.

After step 806, the transmitter may determine the code block size. The size of the code block is determined by Kb×Z and is given by Kb=22. A Z value for determining an H matrix to be used for channel coding may be obtained as shown in Equation (21) below.

$$Z=\text{minimum } Z \text{ such that } Kb \times Z \geq K+ \qquad \text{Equation (21)}:$$

That is, a minimum Z value satisfying Kb×Z>=K+ may be selected from the Z values included in Table 3 above.

The transmitter may select the code block size closest to K+ through the operation of Equation (21) above.

In step 807, the transmitter may determine the number of filler bits. For example, the number of filler bits of each code block may be determined from Equation (22) or Equation (23) below.

$$F+ = Kb \times Z - K+ \qquad \text{Equation (22):}$$

$$F- = Kb \times Z - K- \qquad \text{Equation (23):}$$

In step 808, the transmitter may insert F+ or F− filler bits determined in step 807 into a certain code block. For example, the F+ filler bits are added to a code block having a code block size of K+, and the F+ filler bits may be added to a code block having a code block size of K−. In the method of inserting the filler bits, all filler bits having a size F+ or F− may be inserted into one certain code block. The certain code block may correspond to, for example, a first code block among the code blocks generated after code block segmentation.

Embodiment 4-1

Embodiment 4-1 provides a method for performing channel coding by segmenting the number of information bits into one or more parts and determining H matrices when the number of information bits is greater than or equal to a predetermined value. In the present embodiment, channel coding of one or more segmented information bit blocks is performed using two types of H matrices.

Embodiment 4-1 of the present disclosure may include the following steps:

Step 901. determine a total number C of code blocks;
Step 902. determine a size B' after expected code block segmentation;
Step 903. determine a size of the code block;
Step 904. determine of the number of first-step filler bits;
Step 905. insert first-step filler bits;
Step 906. determine Kb and Z for determining a channel code;
Step 907. determine of the number of second-step filler bits; and
Step 908. insert second-step filler bits.

Hereinafter, the steps above are described in detail.

In step 901, the transmitter may determine the total number of C code blocks for segmenting one transport block. First, if N+L−≤Kmax, C=1. Herein, N is a TBS value. If N+L−>Kmax, the transmitter may define B=N+L+ and calculate the number of C code blocks in the same manner as Equation (10) above. In the above, B is a value obtained by adding CRC bits to the TBS by L+. It is possible to minimize the number of code blocks generated after segmentation for the transport block by the operation of Equation (10). In this case, the value of $K_{max}$ may have, for example, a value of 8448.

In step 902, based on the number C of code blocks determined in step 901, the transmitter may determine the total block size B' after the expected code block segmentation. For example, the following Equation (24) may be followed. According to Equation (24), the total block size B' may be determined by a size B obtained by combining CRCs for the transport block before code block segmentation and the transport block after code block segmentation and a size $C \cdot L_{CB}$ of total CRCs added after code block segmentation.

In step 903, the code block size K may be determined. K is determined as a value satisfying Equation (24) below.

$$K = \text{minimum } K \text{ such that } C \times K >= B' \qquad \text{Equation (24)}$$

Each of the C code blocks has K bits of data bits, and the K bits may include filler bits. The sum of total filler bits may be C×K−B'. These filler bits may be segmented into all code blocks as equally as possible, or may be all included in one code block. The filler bits associated with steps 904 and 905 may be referred to as first-step filler bits.

In step 906, the transmitter may determine the code block size. The size of the code block is determined by Kb×Z and is given by Kb=22. A Z value for determining an H matrix to be used for channel coding may be obtained as shown in Equation (25) below.

$$Z = \text{minimum } Z \text{ such that } Kb \times Z >= K \qquad \text{Equation (25):}$$

That is, a minimum Z value satisfying Kb×Z>=K+ may be selected from the Z values included in Table 3 above.

The transmitter may select the code block size closest to K through the operation of Equation (25) above.

In step 907, the transmitter may determine the number of filler bits. For example, the number of filler bits of each code block may be determined from Equation (26) below.

$$F = Kb \times Z - K \qquad \text{Equation (26):}$$

In step 908, the transmitter may insert the F filler bits determined in step 1007 into each of the code blocks. For example, F filler bits may be added to a code block having a K code block size. The filler bits associated with steps 907 and 908 may be referred to as second-step filler bits.

Embodiment 4-2

In Embodiment 4-2, a method of calculating and determining a TBS by a base station and a terminal is described below.

The base station may allocate frequency-time resources to the terminal for scheduling and count how many REs may be used for data transmission. For example, if the base station allocates 10 PRBs of a first PRB to a 10-th PRB and allocates 7 OFDM symbols for data transmission, a total of 10×12×7 or 840 REs are included in the allocated frequency-time resources. Among the 840 REs, except for REs used as a demodulation reference signal (DMRS), REs used as channel state information reference signals (CSI-RSs), REs used for control channels that may exist, and the like, the remaining REs may be used to map data signals. Thus, the base station and the terminal may know from the allocation of frequency-time resources how REs are used for data transmission. The frequency-time resources may be transmitted to the terminal through physical layer or higher layer signaling.

In addition, the base station may inform the UE of modulation and channel coding information for scheduling. For example, information about which modulation such as QPSK, 16-QAM, 64-QAM, 256-QAM, and 1024-QAM data transmission is performed through and information on the coding rate may be included. This may be referred to as an MCS, values are defined in a predetermined table, and the base station may transmit a DCI including only an index for the MCS to the terminal. It is also possible to transmit information on a modulation order among the modulation information. The modulation orders of QPSK, 16-QAM, 64-QAM, 256-QAM, and 1024-QAM is 2, 4, 6, 8, and 10, respectively.

The base station calculates the final TBS value in the following steps:

Step 1. calculate temporary TBS per layer;
Step 2. select the final TBS per layer; and
Step 3. calculate the final TBS.

In step 1, the base station may calculate the temporary TBS per layer as follows:

Temporary TBS value per layer=MCS order×Coding rate×Number of allocated REs that is able to be used for data transmission Alternatively, Temporary TBS value per layer=Value indicated in the MCS table×Number of allocated REs that is able to be used for data transmission The temporary TBS per layer may be calculated as described above. The value indicated in the MCS table may be a value reflecting the coding rate and the MCS order.

In step 2, as the final TBS, selected is the largest value from values which are less than or equal to the calculated temporary TBS value per layer, among the values that are able to be the TBS according to Table 8 below.

TABLE 8

| TBS range | Granularity (ΔTBS) |
| --- | --- |
| TBS ≤ Kmax − $L_{TB, 16}$ | 8 |
| Kmax − $L_{TB, 16}$ < TBS ≤ 2 × (Kmax − $L_{CB}$) − $L_{TB, 24}$ | 2 × 8 |
| (C − 1) × (Kmax − $L_{CB}$) − $L_{TB, 24}$ < TBS ≤ C × (Kmax − $L_{CB}$) − $L_{TB, 24}$, for C > 2 | C × 8 |

TABLE 9

| TBS range | TBS (n = 0, 1, 2, . . .) |
| --- | --- |
| TBS ≤ Kmax − $L_{TB, 16}$ | $TBS_1$ + 8 × n |
| Kmax − $L_{TB, 16}$ < TBS ≤ 2 × (Kmax − $L_{CB}$) − $L_{TB, 24}$ | $TBS_2$ + 2 × 8 × n |
| (C − 1) × (Kmax − $L_{CB}$) − $L_{TB, 24}$ < TBS ≤ C × (Kmax − $L_{CB}$) − $L_{TB, 24}$, for C > 2 | $TBS_C$ + C × 8 × n |

In the above Table 9, $TBS_1$ may be a small integer such as 32 or 40. $TBS_2$ may be an integer such as 8448. $TBS_C$ may be a multiple of C×8 larger than (C−1)×(Kmax−$L_{CB}$)−$L_{TB, 24}$, or the least common multiple of C and 8. Alternatively, the $TBS_C$ may be ceil(((C−1)×8432+1)/LCM(8,C))×LCM(8,C)−24. In the above, ceil {x} may be a minimum integer greater than or equal to x. LCM (a,b) is the least common multiple of a and b. For example, the TBS may be given as Table 10 as follows:

TABLE 10

| TBS range | TBS (n = 0, 1, 2, . . .) |
| --- | --- |
| TBS ≤ 8432 | 32 + 8 × n |
| 8432 < TBS ≤ 16840 | 8448 + 2 × 8 × n |

TABLE 10-continued

| TBS range | TBS (n = 0, 1, 2, . . .) |
| --- | --- |
| 16840 < TBS ≤ 25272 | 16872 + 3 × 8 × n |
| 25272 < TBS ≤ 33696 | 25312 + 4 × 8 × n |
| . . . | . . . |

According to Table 8 above, in the case where the TB is segmented into C code blocks and the number of bits of information included in each code block is the same, the number of bits of information included in each code block may be determined in units of 8. Therefore, the granularity of TBS which may be a TBS value according to a given range of a TBS value may be determined as shown in Table 8 above. Alternatively, the granularity of TBS may be determined as shown in Table 11 below.

TABLE 11

| TBS range | Granularity (ΔTBS) |
| --- | --- |
| TBS ≤ Kmax − $L_{TB, 16}$ | 8 |
| Kmax − $L_{TB, 16}$ < TBS ≤ 2 × (Kmax − $L_{CB}$) − $L_{TB, 24}$ | 2 × 8 |
| (C − 1) × (Kmax − $L_{CB}$) − $L_{TB, 24}$ < TBS ≤ C × (Kmax − $L_{CB}$) − $L_{TB, 24}$, for C > 2 | LCM(C, 8) |

In the above, LCM(C, 8) indicates the least common multiple of C and 8. For example, if C is 10, then the LCM(C, 8), i.e., the least common multiple of 10 and 8, is 40.

Alternatively, the values that are able to be TBS may be represented by the TBS obtained from Pseudo-code 5 below.

Pseudo-Code 5

```
[Start]
If TBS ≤ 8432
    TBS: 8 + 8×n, for n=0,1,2,..., 1053
Else if TBS ≤ 8440
    TBS: 8440+ 16×n, for n=0,1,2,..., 525
Else
    TBS: ceil(((C−1) ×8432 + 1)/LCM(8,C))*LCM(8,C) − 24 +
C×8×n, for C=3,4, ..., and n=0,1,2,..., floor(8432/8/C)
End if
[End]
```

In the above, LCM(a,b) is the least common multiple of a and b. Some of the values obtained by Pseudo-code 5 may include values given in Table 12 below. The following Table 12 may include candidates for TBS obtained from the values given with C up to 5 in Pseudo-code 5 above.

TABLE 12

8, 16, 24, 32, 40, 48, 56, 64, 72, 80, 88, 96, 104, 112, 120, 128, 136, 144, 152, 160, 168, 176, 184, 192, 200, 208, 216, 224, 232, 240, 248, 256, 264, 272, 280, 288, 296, 304, 312, 320, 328, 336, 344, 352, 360, 368, 376, 384, 392, 400, 408, 416, 424, 432, 440, 448, 456, 464, 472, 480, 488, 496, 504, 512, 520, 528, 536, 544, 552, 560, 568, 576, 584, 592, 600, 608, 616, 624, 632, 640, 648, 656, 664, 672, 680, 688, 696, 704, 712, 720, 728, 736, 744, 752, 760, 768, 776, 784, 792, 800, 808, 816, 824, 832, 840, 848, 856, 864, 872, 880, 888, 896, 904, 912, 920, 928, 936, 944, 952, 960, 968, 976, 984, 992, 1000, 1008, 1016, 1024, 1032, 1040, 1048, 1056, 1064, 1072, 1080, 1088, 1096, 1104, 1112, 1120, 1128, 1136, 1144, 1152, 1160, 1168, 1176, 1184, 1192, 1200, 1208, 1216, 1224, 1232, 1240, 1248, 1256, 1264, 1272, 1280, 1288, 1296, 1304, 1312, 1320, 1328, 1336, 1344, 1352, 1360, 1368, 1376, 1384, 1392, 1400, 1408, 1416, 1424, 1432, 1440, 1448, 1456, 1464, 1472, 1480, 1488, 1496, 1504, 1512, 1520, 1528, 1536, 1544, 1552, 1560, 1568, 1576, 1584, 1592, 1600, 1608, 1616, 1624, 1632, 1640, 1648, 1656, 1664, 1672, 1680, 1688, 1696, 1704, 1712, 1720, 1728, 1736, 1744, 1752, 1760, 1768, 1776, 1784, 1792, 1800, 1808, 1816, 1824, 1832, 1840, 1848, 1856, 1864, 1872, 1880, 1888, 1896, 1904, 1912,

TABLE 12-continued 1920, 1928, 1936, 1944, 1952, 1960, 1968, 1976, 1984, 1992, 2000, 2008, 2016, 2024, 2032,
2040, 2048, 2056, 2064, 2072, 2080, 2088, 2096, 2104, 2112, 2120, 2128, 2136, 2144, 2152,
2160, 2168, 2176, 2184, 2192, 2200, 2208, 2216, 2224, 2232, 2240, 2248, 2256, 2264, 2272,
2280, 2288, 2296, 2304, 2312, 2320, 2328, 2336, 2344, 2352, 2360, 2368, 2376, 2384, 2392,
2400, 2408, 2416, 2424, 2432, 2440, 2448, 2456, 2464, 2472, 2480, 2488, 2496, 2504, 2512,
2520, 2528, 2536, 2544, 2552, 2560, 2568, 2576, 2584, 2592, 2600, 2608, 2616, 2624, 2632,
2640, 2648, 2656, 2664, 2672, 2680, 2688, 2696, 2704, 2712, 2720, 2728, 2736, 2744, 2752,
2760, 2768, 2776, 2784, 2792, 2800, 2808, 2816, 2824, 2832, 2840, 2848, 2856, 2864, 2872,
2880, 2888, 2896, 2904, 2912, 2920, 2928, 2936, 2944, 2952, 2960, 2968, 2976, 2984, 2992,
3000, 3008, 3016, 3024, 3032, 3040, 3048, 3056, 3064, 3072, 3080, 3088, 3096, 3104, 3112,
3120, 3128, 3136, 3144, 3152, 3160, 3168, 3176, 3184, 3192, 3200, 3208, 3216, 3224, 3232,
3240, 3248, 3256, 3264, 3272, 3280, 3288, 3296, 3304, 3312, 3320, 3328, 3336, 3344, 3352,
3360, 3368, 3376, 3384, 3392, 3400, 3408, 3416, 3424, 3432, 3440, 3448, 3456, 3464, 3472,
3480, 3488, 3496, 3504, 3512, 3520, 3528, 3536, 3544, 3552, 3560, 3568, 3576, 3584, 3592,
3600, 3608, 3616, 3624, 3632, 3640, 3648, 3656, 3664, 3672, 3680, 3688, 3696, 3704, 3712,
3720, 3728, 3736, 3744, 3752, 3760, 3768, 3776, 3784, 3792, 3800, 3808, 3816, 3824, 3832,
3840, 3848, 3856, 3864, 3872, 3880, 3888, 3896, 3904, 3912, 3920, 3928, 3936, 3944, 3952,
3960, 3968, 3976, 3984, 3992, 4000, 4008, 4016, 4024, 4032, 4040, 4048, 4056, 4064, 4072,
4080, 4088, 4096, 4104, 4112, 4120, 4128, 4136, 4144, 4152, 4160, 4168, 4176, 4184, 4192,
4200, 4208, 4216, 4224, 4232, 4240, 4248, 4256, 4264, 4272, 4280, 4288, 4296, 4304, 4312,
4320, 4328, 4336, 4344, 4352, 4360, 4368, 4376, 4384, 4392, 4400, 4408, 4416, 4424, 4432,
4440, 4448, 4456, 4464, 4472, 4480, 4488, 4496, 4504, 4512, 4520, 4528, 4536, 4544, 4552,
4560, 4568, 4576, 4584, 4592, 4600, 4608, 4616, 4624, 4632, 4640, 4648, 4656, 4664, 4672,
4680, 4688, 4696, 4704, 4712, 4720, 4728, 4736, 4744, 4752, 4760, 4768, 4776, 4784, 4792,
4800, 4808, 4816, 4824, 4832, 4840, 4848, 4856, 4864, 4872, 4880, 4888, 4896, 4904, 4912,
4920, 4928, 4936, 4944, 4952, 4960, 4968, 4976, 4984, 4992, 5000, 5008, 5016, 5024, 5032,
5040, 5048, 5056, 5064, 5072, 5080, 5088, 5096, 5104, 5112, 5120, 5128, 5136, 5144, 5152,
5160, 5168, 5176, 5184, 5192, 5200, 5208, 5216, 5224, 5232, 5240, 5248, 5256, 5264, 5272,
5280, 5288, 5296, 5304, 5312, 5320, 5328, 5336, 5344, 5352, 5360, 5368, 5376, 5384, 5392,
5400, 5408, 5416, 5424, 5432, 5440, 5448, 5456, 5464, 5472, 5480, 5488, 5496, 5504, 5512,
5520, 5528, 5536, 5544, 5552, 5560, 5568, 5576, 5584, 5592, 5600, 5608, 5616, 5624, 5632,
5640, 5648, 5656, 5664, 5672, 5680, 5688, 5696, 5704, 5712, 5720, 5728, 5736, 5744, 5752,
5760, 5768, 5776, 5784, 5792, 5800, 5808, 5816, 5824, 5832, 5840, 5848, 5856, 5864, 5872,
5880, 5888, 5896, 5904, 5912, 5920, 5928, 5936, 5944, 5952, 5960, 5968, 5976, 5984, 5992,
6000, 6008, 6016, 6024, 6032, 6040, 6048, 6056, 6064, 6072, 6080, 6088, 6096, 6104, 6112,
6120, 6128, 6136, 6144, 6152, 6160, 6168, 6176, 6184, 6192, 6200, 6208, 6216, 6224, 6232,
6240, 6248, 6256, 6264, 6272, 6280, 6288, 6296, 6304, 6312, 6320, 6328, 6336, 6344, 6352,
6360, 6368, 6376, 6384, 6392, 6400, 6408, 6416, 6424, 6432, 6440, 6448, 6456, 6464, 6472,
6480, 6488, 6496, 6504, 6512, 6520, 6528, 6536, 6544, 6552, 6560, 6568, 6576, 6584, 6592,
6600, 6608, 6616, 6624, 6632, 6640, 6648, 6656, 6664, 6672, 6680, 6688, 6696, 6704, 6712,
6720, 6728, 6736, 6744, 6752, 6760, 6768, 6776, 6784, 6792, 6800, 6808, 6816, 6824, 6832,
6840, 6848, 6856, 6864, 6872, 6880, 6888, 6896, 6904, 6912, 6920, 6928, 6936, 6944, 6952,
6960, 6968, 6976, 6984, 6992, 7000, 7008, 7016, 7024, 7032, 7040, 7048, 7056, 7064, 7072,
7080, 7088, 7096, 7104, 7112, 7120, 7128, 7136, 7144, 7152, 7160, 7168, 7176, 7184, 7192,
7200, 7208, 7216, 7224, 7232, 7240, 7248, 7256, 7264, 7272, 7280, 7288, 7296, 7304, 7312,
7320, 7328, 7336, 7344, 7352, 7360, 7368, 7376, 7384, 7392, 7400, 7408, 7416, 7424, 7432,
7440, 7448, 7456, 7464, 7472, 7480, 7488, 7496, 7504, 7512, 7520, 7528, 7536, 7544, 7552,
7560, 7568, 7576, 7584, 7592, 7600, 7608, 7616, 7624, 7632, 7640, 7648, 7656, 7664, 7672,
7680, 7688, 7696, 7704, 7712, 7720, 7728, 7736, 7744, 7752, 7760, 7768, 7776, 7784, 7792,
7800, 7808, 7816, 7824, 7832, 7840, 7848, 7856, 7864, 7872, 7880, 7888, 7896, 7904, 7912,
7920, 7928, 7936, 7944, 7952, 7960, 7968, 7976, 7984, 7992, 8000, 8008, 8016, 8024, 8032,
8040, 8048, 8056, 8064, 8072, 8080, 8088, 8096, 8104, 8112, 8120, 8128, 8136, 8144, 8152,
8160, 8168, 8176, 8184, 8192, 8200, 8208, 8216, 8224, 8232, 8240, 8248, 8256, 8264, 8272,
8280, 8288, 8296, 8304, 8312, 8320, 8328, 8336, 8344, 8352, 8360, 8368, 8376, 8384, 8392,
8400, 8408, 8416, 8424, 8432, 8440, 8456, 8472, 8488, 8504, 8520, 8536, 8552, 8568, 8584,
8600, 8616, 8632, 8648, 8664, 8680, 8696, 8712, 8728, 8744, 8760, 8776, 8792, 8808, 8824,
8840, 8856, 8872, 8888, 8904, 8920, 8936, 8952, 8968, 8984, 9000, 9016, 9032, 9048, 9064,
9080, 9096, 9112, 9128, 9144, 9160, 9176, 9192, 9208, 9224, 9240, 9256, 9272, 9288, 9304,
9320, 9336, 9352, 9368, 9384, 9400, 9416, 9432, 9448, 9464, 9480, 9496, 9512, 9528, 9544,
9560, 9576, 9592, 9608, 9624, 9640, 9656, 9672, 9688, 9704, 9720, 9736, 9752, 9768, 9784,
9800, 9816, 9832, 9848, 9864, 9880, 9896, 9912, 9928, 9944, 9960, 9976, 9992, 10008, 10024,
10040, 10056, 10072, 10088, 10104, 10120, 10136, 10152, 10168, 10184, 10200, 10216, 10232,
10248, 10264, 10280, 10296, 10312, 10328, 10344, 10360, 10376, 10392, 10408, 10424, 10440,
10456, 10472, 10488, 10504, 10520, 10536, 10552, 10568, 10584, 10600, 10616, 10632, 10648,
10664, 10680, 10696, 10712, 10728, 10744, 10760, 10776, 10792, 10808, 10824, 10840, 10856,
10872, 10888, 10904, 10920, 10936, 10952, 10968, 10984, 11000, 11016, 11032, 11048, 11064,
11080, 11096, 11112, 11128, 11144, 11160, 11176, 11192, 11208, 11224, 11240, 11256, 11272,
11288, 11304, 11320, 11336, 11352, 11368, 11384, 11400, 11416, 11432, 11448, 11464, 11480,
11496, 11512, 11528, 11544, 11560, 11576, 11592, 11608, 11624, 11640, 11656, 11672, 11688,
11704, 11720, 11736, 11752, 11768, 11784, 11800, 11816, 11832, 11848, 11864, 11880, 11896,
11912, 11928, 11944, 11960, 11976, 11992, 12008, 12024, 12040, 12056, 12072, 12088, 12104,
12120, 12136, 12152, 12168, 12184, 12200, 12216, 12232, 12248, 12264, 12280, 12296, 12312,
12328, 12344, 12360, 12376, 12392, 12408, 12424, 12440, 12456, 12472, 12488, 12504, 12520,
12536, 12552, 12568, 12584, 12600, 12616, 12632, 12648, 12664, 12680, 12696, 12712, 12728,
12744, 12760, 12776, 12792, 12808, 12824, 12840, 12856, 12872, 12888, 12904, 12920, 12936,
12952, 12968, 12984, 13000, 13016, 13032, 13048, 13064, 13080, 13096, 13112, 13128, 13144,
13160, 13176, 13192, 13208, 13224, 13240, 13256, 13272, 13288, 13304, 13320, 13336, 13352,
13368, 13384, 13400, 13416, 13432, 13448, 13464, 13480, 13496, 13512, 13528, 13544, 13560,
13576, 13592, 13608, 13624, 13640, 13656, 13672, 13688, 13704, 13720, 13736, 13752, 13768,
13784, 13800, 13816, 13832, 13848, 13864, 13880, 13896, 13912, 13928, 13944, 13960, 13976, TABLE 12-continued 13992, 14008, 14024, 14040, 14056, 14072, 14088, 14104, 14120, 14136, 14152, 14168, 14184, 14200, 14216, 14232, 14248, 14264, 14280, 14296, 14312, 14328, 14344, 14360, 14376, 14392, 14408, 14424, 14440, 14456, 14472, 14488, 14504, 14520, 14536, 14552, 14568, 14584, 14600, 14616, 14632, 14648, 14664, 14680, 14696, 14712, 14728, 14744, 14760, 14776, 14792, 14808, 14824, 14840, 14856, 14872, 14888, 14904, 14920, 14936, 14952, 14968, 14984, 15000, 15016, 15032, 15048, 15064, 15080, 15096, 15112, 15128, 15144, 15160, 15176, 15192, 15208, 15224, 15240, 15256, 15272, 15288, 15304, 15320, 15336, 15352, 15368, 15384, 15400, 15416, 15432, 15448, 15464, 15480, 15496, 15512, 15528, 15544, 15560, 15576, 15592, 15608, 15624, 15640, 15656, 15672, 15688, 15704, 15720, 15736, 15752, 15768, 15784, 15800, 15816, 15832, 15848, 15864, 15880, 15896, 15912, 15928, 15944, 15960, 15976, 15992, 16008, 16024, 16040, 16056, 16072, 16088, 16104, 16120, 16136, 16152, 16168, 16184, 16200, 16216, 16232, 16248, 16264, 16280, 16296, 16312, 16328, 16344, 16360, 16376, 16392, 16408, 16424, 16440, 16456, 16472, 16488, 16504, 16520, 16536, 16552, 16568, 16584, 16600, 16616, 16632, 16648, 16664, 16680, 16696, 16712, 16728, 16744, 16760, 16776, 16792, 16808, 16824, 16840, 16848, 16872, 16896, 16920, 16944, 16968, 16992, 17016, 17040, 17064, 17088, 17112, 17136, 17160, 17184, 17208, 17232, 17256, 17280, 17304, 17328, 17352, 17376, 17400, 17424, 17448, 17472, 17496, 17520, 17544, 17568, 17592, 17616, 17640, 17664, 17688, 17712, 17736, 17760, 17784, 17808, 17832, 17856, 17880, 17904, 17928, 17952, 17976, 18000, 18024, 18048, 18072, 18096, 18120, 18144, 18168, 18192, 18216, 18240, 18264, 18288, 18312, 18336, 18360, 18384, 18408, 18432, 18456, 18480, 18504, 18528, 18552, 18576, 18600, 18624, 18648, 18672, 18696, 18720, 18744, 18768, 18792, 18816, 18840, 18864, 18888, 18912, 18936, 18960, 18984, 19008, 19032, 19056, 19080, 19104, 19128, 19152, 19176, 19200, 19224, 19248, 19272, 19296, 19320, 19344, 19368, 19392, 19416, 19440, 19464, 19488, 19512, 19536, 19560, 19584, 19608, 19632, 19656, 19680, 19704, 19728, 19752, 19776, 19800, 19824, 19848, 19872, 19896, 19920, 19944, 19968, 19992, 20016, 20040, 20064, 20088, 20112, 20136, 20160, 20184, 20208, 20232, 20256, 20280, 20304, 20328, 20352, 20376, 20400, 20424, 20448, 20472, 20496, 20520, 20544, 20568, 20592, 20616, 20640, 20664, 20688, 20712, 20736, 20760, 20784, 20808, 20832, 20856, 20880, 20904, 20928, 20952, 20976, 21000, 21024, 21048, 21072, 21096, 21120, 21144, 21168, 21192, 21216, 21240, 21264, 21288, 21312, 21336, 21360, 21384, 21408, 21432, 21456, 21480, 21504, 21528, 21552, 21576, 21600, 21624, 21648, 21672, 21696, 21720, 21744, 21768, 21792, 21816, 21840, 21864, 21888, 21912, 21936, 21960, 21984, 22008, 22032, 22056, 22080, 22104, 22128, 22152, 22176, 22200, 22224, 22248, 22272, 22296, 22320, 22344, 22368, 22392, 22416, 22440, 22464, 22488, 22512, 22536, 22560, 22584, 22608, 22632, 22656, 22680, 22704, 22728, 22752, 22776, 22800, 22824, 22848, 22872, 22896, 22920, 22944, 22968, 22992, 23016, 23040, 23064, 23088, 23112, 23136, 23160, 23184, 23208, 23232, 23256, 23280, 23304, 23328, 23352, 23376, 23400, 23424, 23448, 23472, 23496, 23520, 23544, 23568, 23592, 23616, 23640, 23664, 23688, 23712, 23736, 23760, 23784, 23808, 23832, 23856, 23880, 23904, 23928, 23952, 23976, 24000, 24024, 24048, 24072, 24096, 24120, 24144, 24168, 24192, 24216, 24240, 24264, 24288, 24312, 24336, 24360, 24384, 24408, 24432, 24456, 24480, 24504, 24528, 24552, 24576, 24600, 24624, 24648, 24672, 24696, 24720, 24744, 24768, 24792, 24816, 24840, 24864, 24888, 24912, 24936, 24960, 24984, 25008, 25032, 25056, 25080, 25104, 25128, 25152, 25176, 25200, 25224, 25248, 25272, 25280, 25312, 25344, 25376, 25408, 25440, 25472, 25504, 25536, 25568, 25600, 25632, 25664, 25696, 25728, 25760, 25792, 25824, 25856, 25888, 25920, 25952, 25984, 26016, 26048, 26080, 26112, 26144, 26176, 26208, 26240, 26272, 26304, 26336, 26368, 26400, 26432, 26464, 26496, 26528, 26560, 26592, 26624, 26656, 26688, 26720, 26752, 26784, 26816, 26848, 26880, 26912, 26944, 26976, 27008, 27040, 27072, 27104, 27136, 27168, 27200, 27232, 27264, 27296, 27328, 27360, 27392, 27424, 27456, 27488, 27520, 27552, 27584, 27616, 27648, 27680, 27712, 27744, 27776, 27808, 27840, 27872, 27904, 27936, 27968, 28000, 28032, 28064, 28096, 28128, 28160, 28192, 28224, 28256, 28288, 28320, 28352, 28384, 28416, 28448, 28480, 28512, 28544, 28576, 28608, 28640, 28672, 28704, 28736, 28768, 28800, 28832, 28864, 28896, 28928, 28960, 28992, 29024, 29056, 29088, 29120, 29152, 29184, 29216, 29248, 29280, 29312, 29344, 29376, 29408, 29440, 29472, 29504, 29536, 29568, 29600, 29632, 29664, 29696, 29728, 29760, 29792, 29824, 29856, 29888, 29920, 29952, 29984, 30016, 30048, 30080, 30112, 30144, 30176, 30208, 30240, 30272, 30304, 30336, 30368, 30400, 30432, 30464, 30496, 30528, 30560, 30592, 30624, 30656, 30688, 30720, 30752, 30784, 30816, 30848, 30880, 30912, 30944, 30976, 31008, 31040, 31072, 31104, 31136, 31168, 31200, 31232, 31264, 31296, 31328, 31360, 31392, 31424, 31456, 31488, 31520, 31552, 31584, 31616, 31648, 31680, 31712, 31744, 31776, 31808, 31840, 31872, 31904, 31936, 31968, 32000, 32032, 32064, 32096, 32128, 32160, 32192, 32224, 32256, 32288, 32320, 32352, 32384, 32416, 32448, 32480, 32512, 32544, 32576, 32608, 32640, 32672, 32704, 32736, 32768, 32800, 32832, 32864, 32896, 32928, 32960, 32992, 33024, 33056, 33088, 33120, 33152, 33184, 33216, 33248, 33280, 33312, 33344, 33376, 33408, 33440, 33472, 33504, 33536, 33568, 33600, 33632, 33664, 33696, 33736, 33776, 33816, 33856, 33896, 33936, 33976, 34016, 34056, 34096, 34136, 34176, 34216, 34256, 34296, 34336, 34376, 34416, 34456, 34496, 34536, 34576, 34616, 34656, 34696, 34736, 34776, 34816, 34856, 34896, 34936, 34976, 35016, 35056, 35096, 35136, 35176, 35216, 35256, 35296, 35336, 35376, 35416, 35456, 35496, 35536, 35576, 35616, 35656, 35696, 35736, 35776, 35816, 35856, 35896, 35936, 35976, 36016, 36056, 36096, 36136, 36176, 36216, 36256, 36296, 36336, 36376, 36416, 36456, 36496, 36536, 36576, 36616, 36656, 36696, 36736, 36776, 36816, 36856, 36896, 36936, 36976, 37016, 37056, 37096, 37136, 37176, 37216, 37256, 37296, 37336, 37376, 37416, 37456, 37496, 37536, 37576, 37616, 37656, 37696, 37736, 37776, 37816, 37856, 37896, 37936, 37976, 38016, 38056, 38096, 38136, 38176, 38216, 38256, 38296, 38336, 38376, 38416, 38456, 38496, 38536, 38576, 38616, 38656, 38696, 38736, 38776, 38816, 38856, 38896, 38936, 38976, 39016, 39056, 39096, 39136, 39176, 39216, 39256, 39296, 39336, 39376, 39416, 39456, 39496, 39536, 39576, 39616, 39656, 39696, 39736, 39776, 39816, 39856, 39896, 39936, 39976, 40016, 40056, 40096, 40136, 40176, 40216, 40256, 40296, 40336, 40376, 40416, 40456, 40496, 40536, 40576, 40616, 40656, 40696, 40736, 40776, 40816, 40856, 40896, 40936, 40976, 41016, 41056, 41096, 41136, 41176, 41216, 41256, 41296, 41336, 41376, 41416, 41456, 41496, 41536, 41576, 41616, 41656, 41696, 41736, 41776, 41816, 41856, 41896, 41936, 41976, 42016, 42056, 42096, 42136

According to the Pseudo-code 5, the candidate values which are able to be TBS may include some or all of the values of TBS+$L_{TB,24}$ which is a multiple of 8 and a multiple of the number of C code blocks. Alternatively, according to the Pseudo-code 5, the candidate values which are able to be TBS may include some or all of the values of TBS+$L_{TB,24}$ which is a multiple of 8*C. In addition, it is also possible to determine the TBS among the values including some or all of the TBS candidate values in Table 12 above. The candidate values of the TBS may be TBS values per layer or TBS values corresponding to the entire layer.

Alternatively, it is possible to determine the TBS among the values including some or all of the TBS candidate values in Table 13 below. The candidate values of the TBS may be TBS values per layer or TBS values corresponding to the entire layer.

TABLE 13

16, 24, 32, 40, 48, 56, 64, 72, 80, 88, 96, 104, 112, 120, 128, 136, 144, 152, 160, 168, 176, 184, 192, 200, 208, 216, 224, 232, 240, 248, 256, 264, 272, 280, 288, 296, 304, 312, 320, 328, 336, 344, 352, 360, 368, 376, 384, 392, 400, 408, 416, 424, 432, 440, 448, 456, 464, 472, 480, 488, 496, 504, 512, 520, 528, 536, 544, 552, 560, 568, 576, 584, 592, 600, 608, 616, 624, 632, 640, 648, 656, 664, 672, 680, 688, 696, 704, 712, 720, 728, 736, 744, 752, 760, 768, 776, 784, 792, 800, 808, 816, 824, 832, 840, 848, 856, 864, 872, 880, 888, 896, 904, 912, 920, 928, 936, 944, 952, 960, 968, 976, 984, 992, 1000, 1008, 1016, 1024, 1032, 1040, 1048, 1056, 1064, 1072, 1080, 1088, 1096, 1104, 1112, 1120, 1128, 1136, 1144, 1152, 1160, 1168, 1176, 1184, 1192, 1200, 1208, 1216, 1224, 1232, 1240, 1248, 1256, 1264, 1272, 1280, 1288, 1296, 1304, 1312, 1320, 1328, 1336, 1344, 1352, 1360, 1368, 1376, 1384, 1392, 1400, 1408, 1416, 1424, 1432, 1440, 1448, 1456, 1464, 1472, 1480, 1488, 1496, 1504, 1512, 1520, 1528, 1536, 1544, 1552, 1560, 1568, 1576, 1584, 1592, 1600, 1608, 1616, 1624, 1632, 1640, 1648, 1656, 1664, 1672, 1680, 1688, 1696, 1704, 1712, 1720, 1728, 1736, 1744, 1752, 1760, 1768, 1776, 1784, 1792, 1800, 1808, 1816, 1824, 1832, 1840, 1848, 1856, 1864, 1872, 1880, 1888, 1896, 1904, 1912, 1920, 1928, 1936, 1944, 1952, 1960, 1968, 1976, 1984, 1992, 2000, 2008, 2016, 2024, 2032, 2040, 2048, 2056, 2064, 2072, 2080, 2088, 2096, 2104, 2112, 2120, 2128, 2136, 2144, 2152, 2160, 2168, 2176, 2184, 2192, 2200, 2208, 2216, 2224, 2232, 2240, 2248, 2256, 2264, 2272, 2280, 2288, 2296, 2304, 2312, 2320, 2328, 2336, 2344, 2352, 2360, 2368, 2376, 2384, 2392, 2400, 2408, 2416, 2424, 2432, 2440, 2448, 2456, 2464, 2472, 2480, 2488, 2496, 2504, 2512, 2520, 2528, 2536, 2544, 2552, 2560, 2568, 2576, 2584, 2592, 2600, 2608, 2616, 2624, 2632, 2640, 2648, 2656, 2664, 2672, 2680, 2688, 2696, 2704, 2712, 2720, 2728, 2736, 2744, 2752, 2760, 2768, 2776, 2784, 2792, 2800, 2808, 2816, 2824, 2832, 2840, 2848, 2856, 2864, 2872, 2880, 2888, 2896, 2904, 2912, 2920, 2928, 2936, 2944, 2952, 2960, 2968, 2976, 2984, 2992, 3000, 3008, 3016, 3024, 3032, 3040, 3048, 3056, 3064, 3072, 3080, 3088, 3096, 3104, 3112, 3120, 3128, 3136, 3144, 3152, 3160, 3168, 3176, 3184, 3192, 3200, 3208, 3216, 3224, 3232, 3240, 3248, 3256, 3264, 3272, 3280, 3288, 3296, 3304, 3312, 3320, 3328, 3336, 3344, 3352, 3360, 3368, 3376, 3384, 3392, 3400, 3408, 3416, 3424, 3432, 3440, 3448, 3456, 3464, 3472, 3480, 3488, 3496, 3504, 3512, 3520, 3528, 3536, 3544, 3552, 3560, 3568, 3576, 3584, 3592, 3600, 3608, 3616, 3624, 3632, 3640, 3648, 3656, 3664, 3672, 3680, 3688, 3696, 3704, 3712, 3720, 3728, 3736, 3744, 3752, 3760, 3768, 3776, 3784, 3792, 3800, 3808, 3816, 3824, 3832, 3840, 3848, 3856, 3864, 3872, 3880, 3888, 3896, 3904, 3912, 3920, 3928, 3936, 3944, 3952, 3960, 3968, 3976, 3984, 3992, 4000, 4008, 4016, 4024, 4032, 4040, 4048, 4056, 4064, 4072, 4080, 4088, 4096, 4104, 4112, 4120, 4128, 4136, 4144, 4152, 4160, 4168, 4176, 4184, 4192, 4200, 4208, 4216, 4224, 4232, 4240, 4248, 4256, 4264, 4272, 4280, 4288, 4296, 4304, 4312, 4320, 4328, 4336, 4344, 4352, 4360, 4368, 4376, 4384, 4392, 4400, 4408, 4416, 4424, 4432, 4440, 4448, 4456, 4464, 4472, 4480, 4488, 4496, 4504, 4512, 4520, 4528, 4536, 4544, 4552, 4560, 4568, 4576, 4584, 4592, 4600, 4608, 4616, 4624, 4632, 4640, 4648, 4656, 4664, 4672, 4680, 4688, 4696, 4704, 4712, 4720, 4728, 4736, 4744, 4752, 4760, 4768, 4776, 4784, 4792, 4800, 4808, 4816, 4824, 4832, 4840, 4848, 4856, 4864, 4872, 4880, 4888, 4896, 4904, 4912, 4920, 4928, 4936, 4944, 4952, 4960, 4968, 4976, 4984, 4992, 5000, 5008, 5016, 5024, 5032, 5040, 5048, 5056, 5064, 5072, 5080, 5088, 5096, 5104, 5112, 5120, 5128, 5136, 5144, 5152, 5160, 5168, 5176, 5184, 5192, 5200, 5208, 5216, 5224, 5232, 5240, 5248, 5256, 5264, 5272, 5280, 5288, 5296, 5304, 5312, 5320, 5328, 5336, 5344, 5352, 5360, 5368, 5376, 5384, 5392, 5400, 5408, 5416, 5424, 5432, 5440, 5448, 5456, 5464, 5472, 5480, 5488, 5496, 5504, 5512, 5520, 5528, 5536, 5544, 5552, 5560, 5568, 5576, 5584, 5592, 5600, 5608, 5616, 5624, 5632, 5640, 5648, 5656, 5664, 5672, 5680, 5688, 5696, 5704, 5712, 5720, 5728, 5736, 5744, 5752, 5760, 5768, 5776, 5784, 5792, 5800, 5808, 5816, 5824, 5832, 5840, 5848, 5856, 5864, 5872, 5880, 5888, 5896, 5904, 5912, 5920, 5928, 5936, 5944, 5952, 5960, 5968, 5976, 5984, 5992, 6000, 6008, 6016, 6024, 6032, 6040, 6048, 6056, 6064, 6072, 6080, 6088, 6096, 6104, 6112, 6120, 6128, 6136, 6144, 6152, 6160, 6168, 6176, 6184, 6192, 6200, 6208, 6216, 6224, 6232, 6240, 6248, 6256, 6264, 6272, 6280, 6288, 6296, 6304, 6312, 6320, 6328, 6336, 6344, 6352, 6360, 6368, 6376, 6384, 6392, 6400, 6408, 6416, 6424, 6432, 6440, 6448, 6456, 6464, 6472, 6480, 6488, 6496, 6504, 6512, 6520, 6528, 6536, 6544, 6552, 6560, 6568, 6576, 6584, 6592, 6600, 6608, 6616, 6624, 6632, 6640, 6648, 6656, 6664, 6672, 6680, 6688, 6696, 6704, 6712, 6720, 6728, 6736, 6744, 6752, 6760, 6768, 6776, 6784, 6792, 6800, 6808, 6816, 6824, 6832, 6840, 6848, 6856, 6864, 6872, 6880, 6888, 6896, 6904, 6912, 6920, 6928, 6936, 6944, 6952, 6960, 6968, 6976, 6984, 6992, 7000, 7008, 7016, 7024, 7032, 7040, 7048, 7056, 7064, 7072, 7080, 7088, 7096, 7104, 7112, 7120, 7128, 7136, 7144, 7152, 7160, 7168, 7176, 7184, 7192, 7200, 7208, 7216, 7224, 7232, 7240, 7248, 7256, 7264, 7272, 7280, 7288, 7296, 7304, 7312, 7320, 7328, 7336, 7344, 7352, 7360, 7368, 7376, 7384, 7392, 7400, 7408, 7416, 7424, 7432, 7440, 7448, 7456, 7464, 7472, 7480, 7488, 7496, 7504, 7512, 7520, 7528, 7536, 7544, 7552, 7560, 7568, 7576, 7584, 7592, 7600, 7608, 7616, 7624, 7632, 7640, 7648, 7656, 7664, 7672, 7680, 7688, 7696, 7704, 7712, 7720, 7728, 7736, 7744, 7752, 7760, 7768, 7776, 7784, 7792, 7800, 7808, 7816, 7824, 7832, 7840, 7848, 7856, 7864, 7872, 7880, 7888, 7896, 7904, 7912, 7920, 7928, 7936, 7944, 7952, 7960, 7968, 7976, 7984, 7992, 8000, 8008, 8016, 8024, 8032, 8040, 8048, 8056, 8064, 8072, 8080, 8088, 8096, 8104, 8112, 8120, 8128, 8136, 8144, 8152, 8160, 8168, 8176, 8184, 8192, 8200, 8208, 8216, 8224, 8232, 8240, 8248, 8256, 8264, 8272, 8280, 8288, 8296, 8304, 8312, 8320, 8328, 8336, 8344, 8352, 8360, 8368, 8376, 8384, 8392, 8400, 8408, 8416, 8424, 8432, 8440, 8456, 8472, 8488, 8504, 8520, 8536, 8552, 8568, 8584,

TABLE 13-continued 8600, 8616, 8632, 8648, 8664, 8680, 8696, 8712, 8728, 8744, 8760, 8776, 8792, 8808, 8824, 8840, 8856, 8872, 8888, 8904, 8920, 8936, 8952, 8968, 8984, 9000, 9016, 9032, 9048, 9064, 9080, 9096, 9112, 9128, 9144, 9160, 9176, 9192, 9208, 9224, 9240, 9256, 9272, 9288, 9304, 9320, 9336, 9352, 9368, 9384, 9400, 9416, 9432, 9448, 9464, 9480, 9496, 9512, 9528, 9544, 9560, 9576, 9592, 9608, 9624, 9640, 9656, 9672, 9688, 9704, 9720, 9736, 9752, 9768, 9784, 9800, 9816, 9832, 9848, 9864, 9880, 9896, 9912, 9928, 9944, 9960, 9976, 9992, 10008, 10024, 10040, 10056, 10072, 10088, 10104, 10120, 10136, 10152, 10168, 10184, 10200, 10216, 10232, 10248, 10264, 10280, 10296, 10312, 10328, 10344, 10360, 10376, 10392, 10408, 10424, 10440, 10456, 10472, 10488, 10504, 10520, 10536, 10552, 10568, 10584, 10600, 10616, 10632, 10648, 10664, 10680, 10696, 10712, 10728, 10744, 10760, 10776, 10792, 10808, 10824, 10840, 10856, 10872, 10888, 10904, 10920, 10936, 10952, 10968, 10984, 11000, 11016, 11032, 11048, 11064, 11080, 11096, 11112, 11128, 11144, 11160, 11176, 11192, 11208, 11224, 11240, 11256, 11272, 11288, 11304, 11320, 11336, 11352, 11368, 11384, 11400, 11416, 11432, 11448, 11464, 11480, 11496, 11512, 11528, 11544, 11560, 11576, 11592, 11608, 11624, 11640, 11656, 11672, 11688, 11704, 11720, 11736, 11752, 11768, 11784, 11800, 11816, 11832, 11848, 11864, 11880, 11896, 11912, 11928, 11944, 11960, 11976, 11992, 12008, 12024, 12040, 12056, 12072, 12088, 12104, 12120, 12136, 12152, 12168, 12184, 12200, 12216, 12232, 12248, 12264, 12280, 12296, 12312, 12328, 12344, 12360, 12376, 12392, 12408, 12424, 12440, 12456, 12472, 12488, 12504, 12520, 12536, 12552, 12568, 12584, 12600, 12616, 12632, 12648, 12664, 12680, 12696, 12712, 12728, 12744, 12760, 12776, 12792, 12808, 12824, 12840, 12856, 12872, 12888, 12904, 12920, 12936, 12952, 12968, 12984, 13000, 13016, 13032, 13048, 13064, 13080, 13096, 13112, 13128, 13144, 13160, 13176, 13192, 13208, 13224, 13240, 13256, 13272, 13288, 13304, 13320, 13336, 13352, 13368, 13384, 13400, 13416, 13432, 13448, 13464, 13480, 13496, 13512, 13528, 13544, 13560, 13576, 13592, 13608, 13624, 13640, 13656, 13672, 13688, 13704, 13720, 13736, 13752, 13768, 13784, 13800, 13816, 13832, 13848, 13864, 13880, 13896, 13912, 13928, 13944, 13960, 13976, 13992, 14008, 14024, 14040, 14056, 14072, 14088, 14104, 14120, 14136, 14152, 14168, 14184, 14200, 14216, 14232, 14248, 14264, 14280, 14296, 14312, 14328, 14344, 14360, 14376, 14392, 14408, 14424, 14440, 14456, 14472, 14488, 14504, 14520, 14536, 14552, 14568, 14584, 14600, 14616, 14632, 14648, 14664, 14680, 14696, 14712, 14728, 14744, 14760, 14776, 14792, 14808, 14824, 14840, 14856, 14872, 14888, 14904, 14920, 14936, 14952, 14968, 14984, 15000, 15016, 15032, 15048, 15064, 15080, 15096, 15112, 15128, 15144, 15160, 15176, 15192, 15208, 15224, 15240, 15256, 15272, 15288, 15304, 15320, 15336, 15352, 15368, 15384, 15400, 15416, 15432, 15448, 15464, 15480, 15496, 15512, 15528, 15544, 15560, 15576, 15592, 15608, 15624, 15640, 15656, 15672, 15688, 15704, 15720, 15736, 15752, 15768, 15784, 15800, 15816, 15832, 15848, 15864, 15880, 15896, 15912, 15928, 15944, 15960, 15976, 15992, 16008, 16024, 16040, 16056, 16072, 16088, 16104, 16120, 16136, 16152, 16168, 16184, 16200, 16216, 16232, 16248, 16264, 16280, 16296, 16312, 16328, 16344, 16360, 16376, 16392, 16408, 16424, 16440, 16456, 16472, 16488, 16504, 16520, 16536, 16552, 16568, 16584, 16600, 16616, 16632, 16648, 16664, 16680, 16696, 16712, 16728, 16744, 16760, 16776, 16792, 16808, 16824, 16840, 16848, 16872, 16896, 16920, 16944, 16968, 16992, 17016, 17040, 17064, 17088, 17112, 17136, 17160, 17184, 17208, 17232, 17256, 17280, 17304, 17328, 17352, 17376, 17400, 17424, 17448, 17472, 17496, 17520, 17544, 17568, 17592, 17616, 17640, 17664, 17688, 17712, 17736, 17760, 17784, 17808, 17832, 17856, 17880, 17904, 17928, 17952, 17976, 18000, 18024, 18048, 18072, 18096, 18120, 18144, 18168, 18192, 18216, 18240, 18264, 18288, 18312, 18336, 18360, 18384, 18408, 18432, 18456, 18480, 18504, 18528, 18552, 18576, 18600, 18624, 18648, 18672, 18696, 18720, 18744, 18768, 18792, 18816, 18840, 18864, 18888, 18912, 18936, 18960, 18984, 19008, 19032, 19056, 19080, 19104, 19128, 19152, 19176, 19200, 19224, 19248, 19272, 19296, 19320, 19344, 19368, 19392, 19416, 19440, 19464, 19488, 19512, 19536, 19560, 19584, 19608, 19632, 19656, 19680, 19704, 19728, 19752, 19776, 19800, 19824, 19848, 19872, 19896, 19920, 19944, 19968, 19992, 20016, 20040, 20064, 20088, 20112, 20136, 20160, 20184, 20208, 20232, 20256, 20280, 20304, 20328, 20352, 20376, 20400, 20424, 20448, 20472, 20496, 20520, 20544, 20568, 20592, 20616, 20640, 20664, 20688, 20712, 20736, 20760, 20784, 20808, 20832, 20856, 20880, 20904, 20928, 20952, 20976, 21000, 21024, 21048, 21072, 21096, 21120, 21144, 21168, 21192, 21216, 21240, 21264, 21288, 21312, 21336, 21360, 21384, 21408, 21432, 21456, 21480, 21504, 21528, 21552, 21576, 21600, 21624, 21648, 21672, 21696, 21720, 21744, 21768, 21792, 21816, 21840, 21864, 21888, 21912, 21936, 21960, 21984, 22008, 22032, 22056, 22080, 22104, 22128, 22152, 22176, 22200, 22224, 22248, 22272, 22296, 22320, 22344, 22368, 22392, 22416, 22440, 22464, 22488, 22512, 22536, 22560, 22584, 22608, 22632, 22656, 22680, 22704, 22728, 22752, 22776, 22800, 22824, 22848, 22872, 22896, 22920, 22944, 22968, 22992, 23016, 23040, 23064, 23088, 23112, 23136, 23160, 23184, 23208, 23232, 23256, 23280, 23304, 23328, 23352, 23376, 23400, 23424, 23448, 23472, 23496, 23520, 23544, 23568, 23592, 23616, 23640, 23664, 23688, 23712, 23736, 23760, 23784, 23808, 23832, 23856, 23880, 23904, 23928, 23952, 23976, 24000, 24024, 24048, 24072, 24096, 24120, 24144, 24168, 24192, 24216, 24240, 24264, 24288, 24312, 24336, 24360, 24384, 24408, 24432, 24456, 24480, 24504, 24528, 24552, 24576, 24600, 24624, 24648, 24672, 24696, 24720, 24744, 24768, 24792, 24816, 24840, 24864, 24888, 24912, 24936, 24960, 24984, 25008, 25032, 25056, 25080, 25104, 25128, 25152, 25176, 25200, 25224, 25248, 25272, 25288, 25320, 25352, 25384, 25416, 25448, 25480, 25512, 25544, 25576, 25608, 25640, 25672, 25704, 25736, 25768, 25800, 25832, 25864, 25896, 25928, 25960, 25992, 26024, 26056, 26088, 26120, 26152, 26184, 26216, 26248, 26280, 26312, 26344, 26376, 26408, 26440, 26472, 26504, 26536, 26568, 26600, 26632, 26664, 26696, 26728, 26760, 26792, 26824, 26856, 26888, 26920, 26952, 26984, 27016, 27048, 27080, 27112, 27144, 27176, 27208, 27240, 27272, 27304, 27336, 27368, 27400, 27432, 27464, 27496, 27528, 27560, 27592, 27624, 27656, 27688, 27720, 27752, 27784, 27816, 27848, 27880, 27912, 27944, 27976, 28008, 28040, 28072, 28104, 28136, 28168, 28200, 28232, 28264, 28296, 28328, 28360, 28392, 28424, 28456, 28488, 28520, 28552, 28584, 28616, 28648, 28680, 28712, 28744, 28776, 28808, 28840, 28872, 28904, 28936, 28968, 29000, 29032, 29064, 29096, 29128, 29160, 29192, 29224, 29256, 29288, 29320, 29352, 29384, 29416, 29448, 29480, 29512, 29544, 29576, 29608, 29640, 29672, 29704, 29736, 29768, 29800, 29832, 29864, 29896, 29928, 29960, 29992, 30024, 30056, 30088, 30120, 30152, 30184, 30216, 30248, 30280, 30312, 30344, 30376, 30408, 30440, 30472, 30504, 30536, 30568, 30600, 30632, 30664, 30696, 30728, 30760, 30792, 30824, 30856, 30888, 30920, 30952, 30984, 31016, 31048, 31080, 31112, 31144, TABLE 13-continued 31176, 31208, 31240, 31272, 31304, 31336, 31368, 31400, 31432, 31464, 31496, 31528, 31560,
31592, 31624, 31656, 31688, 31720, 31752, 31784, 31816, 31848, 31880, 31912, 31944, 31976,
32008, 32040, 32072, 32104, 32136, 32168, 32200, 32232, 32264, 32296, 32328, 32360, 32392,
32424, 32456, 32488, 32520, 32552, 32584, 32616, 32648, 32680, 32712, 32744, 32776, 32808,
32840, 32872, 32904, 32936, 32968, 33000, 33032, 33064, 33096, 33128, 33160, 33192, 33224,
33256, 33288, 33320, 33352, 33384, 33416, 33448, 33480, 33512, 33544, 33576, 33608, 33640,
33672, 33704, 33736, 33776, 33816, 33856, 33896, 33936, 33976, 34016, 34056, 34096, 34136,
34176, 34216, 34256, 34296, 34336, 34376, 34416, 34456, 34496, 34536, 34576, 34616, 34656,
34696, 34736, 34776, 34816, 34856, 34896, 34936, 34976, 35016, 35056, 35096, 35136, 35176,
35216, 35256, 35296, 35336, 35376, 35416, 35456, 35496, 35536, 35576, 35616, 35656, 35696,
35736, 35776, 35816, 35856, 35896, 35936, 35976, 36016, 36056, 36096, 36136, 36176, 36216,
36256, 36296, 36336, 36376, 36416, 36456, 36496, 36536, 36576, 36616, 36656, 36696, 36736,
36776, 36816, 36856, 36896, 36936, 36976, 37016, 37056, 37096, 37136, 37176, 37216, 37256,
37296, 37336, 37376, 37416, 37456, 37496, 37536, 37576, 37616, 37656, 37696, 37736, 37776,
37816, 37856, 37896, 37936, 37976, 38016, 38056, 38096, 38136, 38176, 38216, 38256, 38296,
38336, 38376, 38416, 38456, 38496, 38536, 38576, 38616, 38656, 38696, 38736, 38776, 38816,
38856, 38896, 38936, 38976, 39016, 39056, 39096, 39136, 39176, 39216, 39256, 39296, 39336,
39376, 39416, 39456, 39496, 39536, 39576, 39616, 39656, 39696, 39736, 39776, 39816, 39856,
39896, 39936, 39976, 40016, 40056, 40096, 40136, 40176, 40216, 40256, 40296, 40336, 40376,
40416, 40456, 40496, 40536, 40576, 40616, 40656, 40696, 40736, 40776, 40816, 40856, 40896,
40936, 40976, 41016, 41056, 41096, 41136, 41176, 41216, 41256, 41296, 41336, 41376, 41416,
41456, 41496, 41536, 41576, 41616, 41656, 41696, 41736, 41776, 41816, 41856, 41896, 41936,
41976, 42016, 42056, 42096, 42136, 42168, 42216, 42264, 42312, 42360, 42408, 42456, 42504,
42552, 42600, 42648, 42696, 42744, 42792, 42840, 42888, 42936, 42984, 43032, 43080, 43128,
43176, 43224, 43272, 43320, 43368, 43416, 43464, 43512, 43560, 43608, 43656, 43704, 43752,
43800, 43848, 43896, 43944, 43992, 44040, 44088, 44136, 44184, 44232, 44280, 44328, 44376,
44424, 44472, 44520, 44568, 44616, 44664, 44712, 44760, 44808, 44856, 44904, 44952, 45000,
45048, 45096, 45144, 45192, 45240, 45288, 45336, 45384, 45432, 45480, 45528, 45576, 45624,
45672, 45720, 45768, 45816, 45864, 45912, 45960, 46008, 46056, 46104, 46152, 46200, 46248,
46296, 46344, 46392, 46440, 46488, 46536, 46584, 46632, 46680, 46728, 46776, 46824, 46872,
46920, 46968, 47016, 47064, 47112, 47160, 47208, 47256, 47304, 47352, 47400, 47448, 47496,
47544, 47592, 47640, 47688, 47736, 47784, 47832, 47880, 47928, 47976, 48024, 48072, 48120,
48168, 48216, 48264, 48312, 48360, 48408, 48456, 48504, 48552, 48600, 48648, 48696, 48744,
48792, 48840, 48888, 48936, 48984, 49032, 49080, 49128, 49176, 49224, 49272, 49320, 49368,
49416, 49464, 49512, 49560, 49608, 49656, 49704, 49752, 49800, 49848, 49896, 49944, 49992,
50040, 50088, 50136, 50184, 50232, 50280, 50328, 50376, 50424, 50472, 50520, 50568, 50600,
50656, 50712, 50768, 50824, 50880, 50936, 50992, 51048, 51104, 51160, 51216, 51272, 51328,
51384, 51440, 51496, 51552, 51608, 51664, 51720, 51776, 51832, 51888, 51944, 52000, 52056,
52112, 52168, 52224, 52280, 52336, 52392, 52448, 52504, 52560, 52616, 52672, 52728, 52784,
52840, 52896, 52952, 53008, 53064, 53120, 53176, 53232, 53288, 53344, 53400, 53456, 53512,
53568, 53624, 53680, 53736, 53792, 53848, 53904, 53960, 54016, 54072, 54128, 54184, 54240,
54296, 54352, 54408, 54464, 54520, 54576, 54632, 54688, 54744, 54800, 54856, 54912, 54968,
55024, 55080, 55136, 55192, 55248, 55304, 55360, 55416, 55472, 55528, 55584, 55640, 55696,
55752, 55808, 55864, 55920, 55976, 56032, 56088, 56144, 56200, 56256, 56312, 56368, 56424,
56480, 56536, 56592, 56648, 56704, 56760, 56816, 56872, 56928, 56984, 57040, 57096, 57152,
57208, 57264, 57320, 57376, 57432, 57488, 57544, 57600, 57656, 57712, 57768, 57824, 57880,
57936, 57992, 58048, 58104, 58160, 58216, 58272, 58328, 58384, 58440, 58496, 58552, 58608,
58664, 58720, 58776, 58832, 58888, 58944, 59000, 59048, 59112, 59176, 59240, 59304, 59368,
59432, 59496, 59560, 59624, 59688, 59752, 59816, 59880, 59944, 60008, 60072, 60136, 60200,
60264, 60328, 60392, 60456, 60520, 60584, 60648, 60712, 60776, 60840, 60904, 60968, 61032,
61096, 61160, 61224, 61288, 61352, 61416, 61480, 61544, 61608, 61672, 61736, 61800, 61864,
61928, 61992, 62056, 62120, 62184, 62248, 62312, 62376, 62440, 62504, 62568, 62632, 62696,
62760, 62824, 62888, 62952, 63016, 63080, 63144, 63208, 63272, 63336, 63400, 63464, 63528,
63592, 63656, 63720, 63784, 63848, 63912, 63976, 64040, 64104, 64168, 64232, 64296, 64360,
64424, 64488, 64552, 64616, 64680, 64744, 64808, 64872, 64936, 65000, 65064, 65128, 65192,
65256, 65320, 65384, 65448, 65512, 65576, 65640, 65704, 65768, 65832, 65896, 65960, 66024,
66088, 66152, 66216, 66280, 66344, 66408, 66472, 66536, 66600, 66664, 66728, 66792, 66856,
66920, 66984, 67048, 67112, 67176, 67240, 67304, 67368, 67432, 67440, 67512, 67584, 67656,
67728, 67800, 67872, 67944, 68016, 68088, 68160, 68232, 68304, 68376, 68448, 68520, 68592,
68664, 68736, 68808, 68880, 68952, 69024, 69096, 69168, 69240, 69312, 69384, 69456, 69528,
69600, 69672, 69744, 69816, 69888, 69960, 70032, 70104, 70176, 70248, 70320, 70392, 70464,
70536, 70608, 70680, 70752, 70824, 70896, 70968, 71040, 71112, 71184, 71256, 71328, 71400,
71472, 71544, 71616, 71688, 71760, 71832, 71904, 71976, 72048, 72120, 72192, 72264, 72336,
72408, 72480, 72552, 72624, 72696, 72768, 72840, 72912, 72984, 73056, 73128, 73200, 73272,
73344, 73416, 73488, 73560, 73632, 73704, 73776, 73848, 73920, 73992, 74064, 74136, 74208,
74280, 74352, 74424, 74496, 74568, 74640, 74712, 74784, 74856, 74928, 75000, 75072, 75144,
75216, 75288, 75360, 75432, 75504, 75576, 75648, 75720, 75792, 75864, 75896, 75976, 76056,
76136, 76216, 76296, 76376, 76456, 76536, 76616, 76696, 76776, 76856, 76936, 77016, 77096,
77176, 77256, 77336, 77416, 77496, 77576, 77656, 77736, 77816, 77896, 77976, 78056, 78136,
78216, 78296, 78376, 78456, 78536, 78616, 78696, 78776, 78856, 78936, 79016, 79096, 79176,
79256, 79336, 79416, 79496, 79576, 79656, 79736, 79816, 79896, 79976, 80056, 80136, 80216,
80296, 80376, 80456, 80536, 80616, 80696, 80776, 80856, 80936, 81016, 81096, 81176, 81256,
81336, 81416, 81496, 81576, 81656, 81736, 81816, 81896, 81976, 82056, 82136, 82216, 82296,
82376, 82456, 82536, 82616, 82696, 82776, 82856, 82936, 83016, 83096, 83176, 83256, 83336,
83416, 83496, 83576, 83656, 83736, 83816, 83896, 83976, 84056, 84136, 84216, 84296, 84368,
84456, 84544, 84632, 84720, 84808, 84896, 84984, 85072, 85160, 85248, 85336, 85424, 85512,
85600, 85688, 85776, 85864, 85952, 86040, 86128, 86216, 86304, 86392, 86480, 86568, 86656,
86744, 86832, 86920, 87008, 87096, 87184, 87272, 87360, 87448, 87536, 87624, 87712, 87800,
87888, 87976, 88064, 88152, 88240, 88328, 88416, 88504, 88592, 88680, 88768, 88856, 88944,
89032, 89120, 89208, 89296, 89384, 89472, 89560, 89648, 89736, 89824, 89912, 90000, 90088, TABLE 13-continued 90176, 90264, 90352, 90440, 90528, 90616, 90704, 90792, 90880, 90968, 91056, 91144, 91232,
91320, 91408, 91496, 91584, 91672, 91760, 91848, 91936, 92024, 92112, 92200, 92288, 92376,
92464, 92552, 92640, 92728, 92808, 92904, 93000, 93096, 93192, 93288, 93384, 93480, 93576,
93672, 93768, 93864, 93960, 94056, 94152, 94248, 94344, 94440, 94536, 94632, 94728, 94824,
94920, 95016, 95112, 95208, 95304, 95400, 95496, 95592, 95688, 95784, 95880, 95976, 96072,
96168, 96264, 96360, 96456, 96552, 96648, 96744, 96840, 96936, 97032, 97128, 97224, 97320,
97416, 97512, 97608, 97704, 97800, 97896, 97992, 98088, 98184, 98280, 98376, 98472, 98568,
98664, 98760, 98856, 98952, 99048, 99144, 99240, 99336, 99432, 99528, 99624, 99720, 99816,
99912, 100008, 100104, 100200, 100296, 100392, 100488, 100584, 100680, 100776, 100872,
100968, 101064, 101160, 101168, 101272, 101376, 101480, 101584, 101688, 101792, 101896,
102000, 102104, 102208, 102312, 102416, 102520, 102624, 102728, 102832, 102936, 103040,
103144, 103248, 103352, 103456, 103560, 103664, 103768, 103872, 103976, 104080, 104184,
104288, 104392, 104496, 104600, 104704, 104808, 104912, 105016, 105120, 105224, 105328,
105432, 105536, 105640, 105744, 105848, 105952, 106056, 106160, 106264, 106368, 106472,
106576, 106680, 106784, 106888, 106992, 107096, 107200, 107304, 107408, 107512, 107616,
107720, 107824, 107928, 108032, 108136, 108240, 108344, 108448, 108552, 108656, 108760,
108864, 108968, 109072, 109176, 109280, 109384, 109488, 109592, 109624, 109736, 109848,
109960, 110072, 110184, 110296, 110408, 110520, 110632, 110744, 110856, 110968, 111080,
111192, 111304, 111416, 111528, 111640, 111752, 111864, 111976, 112088, 112200, 112312,
112424, 112536, 112648, 112760, 112872, 112984, 113096, 113208, 113320, 113432, 113544,
113656, 113768, 113880, 113992, 114104, 114216, 114328, 114440, 114552, 114664, 114776,
114888, 115000, 115112, 115224, 115336, 115448, 115560, 115672, 115784, 115896, 116008,
116120, 116232, 116344, 116456, 116568, 116680, 116792, 116904, 117016, 117128, 117240,
117352, 117464, 117576, 117688, 117800, 117912, 118024, 118056, 118176, 118296, 118416,
118536, 118656, 118776, 118896, 119016, 119136, 119256, 119376, 119496, 119616, 119736,
119856, 119976, 120096, 120216, 120336, 120456, 120576, 120696, 120816, 120936, 121056,
121176, 121296, 121416, 121536, 121656, 121776, 121896, 122016, 122136, 122256, 122376,
122496, 122616, 122736, 122856, 122976, 123096, 123216, 123336, 123456, 123576, 123696,
123816, 123936, 124056, 124176, 124296, 124416, 124536, 124656, 124776, 124896, 125016,
125136, 125256, 125376, 125496, 125616, 125736, 125856, 125976, 126096, 126216, 126336,
126456, 126568, 126696, 126824, 126952, 127080, 127208, 127336, 127464, 127592, 127720,
127848, 127976, 128104, 128232, 128360, 128488, 128616, 128744, 128872, 129000, 129128,
129256, 129384, 129512, 129640, 129768, 129896, 130024, 130152, 130280, 130408, 130536,
130664, 130792, 130920, 131048, 131176, 131304, 131432, 131560, 131688, 131816, 131944,
132072, 132200, 132328, 132456, 132584, 132712, 132840, 132968, 133096, 133224, 133352,
133480, 133608, 133736, 133864, 133992, 134120, 134248, 134376, 134504, 134632, 134760,
134888, 135024, 135160, 135296, 135432, 135568, 135704, 135840, 135976, 136112, 136248,
136384, 136520, 136656, 136792, 136928, 137064, 137200, 137336, 137472, 137608, 137744,
137880, 138016, 138152, 138288, 138424, 138560, 138696, 138832, 138968, 139104, 139240,
139376, 139512, 139648, 139784, 139920, 140056, 140192, 140328, 140464, 140600, 140736,
140872, 141008, 141144, 141280, 141416, 141552, 141688, 141824, 141960, 142096, 142232,
142368, 142504, 142640, 142776, 142912, 143048, 143184, 143320, 143400, 143544, 143688,
143832, 143976, 144120, 144264, 144408, 144552, 144696, 144840, 144984, 145128, 145272,
145416, 145560, 145704, 145848, 145992, 146136, 146280, 146424, 146568, 146712, 146856,
147000, 147144, 147288, 147432, 147576, 147720, 147864, 148008, 148152, 148296, 148440,
148584, 148728, 148872, 149016, 149160, 149304, 149448, 149592, 149736, 149880, 150024,
150168, 150312, 150456, 150600, 150744, 150888, 151032, 151176, 151320, 151464, 151608,
151752, 151824, 151976, 152128, 152280, 152432, 152584, 152736, 152888, 153040, 153192,
153344, 153496, 153648, 153800, 153952, 154104, 154256, 154408, 154560, 154712, 154864,
155016, 155168, 155320, 155472, 155624, 155776, 155928, 156080, 156232, 156384, 156536,
156688, 156840, 156992, 157144, 157296, 157448, 157600, 157752, 157904, 158056, 158208,
158360, 158512, 158664, 158816, 158968, 159120, 159272, 159424, 159576, 159728, 159880,
160032, 160184, 160296, 160456, 160616, 160776, 160936, 161096, 161256, 161416, 161576,
161736, 161896, 162056, 162216, 162376, 162536, 162696, 162856, 163016, 163176, 163336,
163496, 163656, 163816, 163976, 164136, 164296, 164456, 164616, 164776, 164936, 165096,
165256, 165416, 165576, 165736, 165896, 166056, 166216, 166376, 166536, 166696, 166856,
167016, 167176, 167336, 167496, 167656, 167816, 167976, 168136, 168296, 168456, 168616,
168648, 168816, 168984, 169152, 169320, 169488, 169656, 169824, 169992, 170160, 170328,
170496, 170664, 170832, 171000, 171168, 171336, 171504, 171672, 171840, 172008, 172176,
172344, 172512, 172680, 172848, 173016, 173184, 173352, 173520, 173688, 173856, 174024,
174192, 174360, 174528, 174696, 174864, 175032, 175200, 175368, 175536, 175704, 175872,
176040, 176208, 176376, 176544, 176712, 176880, 177048, 177208, 177384, 177560, 177736,
177912, 178088, 178264, 178440, 178616, 178792, 178968, 179144, 179320, 179496, 179672,
179848, 180024, 180200, 180376, 180552, 180728, 180904, 181080, 181256, 181432, 181608,
181784, 181960, 182136, 182312, 182488, 182664, 182840, 183016, 183192, 183368, 183544,
183720, 183896, 184072, 184248, 184424, 184600, 184776, 184952, 185128, 185304, 185480,
185632, 185816, 186000, 186184, 186368, 186552, 186736, 186920, 187104, 187288, 187472,
187656, 187840, 188024, 188208, 188392, 188576, 188760, 188944, 189128, 189312, 189496,
189680, 189864, 190048, 190232, 190416, 190600, 190784, 190968, 191152, 191336, 191520,
191704, 191888, 192072, 192256, 192440, 192624, 192808, 192992, 193176, 193360, 193544,
193728, 193912, 194088, 194280, 194472, 194664, 194856, 195048, 195240, 195432, 195624,
195816, 196008, 196200, 196392, 196584, 196776, 196968, 197160, 197352, 197544, 197736,
197928, 198120, 198312, 198504, 198696, 198888, 199080, 199272, 199464, 199656, 199848,
200040, 200232, 200424, 200616, 200808, 201000, 201192, 201384, 201576, 201768, 201960,
202152, 202344, 202376, 202576, 202776, 202976, 203176, 203376, 203576, 203776, 203976,
204176, 204376, 204576, 204776, 204976, 205176, 205376, 205576, 205776, 205976, 206176,
206376, 206576, 206776, 206976, 207176, 207376, 207576, 207776, 207976, 208176, 208376,
208576, 208776, 208976, 209176, 209376, 209576, 209776, 209976, 210176, 210376, 210576,
210776, 210888, 211096, 211304, 211512, 211720, 211928, 212136, 212344, 212552, 212760,
212968, 213176, 213384, 213592, 213800, 214008, 214216, 214424, 214632, 214840, 215048, TABLE 13-continued 215256, 215464, 215672, 215880, 216088, 216296, 216504, 216712, 216920, 217128, 217336,
217544, 217752, 217960, 218168, 218376, 218584, 218792, 219000, 219208, 219216, 219432,
219648, 219864, 220080, 220296, 220512, 220728, 220944, 221160, 221376, 221592, 221808,
222024, 222240, 222456, 222672, 222888, 223104, 223320, 223536, 223752, 223968, 224184,
224400, 224616, 224832, 225048, 225264, 225480, 225696, 225912, 226128, 226344, 226560,
226776, 226992, 227208, 227424, 227640, 227784, 228008, 228232, 228456, 228680, 228904,
229128, 229352, 229576, 229800, 230024, 230248, 230472, 230696, 230920, 231144, 231368,
231592, 231816, 232040, 232264, 232488, 232712, 232936, 233160, 233384, 233608, 233832,
234056, 234280, 234504, 234728, 234952, 235176, 235400, 235624, 235848, 236072, 236152,
236384, 236616, 236848, 237080, 237312, 237544, 237776, 238008, 238240, 238472, 238704,
238936, 239168, 239400, 239632, 239864, 240096, 240328, 240560, 240792, 241024, 241256,
241488, 241720, 241952, 242184, 242416, 242648, 242880, 243112, 243344, 243576, 243808,
244040, 244272, 244504, 244736, 244776, 245016, 245256, 245496, 245736, 245976, 246216,
246456, 246696, 246936, 247176, 247416, 247656, 247896, 248136, 248376, 248616, 248856,
249096, 249336, 249576, 249816, 250056, 250296, 250536, 250776, 251016, 251256, 251496,
251736, 251976, 252216, 252456, 252696, 252936, 253184, 253432, 253680, 253928, 254176,
254424, 254672, 254920, 255168, 255416, 255664, 255912, 256160, 256408, 256656, 256904,
257152, 257400, 257648, 257896, 258144, 258392, 258640, 258888, 259136, 259384, 259632,
259880, 260128, 260376, 260624, 260872, 261120, 261368, 261608, 261864, 262120, 262376,
262632, 262888, 263144, 263400, 263656, 263912, 264168, 264424, 264680, 264936, 265192,
265448, 265704, 265960, 266216, 266472, 266728, 266984, 267240, 267496, 267752, 268008,
268264, 268520, 268776, 269032, 269288, 269544, 269800, 270048, 270312, 270576, 270840,
271104, 271368, 271632, 271896, 272160, 272424, 272688, 272952, 273216, 273480, 273744,
274008, 274272, 274536, 274800, 275064, 275328, 275592, 275856, 276120, 276384, 276648,
276912, 277176, 277440, 277704, 277968, 278232, 278504, 278776, 279048, 279320, 279592,
279864, 280136, 280408, 280680, 280952, 281224, 281496, 281768, 282040, 282312, 282584,
282856, 283128, 283400, 283672, 283944, 284216, 284488, 284760, 285032, 285304, 285576,
285848, 286120, 286392, 286664, 286696, 286976, 287256, 287536, 287816, 288096, 288376,
288656, 288936, 289216, 289496, 289776, 290056, 290336, 290616, 290896, 291176, 291456,
291736, 292016, 292296, 292576, 292856, 293136, 293416, 293696, 293976, 294256, 294536,
294816, 295096, 295176, 295464, 295752, 296040, 296328, 296616, 296904, 297192, 297480,
297768, 298056, 298344, 298632, 298920, 299208, 299496, 299784, 300072, 300360, 300648,
300936, 301224, 301512, 301800, 302088, 302376, 302664, 302952, 303240, 303528, 303672,
303968, 304264, 304560, 304856, 305152, 305448, 305744, 306040, 306336, 306632, 306928,
307224, 307520, 307816, 308112, 308408, 308704, 309000, 309296, 309592, 309888, 310184,
310480, 310776, 311072, 311368, 311664, 311960, 312184, 312488, 312792, 313096, 313400,
313704, 314008, 314312, 314616, 314920, 315224, 315528, 315832, 316136, 316440, 316744,
317048, 317352, 317656, 317960, 318264, 318568, 318872, 319176, 319480, 319784, 320088,
320392, 320400, 320712, 321024, 321336, 321648, 321960, 322272, 322584, 322896, 323208,
323520, 323832, 324144, 324456, 324768, 325080, 325392, 325704, 326016, 326328, 326640,
326952, 327264, 327576, 327888, 328200, 328512, 328824, 328936, 329256, 329576, 329896,
330216, 330536, 330856, 331176, 331496, 331816, 332136, 332456, 332776, 333096, 333416,
333736, 334056, 334376, 334696, 335016, 335336, 335656, 335976, 336296, 336616, 336936,
337256, 337488, 337816, 338144, 338472, 338800, 339128, 339456, 339784, 340112, 340440,
340768, 341096, 341424, 341752, 342080, 342408, 342736, 343064, 343392, 343720, 344048,
344376, 344704, 345032, 345360, 345688, 345720, 346056, 346392, 346728, 347064, 347400,
347736, 348072, 348408, 348744, 349080, 349416, 349752, 350088, 350424, 350760, 351096,
351432, 351768, 352104, 352440, 352776, 353112, 353448, 353784, 354120, 354296, 354640,
354984, 355328, 355672, 356016, 356360, 356704, 357048, 357392, 357736, 358080, 358424,
358768, 359112, 359456, 359800, 360144, 360488, 360832, 361176, 361520, 361864, 362208,
362552, 362888, 363240, 363592, 363944, 364296, 364648, 365000, 365352, 365704, 366056,
366408, 366760, 367112, 367464, 367816, 368168, 368520, 368872, 369224, 369576, 369928,
370280, 370632, 370984, 371136, 371496, 371856, 372216, 372576, 372936, 373296, 373656,
374016, 374376, 374736, 375096, 375456, 375816, 376176, 376536, 376896, 377256, 377616,
377976, 378336, 378696, 379056, 379416, 379752, 380120, 380488, 380856, 381224, 381592,
381960, 382328, 382696, 383064, 383432, 383800, 384168, 384536, 384904, 385272, 385640,
386008, 386376, 386744, 387112, 387480, 387848, 388008, 388384, 388760, 389136, 389512,
389888, 390264, 390640, 391016, 391392, 391768, 392144, 392520, 392896, 393272, 393648,
394024, 394400, 394776, 395152, 395528, 395904, 396280, 396648, 397032, 397416, 397800,
398184, 398568, 398952, 399336, 399720, 400104, 400488, 400872, 401256, 401640, 402024,
402408, 402792, 403176, 403560, 403944, 404328, 404712, 404912, 405304, 405696, 406088,
406480, 406872, 407264, 407656, 408048, 408440, 408832, 409224, 409616, 410008, 410400,
410792, 411184, 411576, 411968, 412360, 412752, 413144, 413176, 413576, 413976, 414376,
414776, 415176, 415576, 415976, 416376, 416776, 417176, 417576, 417976, 418376, 418776,
419176, 419576, 419976, 420376, 420776, 421176, 421576

The values which are able to be the TBS are not limited to TBS values determined in Table 8, Table 9, Table 10, Table 11, Table 12, and Table 13 above, and special TBS values may be added for another purpose. That is, the values which are able to be the TBS may include values determined in Table 8, Table 9, Table 10, Table 11, Table 12, or Table 13 above, and the values which are able to be the TBS may be referred to as a TBS candidate set.

In addition, if the temporary TBS value per layer calculated in step 1 is 2000, 1992, which is the largest value among values less than 2000, is selected as the final TBS per layer. This may be the purpose of the base station to secure an actual coding rate less than or equal to a target coding rate.

As another example, step 2 may be omitted.

In another example, step 2 may be a step of making the temporary TBS value per layer obtained in step 1 be a multiple of a certain integer. For example, the final TBS value may be determined as N×ceil (temporary TBS/N per layer) or N×floor (temporary TBS/N per layer) to make the temporary TBS value per layer be a multiple of N. In the above, ceil(X) and floor(X) may indicate a minimum integer greater than X and a maximum integer less than X, respectively. In the above, N may be fixed to an integer such as 8. The N may be determined by considering the case where data transmitted from the higher layer such as MAC or RRC is transmitted in multiples of N.

In step 3, the final TBS may be obtained by multiplying the final TBS per layer selected in step 2 by the number of layers.

In the above, the TBS candidate set may vary in an element, a maximum value, and the like depending on a system frequency band, a subcarrier spacing, and the number of OFDM symbols per slot. In addition, the TBS candidate set may be promised in advance by the base station and the terminal, or can be set as the higher signaling for data transmission.

In the above description, the final TBS is obtained by multiplying the number of calculated TBSs per layer and the number of layers. However, such a process may adopt a process of approximating the TBS to the value which is able to be the TBS in a step B, after calculating the TBS considering the number of layers in a step A. Step A may be calculated as follows:

Temporary TBS value=MCS order×Coding rate×Number of allocated REs that are able to be used for data transmission×Number of layers to be used for transmission Alternatively, Temporary TBS value per layer=Value indicated in the MCS table×Number of allocated REs that are able to be used for data transmission×Number of layers to be used for transmission That is, the base station may calculate the temporary TBS by additionally considering the number of layers in the calculation of the step 1.

Step B may be similar to step 2, as the process of obtaining the final TBS by considering the TBS candidate set from the TBS value obtained in step A.

Embodiment 5

Embodiment 5 provides a method for performing channel coding by segmenting uplink control information into two or more blocks and transmitting the channel coding. In the present embodiment, uplink control information (UCI) may include channel measurement information, HARQ-ACK/NACK information, scheduling request bits, and the like.

When there are N bits of the UCI, the UCI may be segmented into two or more blocks if the UCI is greater than N_max−L. In the above, N_max is a unit in which channel coding such as a polar code is performed, and may be regarded as a maximum length of a channel coding block. That is, N_max may be a maximum value of information bits that may be included in one code block in the polar code. In the above, L may be a length of a CRC check bit for checking whether the information is correct when performing channel code decoding using the polar code, etc. For example, L may be a value of 16, 19, or the like. If the number of code blocks used for channel coding of the UCI is C, C may be obtained as follows:

$$C = \left\lceil \frac{N}{N\_max - L} \right\rceil$$

The $\lceil x \rceil$ operation is a function corresponding to the smallest integer that is greater than or equal to a real number x in the rounding operation for x. C+ code blocks of the C code blocks each includes the UCI of the $$\left\lceil \frac{N}{C} \right\rceil$$

bit, and the C− code blocks each includes the UCI of the $$\left\lfloor \frac{N}{C} \right\rfloor$$

bit. In the above, C+ may be obtained as $$N - \left(\left\lfloor \frac{N}{C} \right\rfloor \times C\right).$$

Also, C− may be obtained as C−C+.

For example, assuming that the number of UCI bits to be transmitted by the terminal is 1024 bits, the length of the maximum code block taken by the polar code is 512 and the length of the CRC is 16 bits, C may be determined as $$C = \left\lceil \frac{1024}{512 - 16} \right\rceil = 3.$$

Also, C+ is $$1024 - \left(\left\lfloor \frac{1024}{3} \right\rfloor \times 3\right) = 1$$

and C− is 3−1=2. That is, a total of 1024 UCIs are segmented into 3 code blocks, one code block thereof may include $$\left\lceil \frac{1024}{3} \right\rceil = 342$$

bits in the UCI, and the remaining 2 code blocks may be segmented to include 341 bits of each UCI.

Figure 9:
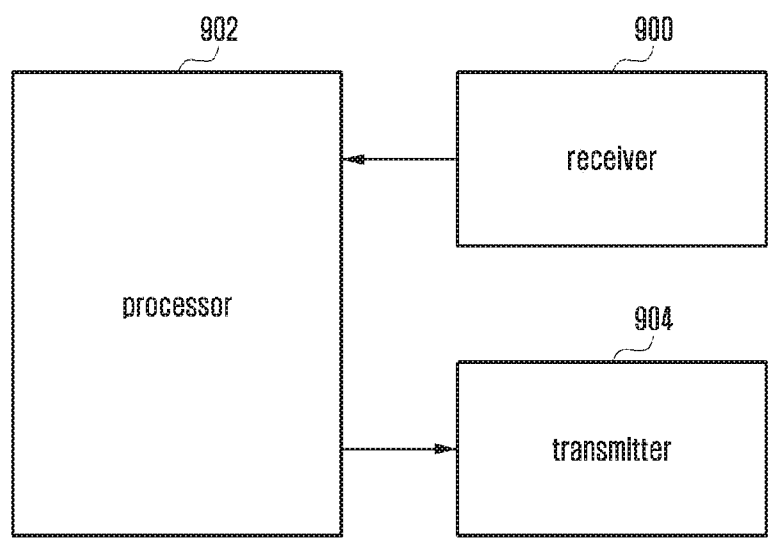
FIG. 9 is a block diagram of a structure of a terminal according to an embodiment.

FIG. 9 is a block diagram illustrating a structure of a terminal according to an embodiment.

Referring to FIG. 9, the terminal according to the embodiment of the present disclosure may include a receiver 900, a transmitter 904, and a processor 902. The receiver 900 and the transmitter 904 are collectively referred to as a transceiver. The transceiver may transmit/receive a signal to/from a base station. The signal may include downlink control information and data. To this end, the transceiver may include an RF transmitter that up-converts and amplifies a frequency of the transmitted signal, an RF receiver that low-noise-amplifies the received signal and down-converts the frequency, or the like. Further, the transceiver may receive a signal through a radio channel and output the received signal to the processor 902 and transmit the signal output from the processor 902 on the radio channel.

The processor 902 may control a series process to operate the terminal according to the embodiment of the present disclosure as described above.

In addition, the processor 902 may be referred to as a controller. In the present disclosure, the controller may be defined as a circuit, an application specific integrated circuit, or at least one processor.

The controller may control the overall operation of the terminal according to an embodiment of the present disclosure. For example, the controller may control a signal flow between each block to perform the operation according to the above-described flowchart.

Figure 10:
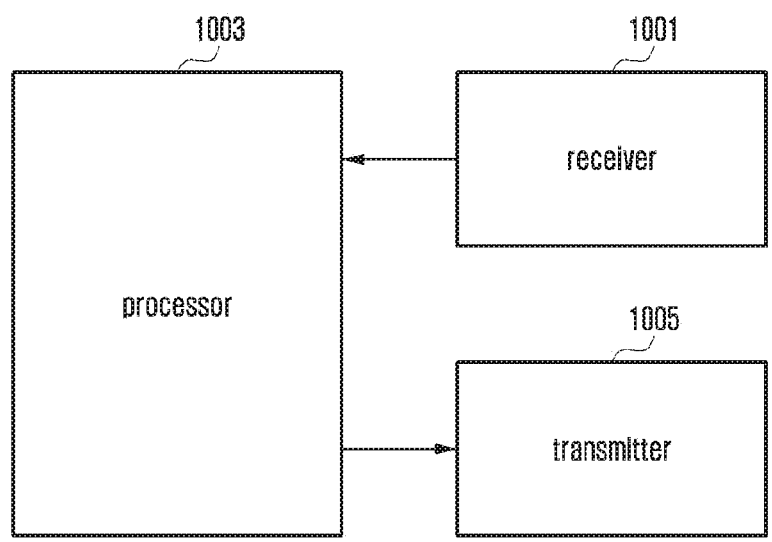
FIG. 10 is a block diagram of a structure of a base station according to an embodiment.

FIG. 10 is a block diagram illustrating a structure of a base station according to an embodiment.

Referring to FIG. 10, the base station may include at least one of a receiver 1001, a transmitter 1005, and a processor 1003. The receiver 1001 and the transmitter 1005 are collectively referred to as a transceiver in an embodiment of the present disclosure. The transceiver may transmit/receive a signal to/from a terminal. The signal may include downlink control information and data. To this end, the transceiver may include an RF transmitter that up-converts and amplifies a frequency of the transmitted signal, an RF receiver that low-noise-amplifies the received signal and down-converts the frequency, or the like. Further, the transceiver may receive a signal on a radio channel and output the received signal to the processor 1003 and transmit the signal output from the processor 1003 on the radio channel.

The processor 1003 may control a series process so that the base station may be operated according to an embodiment of the present disclosure as described above.

The processor 1003 may be referred to as a controller. In the present disclosure, the controller may be defined as a circuit, an application specific integrated circuit, or at least one processor.

The controller may control the overall operation of the terminal according to an embodiment of the present disclosure. For example, the controller may control a signal flow between each block to perform the operation according to the above-described flowchart.

The embodiments of the present disclosure and the accompanying drawings have been provided only as examples in order to assist in understanding the present disclosure and are not intended to limit the scope of the present disclosure. That is, it is obvious to those skilled in the art to which the present disclosure pertains that other examples based on the present disclosure may be made without departing from the scope of the present disclosure. Further, each embodiment may be combined and operated as needed. For example, some of the first to fifth embodiments of the present disclosure may be combined to operate a base station and a terminal. In addition, although the above embodiments are presented based on the NR system, other modifications based on the present disclosure may be applicable to other systems such as the FDD or TDD LTE systems.

In addition, in the accompanying drawings illustrating the method of the present disclosure, the order of description may not necessarily correspond to the order of execution, and the posterior relationship may be changed or executed in parallel.

Alternatively, in the accompanying drawings illustrating the method of the present disclosure, some of the elements may be omitted and only some of the elements may be included without impairing the present disclosure.

In addition, in the method of the present disclosure, some or all of the contents included in each embodiment may be combined and executed without departing from the scope of the present disclosure.

In addition, although the embodiments of the present disclosure are illustrated in the present disclosure and the accompanying drawings and certain terms are used, they are used in a general sense in order to assist in the understanding of the present disclosure and are not intended to limit the scope of the present disclosure. It is obvious to those skilled in the art to which the present disclosure pertains that various modifications may be made without departing from the scope of the present disclosure as defined by the appended claims and their equivalents.

What is claimed is:

1. A method performed by a base station in a wireless communication system, the method comprising:
   identifying a code rate and a size of a transport block;
   selecting one of a first base matrix or a second base matrix as a base matrix based on the size of the transport block and the code rate;
   encoding one or more code blocks corresponding to the transport block based on a parity check matrix, the parity check matrix being determined based on the selected base matrix and a block size (Z);
   transmitting, to a terminal, a modulation and coding scheme (MCS) index indicating the code rate; and
   transmitting, to the terminal, the encoded one or more code blocks,
   wherein the second base matrix is selected, in case that the code rate is less than or equal to a first threshold of 0.67 and the size of the transport block is less than or equal to a second threshold,
   wherein the first base matrix is selected, in case that the code rate is greater than the first threshold and the size of the transport block is greater than the second threshold, and
   wherein the block size (Z) is determined based on a minimum value among Z values that satisfy Kb*Z>=B'/C in sets of block sizes, B' indicating a length of input bits including bits corresponding to the transport block and cyclic redundancy check (CRC) bits, C indicating a number of the code blocks, and Kb indicating 22 in case that the first base matrix is selected as the base matrix.

2. The method of claim 1, wherein in case that the size of the transport block is greater than a predetermined value, a 24-bit cyclic redundancy check (CRC) is used for the transport block, and
   wherein in case that the size of the transport block is less than or equal to the predetermined value, a 16-bit cyclic redundancy check (CRC) is used for the transport block.

3. The method of claim 1,
   wherein the number of code blocks is determined based on a maximum code block size corresponding to the base matrix,
   wherein a maximum code block size for the first base matrix is 8448, and
   wherein a maximum code block size for the second base matrix is 3840.

4. A method performed by a terminal in a wireless communication system, the method comprising:
   receiving, from a base station, a modulation and coding scheme (MCS) index indicating a code rate;
   receiving, from the base station, data including a transport block;
   identifying the code rate and a size of the transport block;
   selecting one of a first base matrix or a second base matrix as a base matrix based on the size of the transport block and the code rate; and decoding the received data based on a parity check matrix, the parity check matrix being determined based on the selected base matrix and a block size (Z), wherein the second base matrix is selected, in case that the code rate is less than or equal to a first threshold of 0.67 and the size of the transport block is less than or equal to a second threshold, wherein the first base matrix is selected, in case that the code rate is greater than the first threshold and the size of the transport block is greater than the second threshold, and wherein the block size (Z) is determined based on a minimum value among Z values that satisfy Kb*Z>=B'/C in sets of block sizes, B' indicating a length of input bits including bits corresponding to the transport block and cyclic redundancy check (CRC) bits, C indicating a number of the code blocks, and Kb indicating 22 in case that the first base matrix is selected as the base matrix.

5. The method of claim 4, wherein in case that the size of the transport block is greater than a predetermined value, a 24-bit cyclic redundancy check (CRC) is used for the transport block, and wherein in case that the size of the transport block is less than or equal to the predetermined value, a 16-bit cyclic redundancy check (CRC) is used for the transport block.

6. The method of claim 4,
wherein the number of code blocks is determined based on a maximum code block size corresponding to the base matrix,
wherein a maximum code block size for the first base matrix is 8448, and
wherein a maximum code block size for the second base matrix is 3840.

7. A base station in a wireless communication system, the base station comprising:
a transceiver; and
a controller coupled with the transceiver and configured to:
identify a code rate and a size of a transport block;
select one of a first base matrix or a second base matrix as a base matrix based on the size of the transport block and the code rate;
encode one or more code blocks corresponding to the transport block based on a parity check matrix, the parity check matrix being determined based on the selected base matrix and a block size (Z);
transmit, to a terminal, a modulation and coding scheme (MCS) index indicating the code rate; and
transmit, to the terminal, the encoded one or more code blocks,
wherein the second base matrix is selected, in case that the code rate is less than or equal to a first threshold of 0.67 and the size of the transport block is less than or equal to a second threshold,
wherein the first base matrix is selected, in case that the code rate is greater than the first threshold and the size of the transport block is greater than the second threshold, and
wherein the block size (Z) is determined based on a minimum value among Z values that satisfy Kb*Z>=B'/C in sets of block sizes, B' indicating a length of input bits including bits corresponding to the transport block and cyclic redundancy check (CRC) bits, C indicating a number of the code blocks, and Kb indicating 22 in case that the first base matrix is selected as the base matrix.

8. The base station of claim 7, wherein in case that the size of the transport block is greater than a predetermined value, a 24-bit cyclic redundancy check (CRC) is used for the transport block, and wherein in case that the size of the transport block is less than or equal to the predetermined value, a 16-bit cyclic redundancy check (CRC) is used for the transport block.

9. The base station of claim 7,
wherein the number of code blocks is determined based on a maximum code block size corresponding to the base matrix,
wherein a maximum code block size for the first base matrix is 8448, and
wherein a maximum code block size for the second base matrix is 3840.

10. A terminal in a wireless communication system, the terminal comprising:
a transceiver; and
a controller coupled with the transceiver and configured to:
receive, from a base station, a modulation and coding scheme (MCS) index indicating a code rate;
receive, from the base station, data including a transport block;
identify the code rate and a size of the transport block;
select one of a first base matrix or a second base matrix as a base matrix based on the size of the transport block and the code rate; and
decode the received data based on a parity check matrix, the parity check matrix being determined based on the selected base matrix and a block size (Z),
wherein the second base matrix is selected, in case that the code rate is less than or equal to a first threshold of 0.67 and the size of the transport block is less than or equal to a second threshold,
wherein the first base matrix is selected, in case that the code rate is greater than the first threshold and the size of the transport block is greater than the second threshold, and
wherein the block size (Z) is determined based on a minimum value among Z values that satisfy Kb*Z>=B'/C in sets of block sizes, B' indicating a length of input bits including bits corresponding to the transport block and cyclic redundancy check (CRC) bits, C indicating a number of the code blocks, and Kb indicating 22 in case that the first base matrix is selected as the base matrix.

11. The terminal of claim 10, wherein in case that the size of the transport block is greater than a predetermined value, a 24-bit cyclic redundancy check (CRC) is used for the transport block, and wherein in case that the size of the transport block is less than or equal to the predetermined value, a 16-bit cyclic redundancy check (CRC) is used for the transport block.

12. The terminal of claim 10,
wherein the number of code blocks is determined based on a maximum code block size corresponding to the base matrix,
wherein a maximum code block size for the first base matrix is 8448, and wherein a maximum code block size for the second base matrix is 3840.

* * * * *